US012588246B2

(12) United States Patent
Liaw

(10) Patent No.: US 12,588,246 B2
(45) Date of Patent: Mar. 24, 2026

(54) SEMICONDUCTOR STRUCTURE INCLUDING GATE STACK SURROUNDING OR WRAPPING AROUND PLURALITY OF SEMICONDUCTOR LAYERS OR NANOSTRUCTURES AND METHOD FOR FORMING THE SAME

(71) Applicant: Taiwan Semiconductor Manufacturing Company, Ltd., Hsinchu (TW)

(72) Inventor: Jhon-Jhy Liaw, Zhudong Township, Hsinchu County (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 578 days.

(21) Appl. No.: 18/150,021

(22) Filed: Jan. 4, 2023

(65) Prior Publication Data

US 2024/0222460 A1 Jul. 4, 2024

(51) Int. Cl.
| | |
|---|---|
| *H10D 30/67* | (2025.01) |
| *H01L 23/522* | (2006.01) |
| *H10D 62/10* | (2025.01) |
| *H10D 84/01* | (2025.01) |

(52) U.S. Cl.
CPC ..... H10D 30/6735 (2025.01); H01L 23/5226 (2013.01); H10D 30/6757 (2025.01); H10D 62/116 (2025.01); H10D 84/0128 (2025.01); H10D 84/0151 (2025.01)

(58) Field of Classification Search
CPC ............. H10D 30/6735; H10D 62/116; H10D 84/0128; H10D 84/0151; H10D 30/6757; H10D 84/013; H10D 84/0149; H01L 23/5226
See application file for complete search history.

(56) References Cited

U.S. PATENT DOCUMENTS

| | | | |
|---|---|---|---|
| 9,209,247 | B2 | 12/2015 | Colinge et al. |
| 9,236,267 | B2 | 1/2016 | De et al. |
| 9,412,817 | B2 | 8/2016 | Yang et al. |
| 9,412,828 | B2 | 8/2016 | Ching et al. |
| 9,472,618 | B2 | 10/2016 | Oxland |
| 9,502,265 | B1 | 11/2016 | Jiang et al. |
| 9,520,482 | B1 | 12/2016 | Chang et al. |

(Continued)

*Primary Examiner* — Changhyun Yi

(74) *Attorney, Agent, or Firm* — Cooper Legal Group, LLC

(57) ABSTRACT

A method for forming a semiconductor structure is provided. The method includes forming an active region over a substrate. The active region includes a fin element and a plurality of first semiconductor layers and a plurality of second semiconductor layers which are alternately stacked over the fin element. The plurality of first semiconductor layers includes a lowermost first semiconductor layer, and the lowermost first semiconductor layer is thicker than other first semiconductor layers. The method further includes etching the active region to form a first source/drain recess, forming a dielectric isolation feature in the first source/drain recess, forming a first source/drain feature over the dielectric isolation feature in the first source/drain recess, removing the plurality of first semiconductor layers, and forming a gate stack surrounding the second semiconductor layers.

20 Claims, 45 Drawing Sheets

(56)　　　　　　References Cited

U.S. PATENT DOCUMENTS

| | | | |
|---|---|---|---|
| 9,536,738 | B2 | 1/2017 | Huang et al. |
| 9,576,814 | B2 | 2/2017 | Wu et al. |
| 9,608,116 | B2 | 3/2017 | Ching et al. |
| 2021/0280683 | A1 * | 9/2021 | Trivedi .............. H10D 30/6735 |

* cited by examiner

FIG. 3K-4

162A(VDD)
164
162B
162B
162B
162B
162B
162A(VSS)
158
158
152
152
150
128P
128N
132
130
110
103N
103P
NW
PW
126
102
Y2
Y2

FIG. 3K-3

162A(VDD)
164
162B
162B
162B
162B
162B
162A(VSS)
154
158
152
150
128P
128N
132
130
110
103N
103P
NW
PW
152
126
102
Y1
Y1

SEMICONDUCTOR STRUCTURE INCLUDING GATE STACK SURROUNDING OR WRAPPING AROUND PLURALITY OF SEMICONDUCTOR LAYERS OR NANOSTRUCTURES AND METHOD FOR FORMING THE SAME

BACKGROUND

The electronics industry is experiencing an ever-increasing demand for smaller and faster electronic devices which are simultaneously able to support a greater number of increasingly complex and sophisticated functions. Accordingly, there is a continuing trend in the semiconductor industry to manufacture low-cost, high-performance, and low-power integrated circuits (ICs). So far, these goals have been achieved in large part by scaling down semiconductor IC dimensions (e.g., minimum feature size) and thereby improving production efficiency and lowering associated costs. However, such miniaturization has introduced greater complexity into the semiconductor manufacturing process. Thus, the realization of continued advances in semiconductor ICs and devices calls for similar advances in semiconductor manufacturing processes and technology.

Recently, multi-gate devices have been introduced in an effort to improve gate control by increasing gate-channel coupling, reduce OFF-state current, and reduce short-channel effects (SCEs). One such multi-gate device that has been introduced is the gate-all around transistor (GAA). The GAA device gets its name from the gate structure, which can extend around the channel region and provide access to the channel on two or four sides. GAA devices are compatible with conventional complementary metal-oxide-semiconductor (CMOS) processes, and their structure allows them to be aggressively scaled-down while maintaining gate control and mitigating SCEs. In conventional processes, GAA devices provide a channel in a silicon nanowire. However, integration of fabrication of the GAA features around the nanowire can be challenging. For example, while current methods have been satisfactory in many respects, continued improvements are still needed.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

FIGS. 3A-1, 3A-2, 3A-3, 3A-4 and 3A-5 are cross-sectional views of the semiconductor structure at an intermediate stage corresponding to line X1-X1, line X2-X2, line Y1-Y1, line Y2-Y2 and line Y3-Y3 of FIG. 2, in accordance with some embodiments of the disclosure.

FIGS. 3B-1, 3B-2, 3B-3, 3B-4 and 3B-5 are cross-sectional views of the semiconductor structure at an intermediate stage corresponding to line X1-X1, line X2-X2, line Y1-Y1, line Y2-Y2 and line Y3-Y3 of FIG. 2, in accordance with some embodiments of the disclosure.

FIGS. 3C-1, 3C-2, 3C-3 and 3C-4 are cross-sectional views of the semiconductor structure at an intermediate stage corresponding to line X1-X1, line X2-X2, line Y1-Y1 and line Y2-Y2 of FIG. 2, in accordance with some embodiments of the disclosure.

FIGS. 3D-1, 3D-2, 3D-3 and 3D-4 are cross-sectional views of the semiconductor structure at an intermediate stage corresponding to line X1-X1, line X2-X2, line Y1-Y1 and line Y2-Y2 of FIG. 2, in accordance with some embodiments of the disclosure.

FIGS. 3E-1, 3E-2, 3E-3 and 3E-4 are cross-sectional views of the semiconductor structure at an intermediate stage corresponding to line X1-X1, line X2-X2, line Y1-Y1 and line Y2-Y2 of FIG. 2, in accordance with some embodiments of the disclosure.

FIGS. 3F-1, 3F-2, 3F-3 and 3F-4 are cross-sectional views of the semiconductor structure at an intermediate stage corresponding to line X1-X1, line X2-X2, line Y1-Y1 and line Y2-Y2 of FIG. 2, in accordance with some embodiments of the disclosure.

FIGS. 3G-1, 3G-2, 3G-3 and 3G-4 are cross-sectional views of the semiconductor structure at an intermediate stage corresponding to line X1-X1, line X2-X2, line Y1-Y1 and line Y2-Y2 of FIG. 2, in accordance with some embodiments of the disclosure.

FIGS. 3H-1, 3H-2, 3H-3, 3H-4 and 3H-5 are cross-sectional views of the semiconductor structure at an intermediate stage corresponding to line X1-X1, line X2-X2, line Y1-Y1, line Y2-Y2 and line Y3-Y3 of FIG. 2, in accordance with some embodiments of the disclosure.

FIGS. 3I-1, 3I-2, 3I-3, 3I-4 and 3I-5 are cross-sectional views of the semiconductor structure at an intermediate stage corresponding to line X1-X1, line X2-X2, line Y1-Y1, line Y2-Y2 and line Y3-Y3 of FIG. 2, in accordance with some embodiments of the disclosure.

FIGS. 3J-1, 3J-2, 3J-3, 3J-4 and 3J-5 are cross-sectional views of the semiconductor structure at an intermediate stage corresponding to line X1-X1, line X2-X2, line Y1-Y1, line Y2-Y2 and line Y3-Y3 of FIG. 2, in accordance with some embodiments of the disclosure.

FIGS. 3K-1, 3K-2, 3K-3, 3K-4 and 3K-5 are cross-sectional views of the semiconductor structure at an intermediate stage corresponding to line X1-X1, line X2-X2, line Y1-Y1, line Y2-Y2 and line Y3-Y3 of FIG. 2, in accordance with some embodiments of the disclosure.

FIGS. 4-1, 4-2, 4-3 and 4-4 are a modification of the semiconductor structure of FIGS. 3K-1, 3K-2, 3K-3 and 3K-4, in accordance with some embodiments of the disclosure.

FIGS. 5-1, 5-2, 5-3 and 5-4 are a modification of the semiconductor structure of FIGS. 3K-1, 3K-2, 3K-3 and 3K-4, in accordance with some embodiments of the disclosure.

FIGS. 6-1, 6-2, 6-3 and 6-4 are a modification of the semiconductor structure of FIGS. 3K-1, 3K-2, 3K-3 and 3K-4, in accordance with some embodiments of the disclosure.

FIGS. 7A-1, 7A-2, 7A-3 and 7A-4 are cross-sectional views of the semiconductor structure at an intermediate stage corresponding to line X1-X1, line X2-X2, line Y1-Y1 and line Y2-Y2 of FIG. 2, in accordance with some embodiments of the disclosure.

FIGS. 7B-1, 7B-2, 7B-3 and 7B-4 are cross-sectional views of the semiconductor structure at an intermediate stage corresponding to line X1-X1, line X2-X2, line Y1-Y1 and line Y2-Y2 of FIG. 2, in accordance with some embodiments of the disclosure.

FIGS. 8-1, 8-2, 8-3 and 8-4 are a modification of the semiconductor structure of FIGS. 3K-1, 3K-2, 3K-3 and 3K-4, in accordance with some embodiments of the disclosure.

FIGS. 9-1, 9-2, 9-3 and 9-4 are a modification of the semiconductor structure of FIGS. 3K-1, 3K-2, 3K-3 and 3K-4, in accordance with some embodiments of the disclosure.

FIGS. 10-1 and 10-2 are a modification of the semiconductor structure of FIGS. 3K-1 and 3K-2, in accordance with some embodiments of the disclosure.

DETAILED DESCRIPTION

Figure 1:
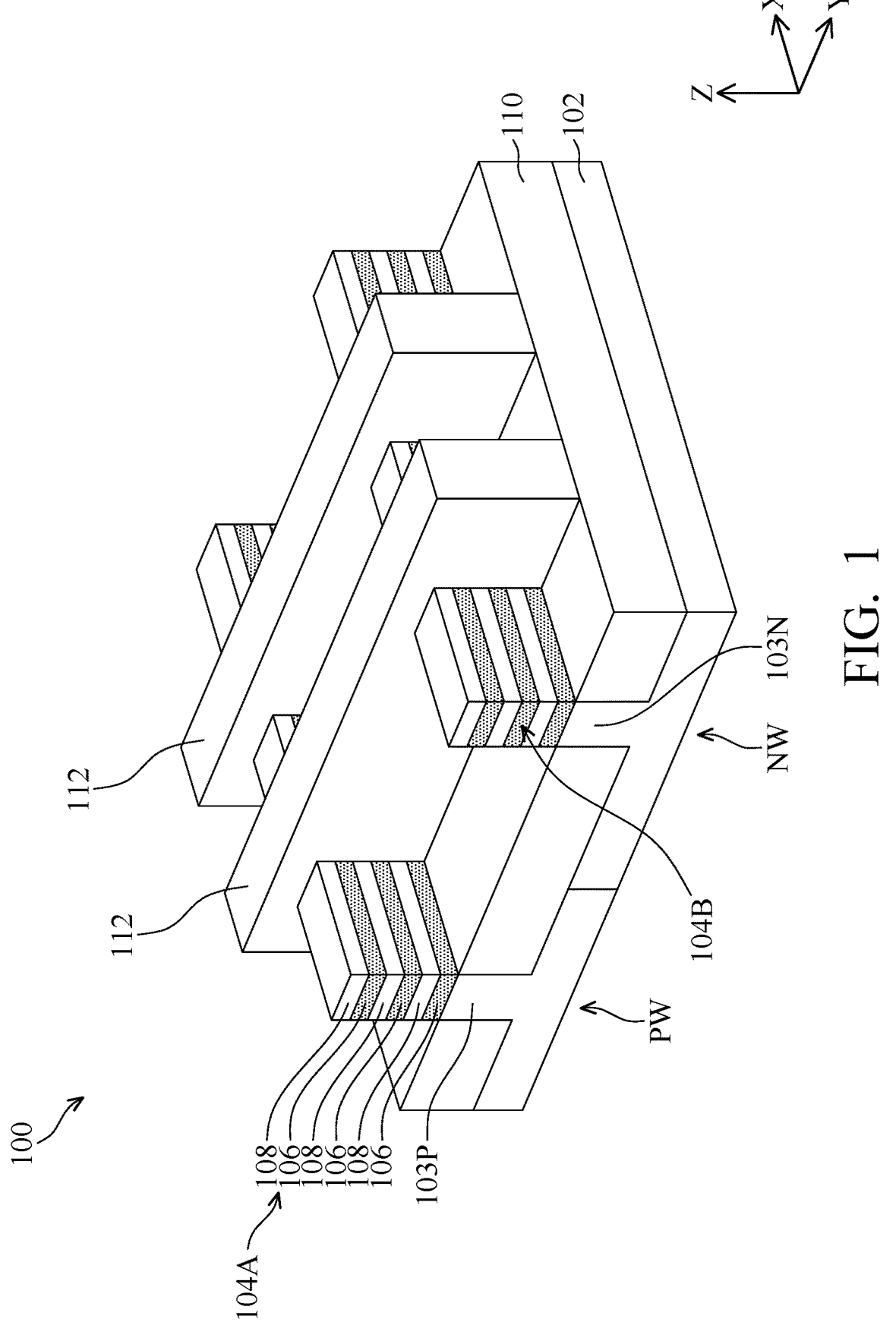
FIG. 1 is a perspective view of a semiconductor structure, in accordance with some embodiments of the disclosure.

The following disclosure provides many different embodiments, or examples, for implementing different features of the subject matter provided. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Some variations of the embodiments are described. Throughout the various views and illustrative embodiments, like reference numerals are used to designate like elements. It should be understood that additional operations can be provided before, during, and after the method, and some of the operations described can be replaced or eliminated for other embodiments of the method.

The gate all around (GAA) transistor structures described below may be patterned by any suitable method. For example, the structures may be patterned using one or more photolithography processes, including double-patterning or multi-patterning processes. Generally, double-patterning or multi-patterning processes combine photolithography and self-aligned processes, allowing patterns to be created that have, for example, smaller pitches than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the GAA structure.

Embodiments of a semiconductor structure are provided. The aspect of the present disclosure is directed to a semiconductor structure including nanostructure transistors. The semiconductor structure includes a dielectric isolation feature vertically sandwiched between the source/drain feature and the lower fin element. The dielectric isolation feature may block the leakage path of the bottom planar transistor formed from the lower fin element, which may enhance the performance of the resulting semiconductor device, e.g., lower off-state current (Isoff), lower source/drain junction leakage, lower gate leakage, etc. In addition, the overall parasitic capacitance in the cell region in which the semiconductor device is formed may be reduced, thereby further enhancing the performance (e.g., speed) of the resulting semiconductor devices.

FIG. 1 is a perspective view of a semiconductor structure 100, in accordance with some embodiments of the disclosure.

The semiconductor structure 100 includes a substrate 102 and fin structures 104 (including 104A and 104B) over the substrate 102, as shown in FIG. 1, in accordance with some embodiments. The substrate 102 includes a p-type well PW and an n-type well NW immediately adjacent to the p-type well PW, in accordance with some embodiments. The fin structure 104A is formed in the p-type well PW of the substrate 102, and the fin structure 104B is formed in the n-type well NW of the substrate 102, in accordance with some embodiments. The fin structures 104A and 104B are the active regions of the semiconductor structure 100, in accordance with some embodiments.

For a better understanding of the semiconductor structure 100, the X-Y-Z coordinate reference is provided in the figures of the present disclosure. The X-axis and the Y-axis are generally orientated along the lateral (or horizontal) directions that are parallel to the main surface of the substrate 102. The Y-axis is transverse (e.g., substantially perpendicular) to the X-axis. The Z-axis is generally oriented along the vertical direction that is perpendicular to the main surface of the substrate 102 (or the X-Y plane).

The fin structure 104A includes a lower fin element 103P formed from the p-type well PW, and the fin structure 104B includes a lower fin element 103N formed from the n-type well NW, in accordance with some embodiments. The lower fin elements 103P and 103N are surrounded by an isolation structure 110, in accordance with some embodiments. Each of the fin structures 104A and 104B further includes an upper fin element formed from an epitaxial stack including alternating first semiconductor layers 106 and second semiconductor layer 108, in accordance with some embodiments. The second semiconductor layers 108 will form nanostructures (e.g., nanowires or nanosheets) and serve as the channel for the resulting semiconductor devices, in accordance with some embodiments.

The fin structures 104A and 104B extend in the X direction, in accordance with some embodiments. That is, the fin structures 104A and 104B have longitudinal axes parallel to the X direction, in accordance with some embodiments. The X direction may also be referred to as the channel-extending direction. The current of the resulting semiconductor devices (i.e., nanostructure transistors) flows in the X direction through the channel. Each of the fin structures 104A and 104B is defined as several channel regions and several source/drain regions, where the channel regions and the source/drain regions are alternately arranged, in accordance with some embodiments. In this disclosure, a source/drain refers to a source and/or a drain. It is noted that in the present disclosure, a source and a drain are interchangeably used and the structures thereof are substantially the same. Gate structures 112 are formed with longitudinal axes parallel to the Y direction and extending across and/or surrounding the channel regions of the fin structures 104A and 104B, in accordance with some embodiments. The source/drain regions of the fin structures 104A and 104B are exposed from the gate structures 112, in accordance with some embodiments. The Y direction may also be referred to as a gate-extending direction.

Although two fin structures 104 are illustrated in FIG. 1, the semiconductor structure 100 may include more than two fin structures 104. In addition, FIG. 1 shows two gate structures 112 (or channel regions) for illustrative purposes and is not intended to be limiting. The number of fin structures and the gate structures may be dependent on design demand of an integrated circuit and/or performance consideration of semiconductor devices.

Figure 2:
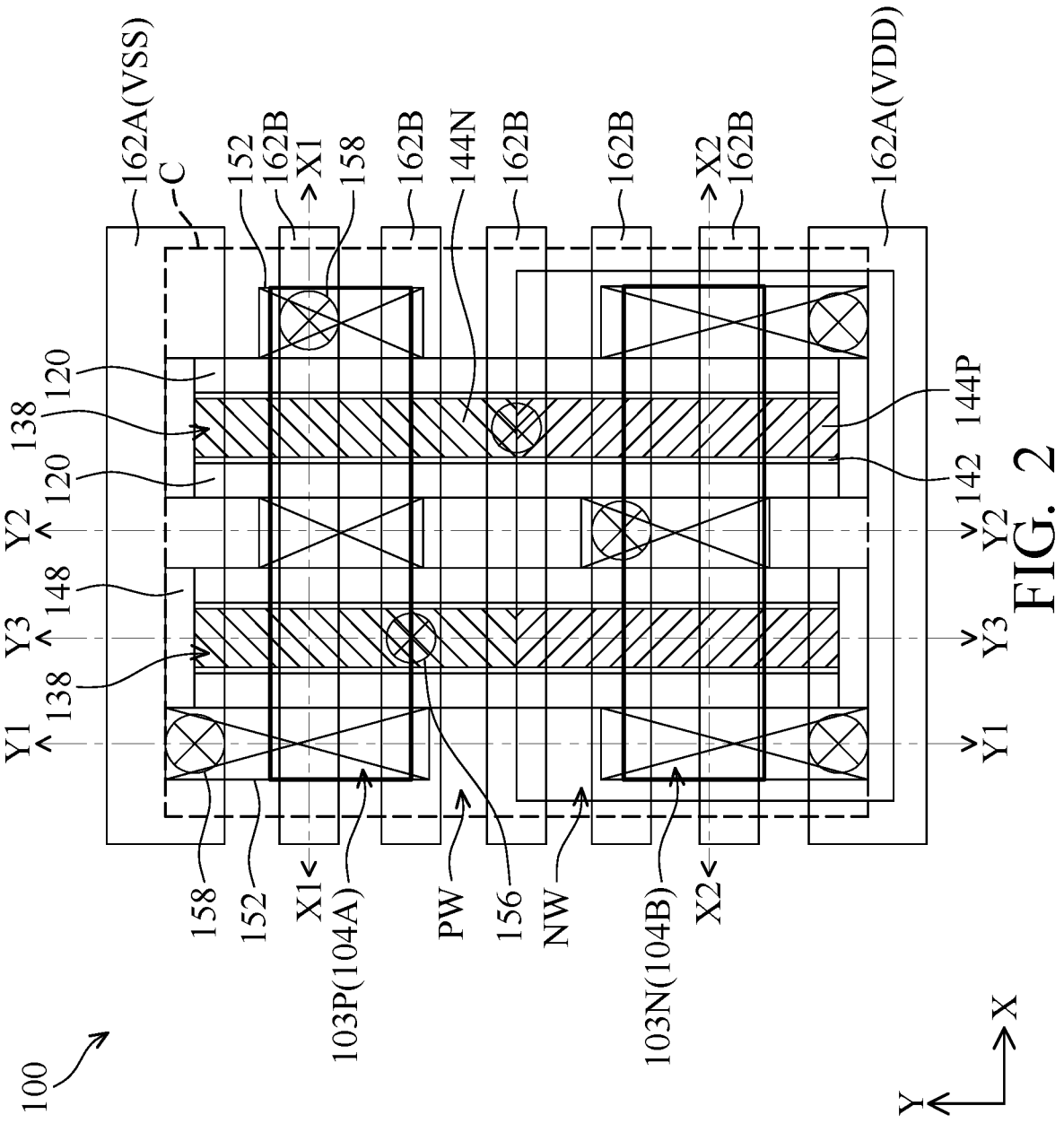
FIG. 2 is a layout of a semiconductor structure, in accordance with some embodiments.

FIG. 2 is a layout (or a plan view) of a semiconductor structure 100, in accordance with some embodiments. FIG. 2 illustrates a semiconductor structure 100 which may be or include nanostructure devices (e.g., GAA FETs), in accordance with some embodiments.

The semiconductor structure 100 includes active regions 104 (including 104A and 104B) over a substrate (as shown in FIG. 1), and final gate stacks 138 across the active regions 104, in accordance with some embodiments. The substrate includes a p-type well PW and an n-type well NW, in accordance with some embodiments. The p-type well PW and the n-type well NW are immediately arranged in the Y direction, in accordance with some embodiments. The active region 104A is located on the p-type well PW, and the active region 104B is located on the n-type well NW, in accordance with some embodiments. Each of the active regions 104 includes a lower fin element (103P or 103N) and stacks of nanostructures (not shown in FIG. 2) formed over the lower element, in accordance with some embodiments.

The final gate stacks 138 extend across the lower fin elements 103N and 103P of the active regions 104 and wrap around the nanostructures of the active regions 104, in accordance with some embodiments. In some embodiments, each of the final gate stacks 138 includes a gate dielectric layer 142 and work function metal materials 144 (including 144N and 144P). The work function metal material 144N is formed over the p-type well PW, and the work function metal material 144P is formed over the n-type well NW, in accordance with some embodiments. Gate spacer layers 120 are formed along the opposite sides of the final gate stacks 138, in accordance with some embodiments.

The final gate stacks 138 are combined with the nanostructures of the active regions 104A and 104B to form nanostructure transistors, in accordance with some embodiments. The nanostructure transistors are formed at the cross points between the active regions 104A and 104B and the final gate stacks 138, in accordance with some embodiments. The nanostructure transistors which are formed over the p-type well PW are n-channel transistors, and the nanostructure transistors which are formed over the n-type well NW are p-channel transistors.

The semiconductor structure 100 may be used to form an integrated circuit which includes several functional circuits interconnected with each other, in accordance with some embodiments. FIG. 2 illustrates a region of the semiconductor structure 100 (or the substrate) which is defined as a cell region C, in accordance with some embodiments. A functional circuit including four nanostructure transistors (formed from the active regions 104 and the final gate stacks 138) is disposed in the cell region C, in accordance with some embodiments. In some embodiments, the cell region C is a NAND cell where a NAND circuit is to be formed. The boundaries (or edges) of the cell region C are dictated as dashed lines. The cell region C may have rectangular shapes in the plan view, and the edges of the cell region C extend in the X direction and the Y direction, in accordance with some embodiments.

Gate cutting structures 148 are formed in and/or through the final gate stacks 138 and the gate spacer layers 120, in accordance with some embodiments. The gate cutting structures 148 are located on the boundaries of the cell region C with respect to the Y direction (extending in the X direction), in accordance with some embodiments. Contact plugs 152 are formed over the source/drain regions of the active regions 104A and 104B, in accordance with some embodiments. The contact plugs 152 are electrically connected to the source or drain terminals of the nanostructure transistors, in accordance with some embodiments. In some embodiments, the contact plugs 152 electrically connected to the source terminals of the functional transistors are longer than the contact plugs 152 electrically connected to the drain terminals of the functional transistors in the Y direction. Vias 156 are formed on and electrically connected to the work function metal materials 144N and 144P of the final gate stacks 138, in accordance with some embodiments. Vias 158 are formed on and electrically connected to the contact plugs 152, in accordance with some embodiments.

A metal layer (e.g., first-level metal layer (M1)) is formed on and electrically connected to the vias 156 and 158, in accordance with some embodiments. The metal layer includes several conductive lines (tracks) e.g., power supply lines 162A and signal lines 162B, in accordance with some embodiments. The power supply lines 162A include a Vdd power rail providing positive voltage and a Vss power rail which may be an electrical ground, in accordance with some embodiments. The signal lines 162A are configured for signal transmission and are electrically isolated from the power supply lines 162A, in accordance with some embodiments.

The lines 162A and 162B extend in the X direction. The power supply lines 162A extend along and overlap the edges of the cell Cl with respect to the Y direction, in accordance with some embodiments. The Vss power rail is electrically connected to the source terminals of the n-channel transistors through the vias 158 and the contact plugs 152, in accordance with some embodiments. The Vdd power rail is electrically connected to the source terminals of the p-channel transistors through the vias 158 and the contact plugs 152, in accordance with some embodiments. The signal lines 162B are located between the power supply lines 162A, in accordance with some embodiments. The signal lines 162B are electrically connected to the gate stacks 138 and the drain terminals of the n-channel transistors and p-channel transistors through the via 156 and 158 and the contact plugs 152, in accordance with some embodiments.

FIG. 2 further illustrates reference cross-sections that are used in later figures. Cross-section X1-X1 is in a plane parallel to the longitudinal axis (X direction) of the active region 104A and through the active region 104A and a signal line 162B, in accordance with some embodiments. Cross-section X2-X2 is in a plane parallel to the longitudinal axis (X direction) of the active region e 104B and through the active region 104B and a signal line 162B, in accordance with some embodiments. Cross-section Y1-Y1 is in a plane parallel to the longitudinal axis (Y direction) of the final gate stack 138 and across first source/drain regions (e.g., source terminals of functional transistors) of the active regions 104, in accordance with some embodiments. Cross-section Y2-Y2 is in a plane parallel to the longitudinal axis (Y direction) of the final gate stack 138 and across second source/drain regions (e.g., drain terminals of functional transistors) of the active regions 104, in accordance with some embodiments. Cross-section Y3-Y3 is in a plane parallel to the longitudinal axis (Y direction) of the final gate stack 138 and through the final gate stack 138 (or a dummy gate structure 112), in accordance with some embodiments.

FIGS. 3A-1 through 3K-5 are cross-sectional views illustrating the formation of a semiconductor structure 100 at various intermediate stages, in accordance with some embodiments of the disclosure. FIGS. 3A-1, 3B-1, 3C-1, 3D-1, 3E-1, 3F-1, 3G-1, 3H-1, 3I-1, 3J-1 and 3K-1 correspond to cross-section X1-X1 shown in FIG. 2. FIGS. 3A-2, 3B-2, 3C-2, 3D-2, 3E-2, 3F-2, 3G-2, 3H-2, 3I-2, 3J-2 and 3K-2 correspond to cross-section X2-X2 shown in FIG. 2. FIGS. 3A-3, 3B-3, 3C-3, 3D-3, 3E-3, 3F-3, 3G-3, 3H-3, 3I-3, 3J-3 and 3K-3 correspond to cross-section Y1-Y1 shown in FIG. 2. FIGS. 3A-4, 3B-4, 3C-4, 3D-4, 3E-4, 3F-4, 3G-4, 3H-4, 3I-4, 3J-4 and 3K-4 correspond to cross-section Y2-Y2 shown in FIG. 2. FIGS. 3A-5, 3B-5, 3H-5, 3I-5, 3J-5 and 3K-5 correspond to cross-section Y3-Y3 shown in FIG. 2.

FIGS. 3A-1 to 3A-5 illustrate a semiconductor structure 100 after the formation of active regions 104 (including 104A and 104B), an isolation structure 110, the dummy gate structures 112 and gate spacer layers 120, in accordance with some embodiments.

A substrate 102 is provided, as shown in FIGS. 3A-1 to 3A-5, in accordance with some embodiments. The substrate 102 may be a portion of a semiconductor wafer, a semiconductor chip (or die), and the like. In some embodiments, the substrate 102 is a silicon substrate. In some embodiments, the substrate 102 includes an elementary semiconductor such as germanium; a compound semiconductor such as gallium nitride (GaN), silicon carbide (SiC), gallium arsenide (GaAs), gallium phosphide (GaP), indium phosphide (InP), indium arsenide (InAs), and/or indium antimonide (InSb); an alloy semiconductor such as SiGe, GaAsP, AlInAs, AlGaAs, GaInAs, GaInP, and/or GaInAsP; or a combination thereof. Furthermore, the substrate 102 may optionally include an epitaxial layer (epi-layer), may be strained for performance enhancement, may include a silicon-on-insulator (SOI) structure, and/or have other suitable enhancement features.

An N-type well NW and a p-type well PW are formed in the substrate 102, as shown in FIGS. 3A-1 to 3A-5, in accordance with some embodiments. In some embodiments, the n-type well NW and the p-type well PW have different electrically conductive types. In some embodiments, the wells NW and PW are formed by ion implantation processes. For example, a patterned mask layer (such as a photoresist layer and/or a hard mask layer) is formed to cover regions of the substrate 102 where the p-type well is predetermined to be formed, and then n-type dopants (such as phosphorus or arsenic) are implanted into the substrate 102, thereby forming the n-type well NW, in accordance with some embodiments. Afterward, the patterned mask layer may be removed. Similarly, a patterned mask layer (such as a photoresist layer and/or a hard mask layer) is formed to cover regions of the substrate 102 where the n-type well is predetermined to be formed, and then p-type dopants (such as boron or $BF_2$) are implanted into the substrate 102, thereby forming the p-type well PW, in accordance with some embodiments. Afterward, the patterned mask layer may be removed.

In some embodiments, the respective concentrations of the dopants in the wells NW and PW are in a range from about $10^{16}/cm^{-3}$ to about $10^{18}/cm^{-3}$. In some embodiments, the ion implantation processes may be performed several times with different dosages and different energy intensities. In some embodiments, the ion implantation process may include anti-punch through (APT) implant.

Active regions 104 (including 104A and 104B) are formed over the substrate 102, as shown in FIGS. 3A-1 to 3A-5, in accordance with some embodiments. In some embodiments, the active regions 104A and 104B extend in the X direction. That is, the active regions 104A and 104B have longitudinal axes parallel to the X direction, in accordance with some embodiments. The formation of the active regions 104A and 104B includes forming an epitaxial stack over the substrate 102 using an epitaxial growth process, in accordance with some embodiments. The epitaxial stack includes alternating first semiconductor layers 106 and second semiconductor layers 108, in accordance with some embodiments. The epitaxial growth process may be molecular beam epitaxy (MBE), metal organic chemical vapor deposition (MOCVD), or vapor phase epitaxy (VPE), or another suitable technique.

In some embodiments, the first semiconductor layers 106 are made of a first semiconductor material and the second semiconductor layers 108 are made of a second semiconductor material. The first semiconductor material for the first semiconductor layers 106 has a different lattice constant than the second semiconductor material for the second semiconductor layers 108, in accordance with some embodiments. In some embodiments, the first semiconductor material and the second semiconductor material have different oxidation rates and/or etching selectivity. In some embodiments, the first semiconductor layers 106 are made of SiGe, where the percentage of germanium (Ge) in the SiGe is in a range from about 20 atomic % to about 50 atomic %, and the second semiconductor layers 108 are made of pure or substantially pure silicon. In some embodiments, the first semiconductor layers 106 are $Si_{1-x}Ge_x$, where x is more than about 0.3, or Ge (x=1.0) and the second semiconductor layers 108 are Si or $Si_{1-y}Ge_y$, where y is less than about 0.4, and x>y.

The first semiconductor layers 106 are configured as sacrificial layers and will be removed to form gaps to accommodate gate materials, and the second semiconductor layers 108 will form nanostructures (e.g., nanowires or nanosheets) that laterally extend between source/drain features and serve as the channel layers for the resulting semiconductor devices (such as nanostructure transistors), in accordance with some embodiments.

The formation of the active regions 104A and 104B further includes patterning the epitaxial stack and underlying wells PW and NW using photolithography and etching processes, thereby forming trenches and the active regions 104 protruding from between trenches, in accordance with some embodiments. The portion of the p-type well PW protruding from between the trenches serves as the lower fin element 103P of the active region 104A, and the portion of the n-type well NW protruding from between the trenches serves as the lower fin element 103N of the active region 104B, in accordance with some embodiments. A remainder of the epitaxial stack (including the first semiconductor layers 106 and the second semiconductor layers 108) serves as the upper fin elements of the active regions 104A and 104B, in accordance with some embodiments. In some embodiments, the active regions 104A and 104B are the fin structures 104A and 104B as shown in FIG. 1.

In alternative embodiments, the active region 104A for forming n-type devices is formed over an n-type well pickup region and has a lower fin element doped with n-type dopants, and the active region 104B for forming p-type devices is formed over a p-type well pickup region and has a lower fin element doped with p-type dopants.

In some embodiments, the lowermost first semiconductor layers 1061 are thicker than other first semiconductor layers 106. In some embodiments, the lowermost first semiconductor layers 1061 have a thickness T1 in a range from about 7 nm to about 30 nm. In some embodiments, the other first semiconductor layers 106 have a thickness T2 in a range from about 6 nm to about 16 nm. In some embodiments, the ratio (T1/T2) of the thickness T1 to the thickness T2 is in a range from about 1.1 to about 4, e.g., in a range from about 1.1 to about 1.5.

In some embodiments, the thickness of each of the second semiconductor layers 108 of the active regions 104 is in a range from about 4 nm to about 8 nm. In some embodiments, the pitch of the second semiconductor layers 108 (or the first semiconductor layers 106) is in a range from about 12 nm to about 24 nm. The thickness of the second semiconductor layers 108 may be greater than, equal to, or less than the first semiconductor layers 106, depending on the amount of gate materials to be filled in spaces where the first semiconductor layers 106 are removed. Although three first semiconductor layers 106 and three second semiconductor layers 108 are shown in FIGS. 3A-1 to 3A-5, the number is not limited to three, and can be two or four, and is less than 10.

An isolation structure 110 is formed to surround the lower fin elements 103P and 103N of the active regions 104A and 104B, as shown in FIGS. 3A-3 to 3A-5, in accordance with some embodiments. The bottom surface of the isolation structure 110 is shown as dashed lines in FIGS. 3A-1 and 3A-2. The isolation structure 110 is configured to electrically isolate active regions 104 of the semiconductor structure 100 and is also referred to as shallow trench isolation (STI) feature, in accordance with some embodiments. The formation of the isolation structure 110 includes forming an insulating material to overfill the trenches, in accordance with some embodiments. In some embodiments, the insulating material is made of silicon oxide (SiO$_2$), silicon nitride (SiN), silicon oxynitride (SiON), silicon carbide (SiC), oxygen-doped silicon carbide (SiC:O), oxygen-doped silicon carbonitride (Si(O)CN), or a combination thereof. In some embodiments, the insulating material is deposited using CVD (such as flowable CVD (FCVD), low-pressure CVD (LPCVD), plasma-enhanced CVD (PECVD), high density plasma CVD (HDP-CVD), or high aspect ratio process (HARP)), atomic layer deposition (ALD), another suitable technique, or a combination thereof.

A planarization process is performed on the insulating material to remove a portion of the insulating material above the active regions 104, in accordance with some embodiments. The planarization may be chemical mechanical polishing (CMP), etching back process, or a combination thereof. The insulating material is then recessed by an etching process (such as dry plasma etching and/or wet chemical etching) until the upper fin elements of the active regions 104 are exposed, in accordance with some embodiments. The recessed insulating material serves as the isolation structure 110, in accordance with some embodiments.

Dummy gate structures 112 are formed across the active regions 104, as shown in FIGS. 3A-1, 3A-2 and 3A-5, in accordance with some embodiments. The dummy gate structures 112 are configured as sacrificial structures and will be replaced with the final gate stacks, in accordance with some embodiments. In some embodiments, the dummy gate structures 112 extend in the Y direction. That is, the dummy gate structures 112 have longitudinal axes parallel to the Y direction, in accordance with some embodiments. The dummy gate structures 112 surround the channel regions of the active regions 104, in accordance with some embodiments. The dummy gate structures 112 may be similar to the gate structures 112 shown in FIG. 1.

Each of the dummy gate structures 112 includes a dummy gate dielectric layer 114 and a dummy gate electrode layer 116 over the dummy gate dielectric layer, in accordance with some embodiments. In some embodiments, the dummy gate dielectric layer 114 is conformally formed along the upper fin elements of the active regions 104. In some embodiments, the dummy gate dielectric layer 114 is made of one or more dielectric materials, such as silicon oxide (SiO), silicon nitride (SiN), silicon oxynitride (SiON), HfO$_2$, HfZrO, HfSiO, HfTIO, HfAIO. In some embodiments, the dielectric material is deposited using ALD, CVD, thermal oxidation, physical vapor deposition (PVD), another suitable technique, or a combination thereof. In some embodiments, the dummy gate electrode layer 116 is made of semiconductor material such as polysilicon or poly-silicon germanium. In some embodiments, the material for the dummy gate electrode layer 116 is deposited using CVD, ALD, another suitable technique, or a combination thereof.

In some embodiments, the formation of the dummy gate structure 112 includes globally and conformally depositing a dielectric material for the dummy gate dielectric layer 114 over the semiconductor structure 100, depositing a material for the dummy gate electrode layer 116 over the dielectric material, planarizing the material for the dummy gate electrode layer 116, and patterning the material for the dummy gate electrode layer 116 and the dielectric material into the dummy gate structures 112. The patterning process includes forming a patterned hard mask layer (not shown) over the material for the dummy gate electrode layer 116, in accordance with some embodiments. The hard mask layer corresponds to and overlaps the channel region of the active regions 104, in accordance with some embodiments. The materials for the dummy gate dielectric layer 114 and the dummy gate electrode layer 116, uncovered by the patterned hard mask layer, are etched away until the source/drain regions of the active regions 104 are exposed, in accordance with some embodiments.

Gate spacer layers 120 are formed over the semiconductor structure 100, as shown in FIGS. 3A-1, 3A-2 and 3A-5, in accordance with some embodiments. The gate spacer layers 120 extend along, and cover, the opposite sides of the dummy gate structures 112, in accordance with some embodiments. In some embodiments, the gate spacer layers 120 extend in the Y direction. That is, the gate spacer layers 120 have a longitudinal axis parallel to the Y direction, in accordance with some embodiments. The gate spacer layers 120 are used to offset the subsequently formed source/drain features and separate the source/drain features from the gate structure, in accordance with some embodiments. The gate spacer layers 120 may be also referred to as top spacer layers.

In some embodiments, the gate spacer layers 120 are made of a dielectric material, such as silicon oxide (SiO$_2$), silicon nitride (SiN), silicon oxynitride (SiON), silicon carbide (SiC), oxygen-doped silicon carbide (SiC:O), oxygen-doped silicon carbonitride (Si(O)CN), or a combination thereof, or a combination thereof. In some embodiments, the gate spacer layers 120 are made of low-k dielectric materials. For example, the dielectric constant (k) values of the gate spacer layers 120 may be lower than a k-value of silicon oxide (SiO), such as lower than 4.2, equal to or lower than about 3.9, such as in a range from about 3.5 to about 3.9.

In some embodiments, the formation of the gate spacer layers 120 includes conformally depositing dielectric materials for the gate spacer layers 120 over the semiconductor structure 100 followed by an anisotropic etching process (such as dry plasma etching). In some embodiments, the deposition process includes ALD, CVD (such as PECVD, LPCVD or HARP), another suitable technique, or a combination thereof. Vertical portions of the dielectric material left on the sidewalls of the dummy gate structures 112 serve as the gate spacer layers 120, in accordance with some embodiments. In some embodiments, the gate spacer layer 120 has a thickness (in the X direction) along the sidewalls of the dummy gate structures 112, which is in a range from about 0.5 nm to about 15 nm.

FIGS. 3B-1 to 3B-5 illustrate of a semiconductor structure 100 after the formation of source/drain recesses 122, in accordance with some embodiments.

An etching process is performed to recess the source/drain regions of the active regions 104A and 104B, thereby forming source/drain recesses 122, as shown in FIGS. 3B-1 to 3B-4, in accordance with some embodiments. The etching process may be an anisotropic etching process such as dry plasma etching, an isotropic etching process such as dry chemical etching, remote plasma etching or wet chemical etching, or a combination thereof. The gate spacer layers 120 and the dummy gate structures 112 may serve as etch masks such that the source/drain recesses 122 are formed self-aligned on opposite sides of the dummy gate structures 112, in accordance with some embodiments. In some embodiments, the etching process is performed without the need for an additional photolithography process. The source/drain recesses 122 extend a distance into the lower fin elements 103N and 103P, in accordance with some embodiments. In some embodiments, the distance is in a range from about 5 nm to about 50 nm. In some embodiments, the source/drain recesses 122 have curved bottom surfaces, in accordance with some embodiments.

FIGS. 3C-1 to 3C-4 illustrate a semiconductor structure 100 after the formation of inner spacer layers 124, in accordance with some embodiments.

Figures 2, 3A:
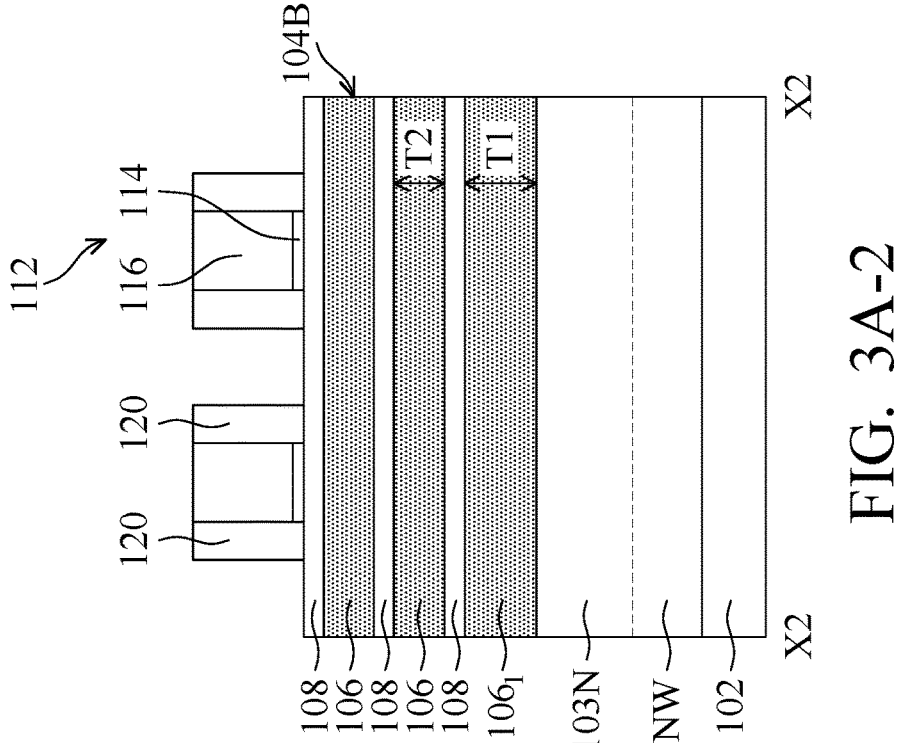
Figures 1, 3A:
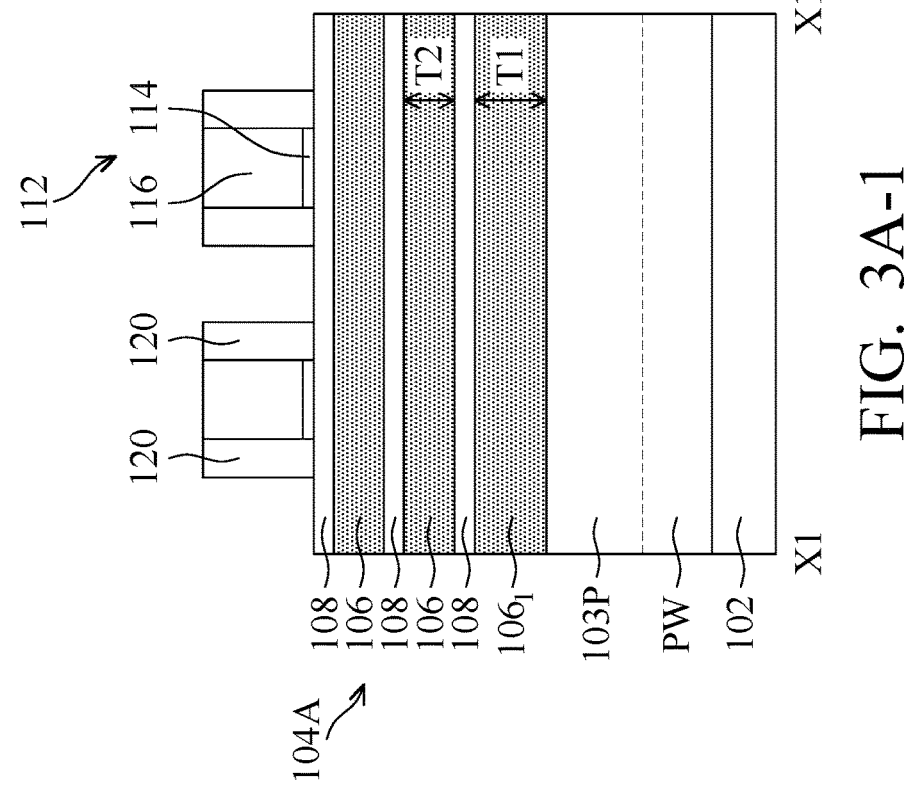
Figures 3, 3A, 4:
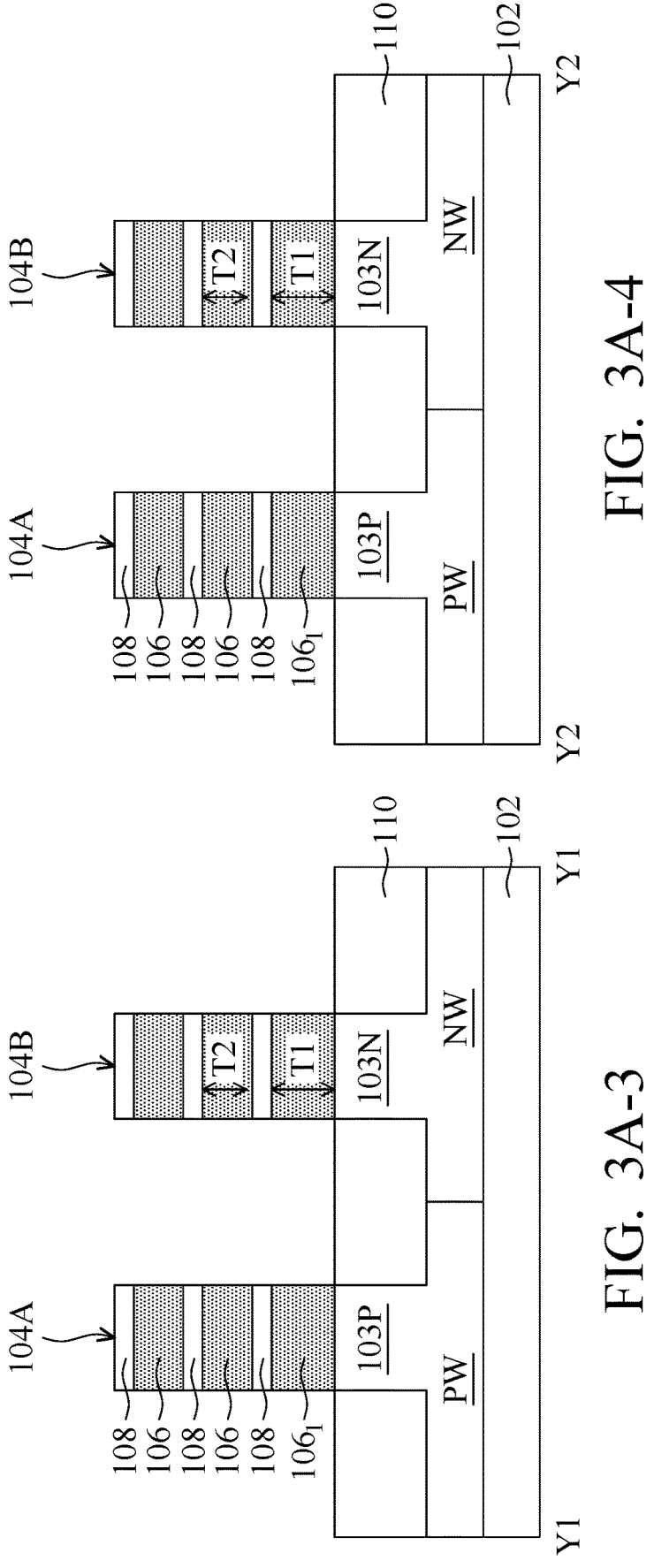
Figures 3, 3A, 4, 5:
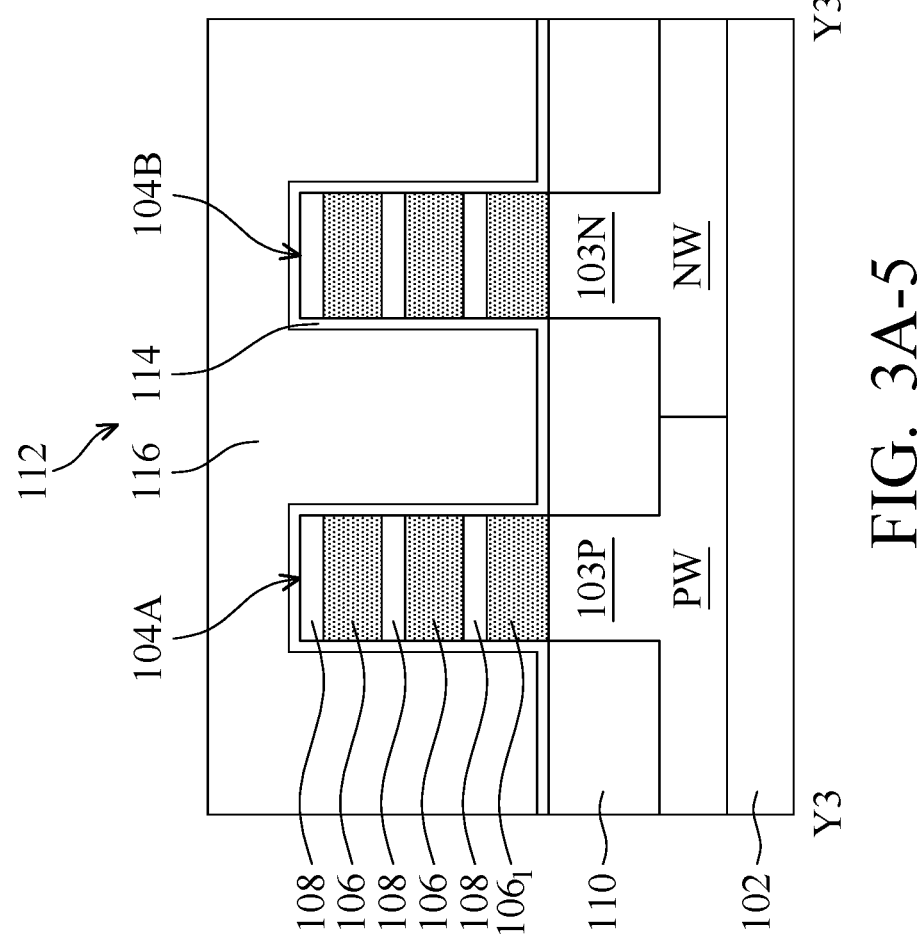
Figures 2, 3B:
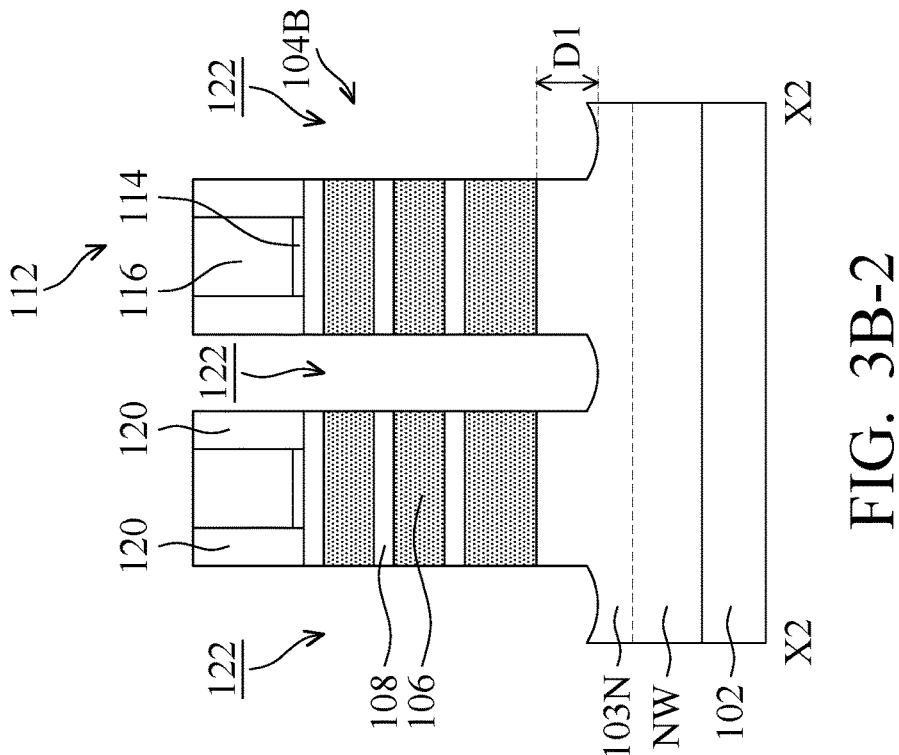
Figures 1, 3B:
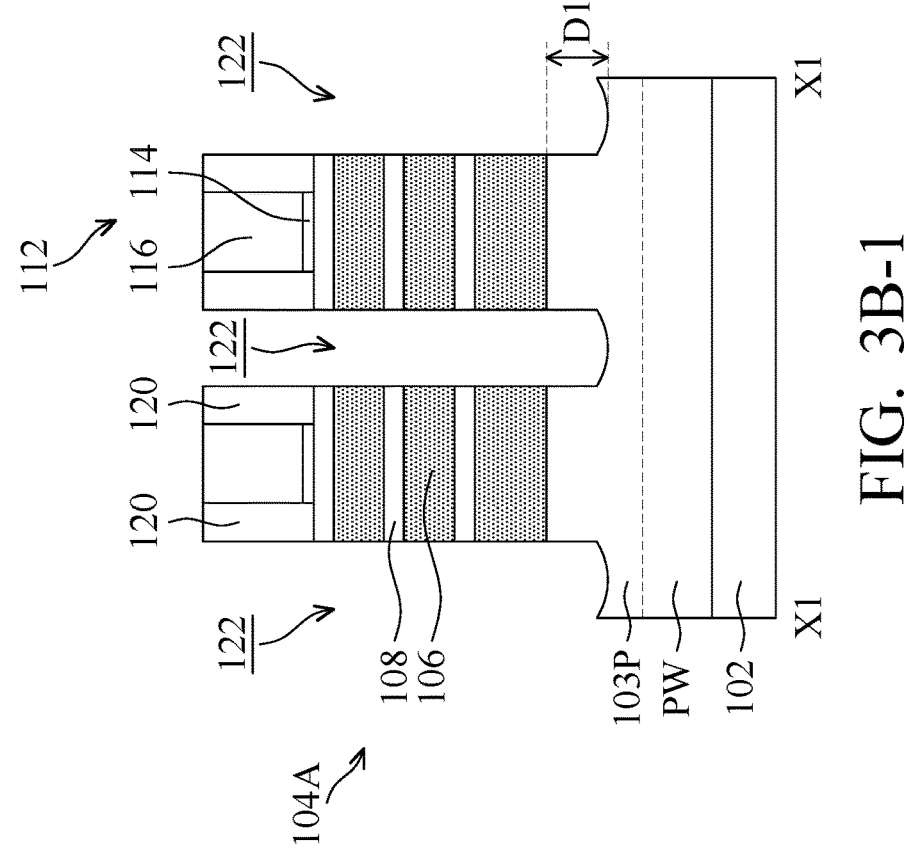
Figures 3, 3B, 4:
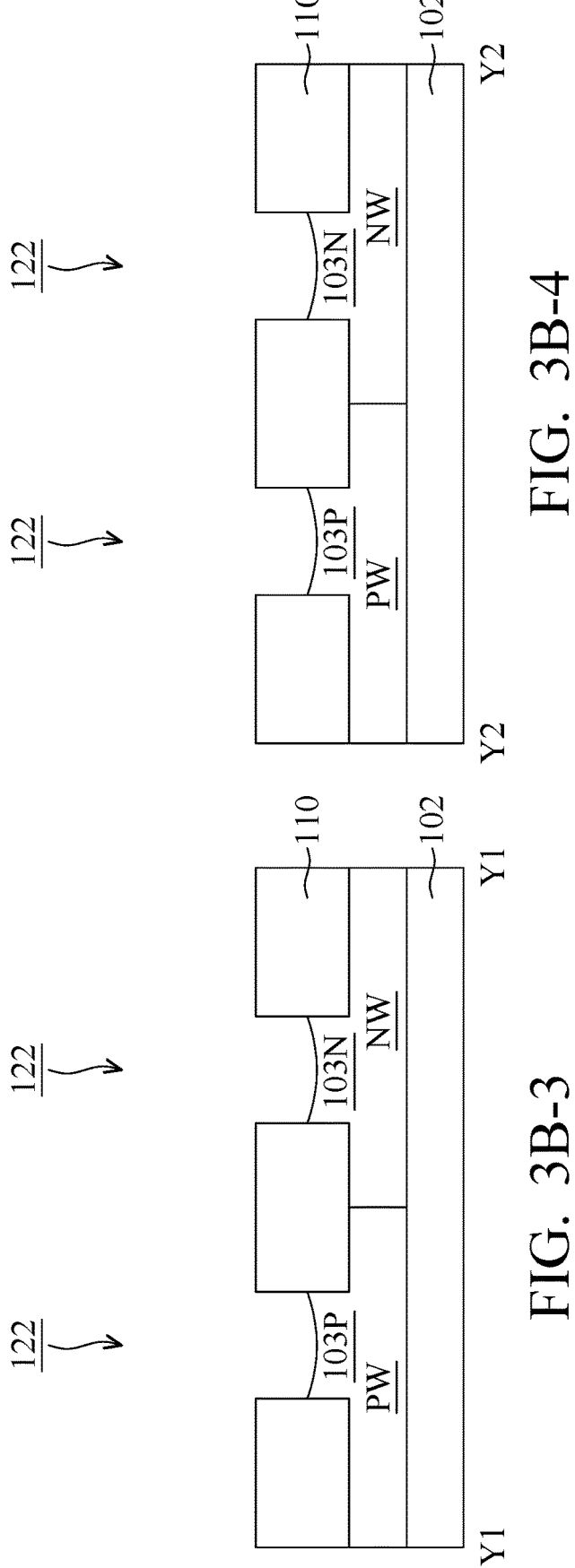
Figures 3, 3B, 4, 5:
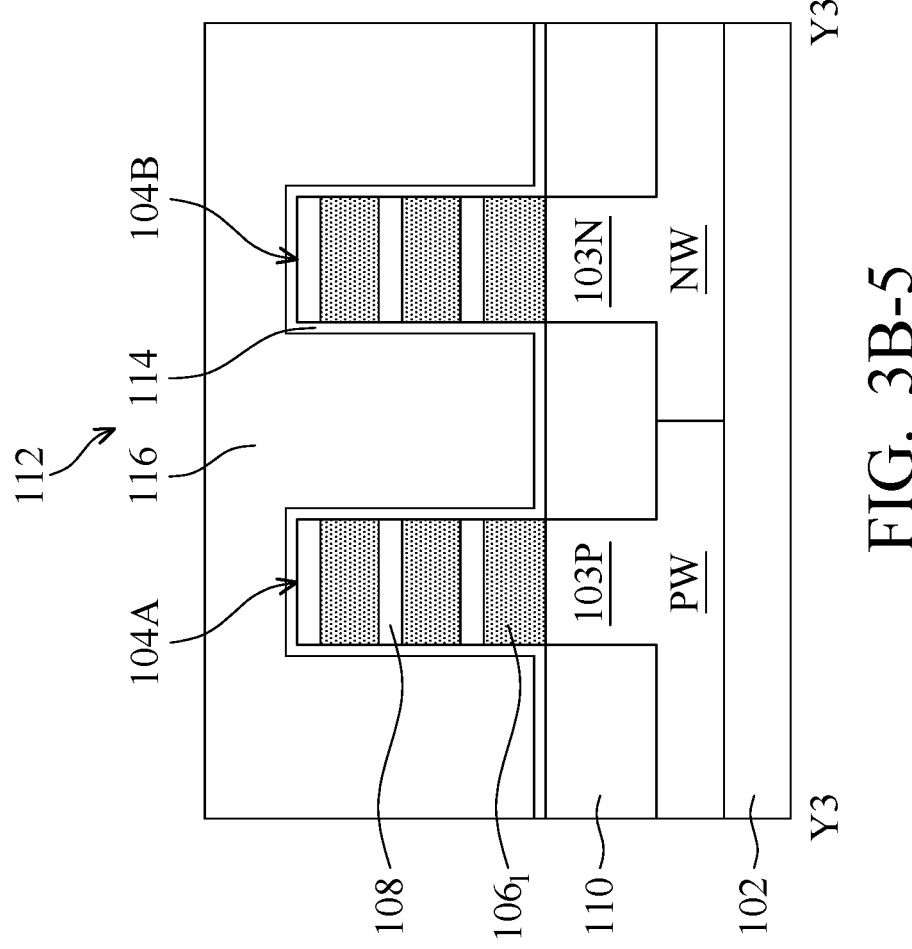
Figures 2, 3C:
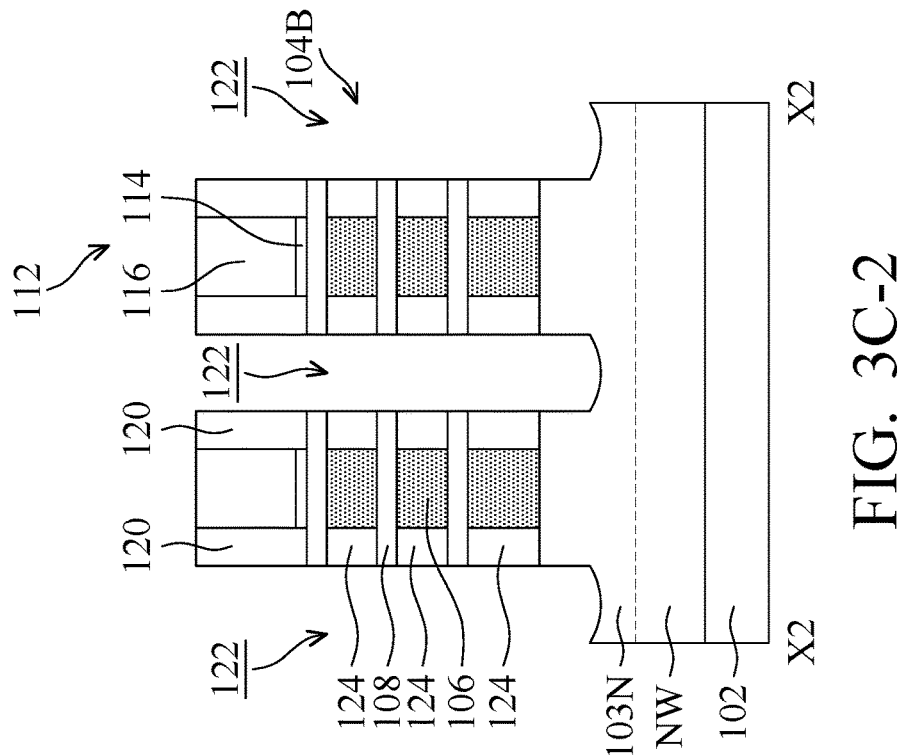
Figures 1, 3C:
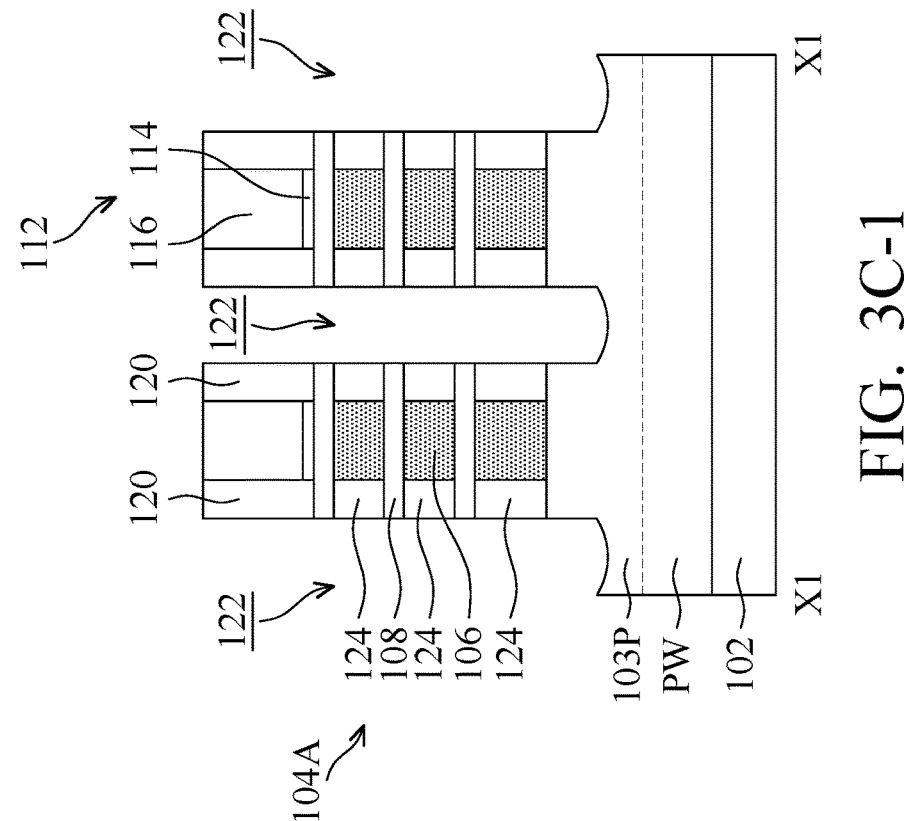
Figures 3, 3C, 4:
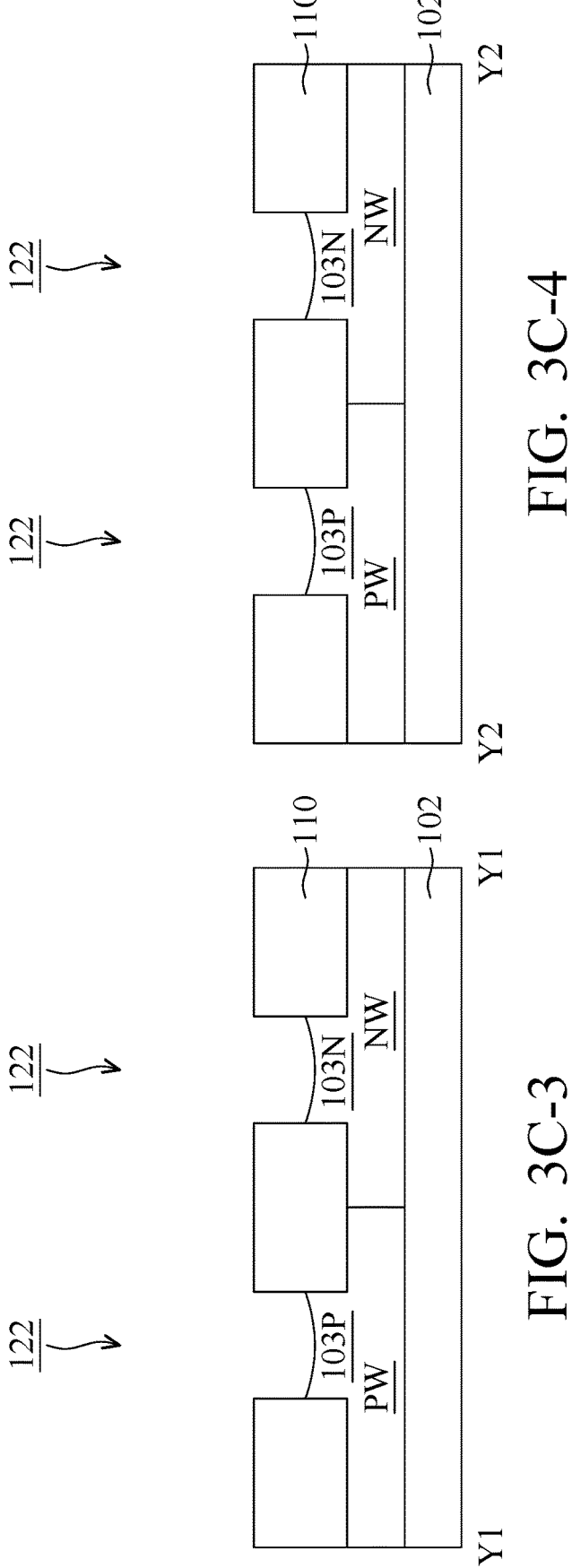
Figures 2, 3D:
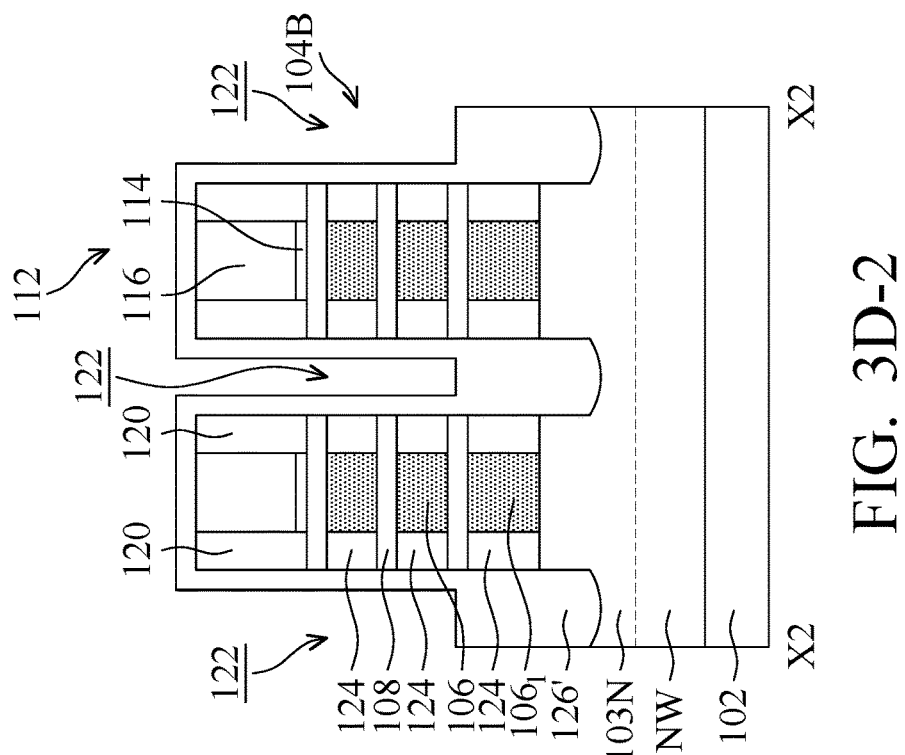
Figures 1, 3D:
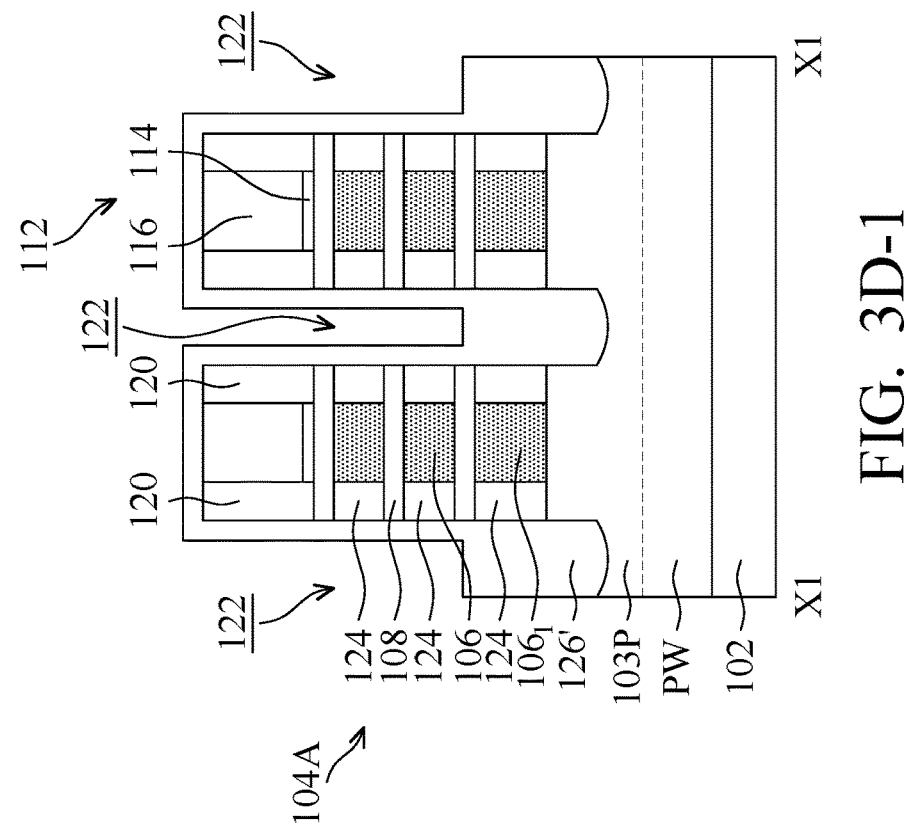
Figures 3, 3D, 4:
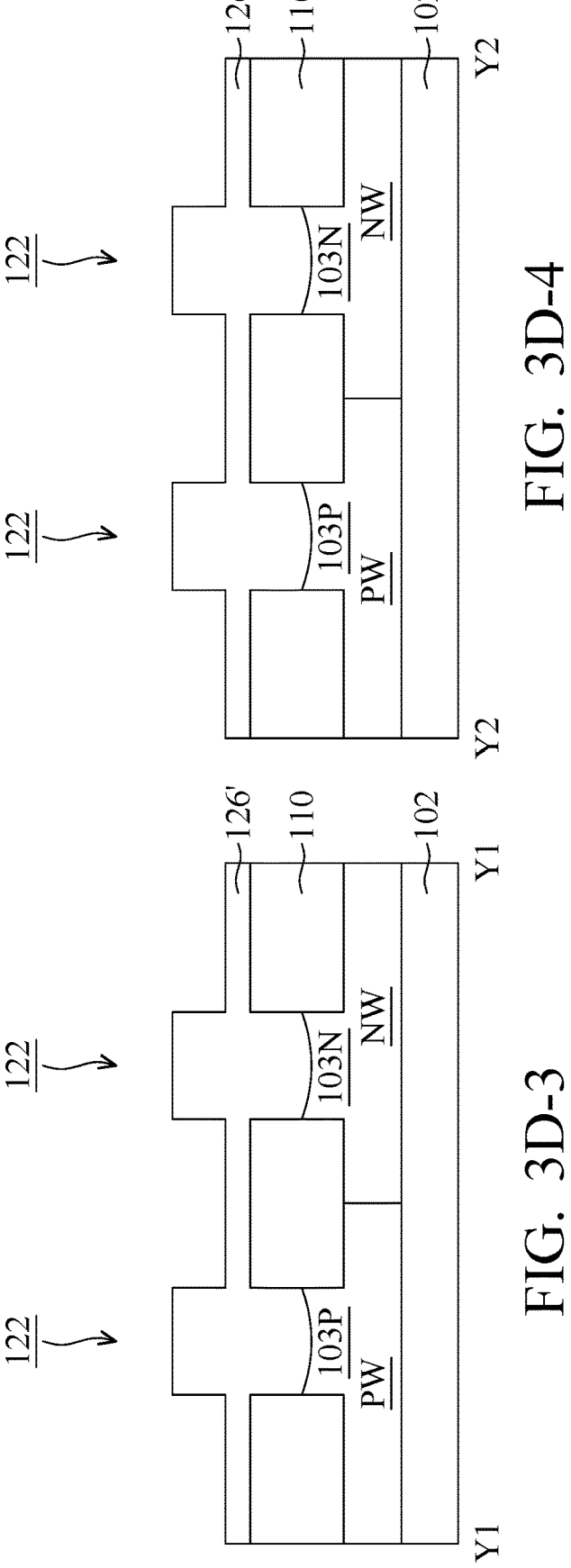
Figures 2, 3E:
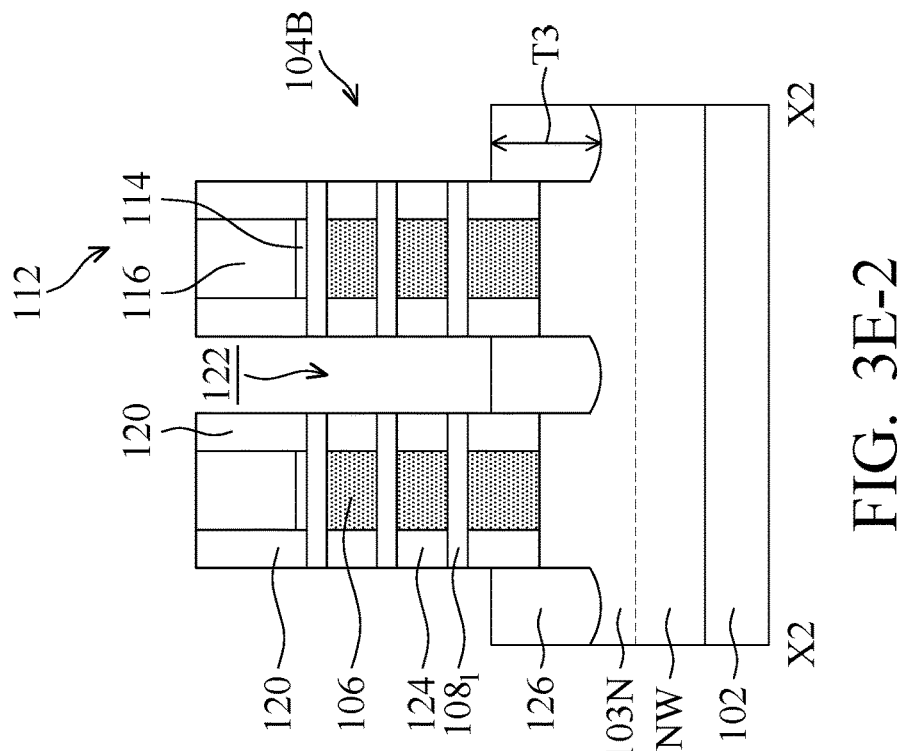
Figures 1, 3E:
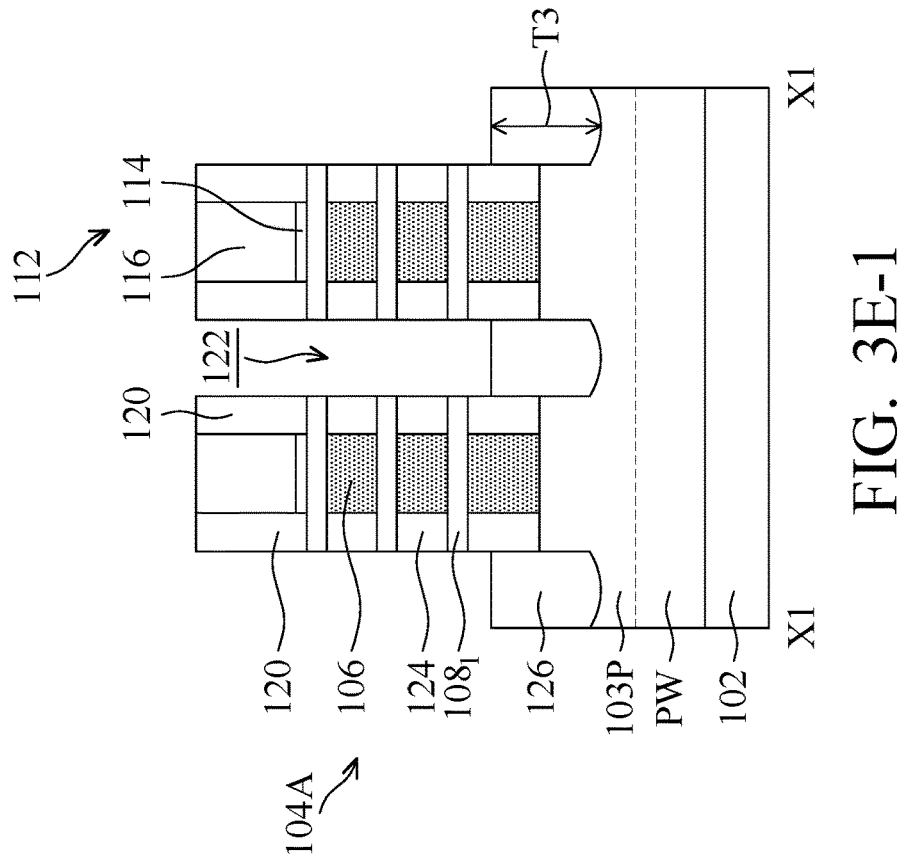
Figures 3, 3E, 4:
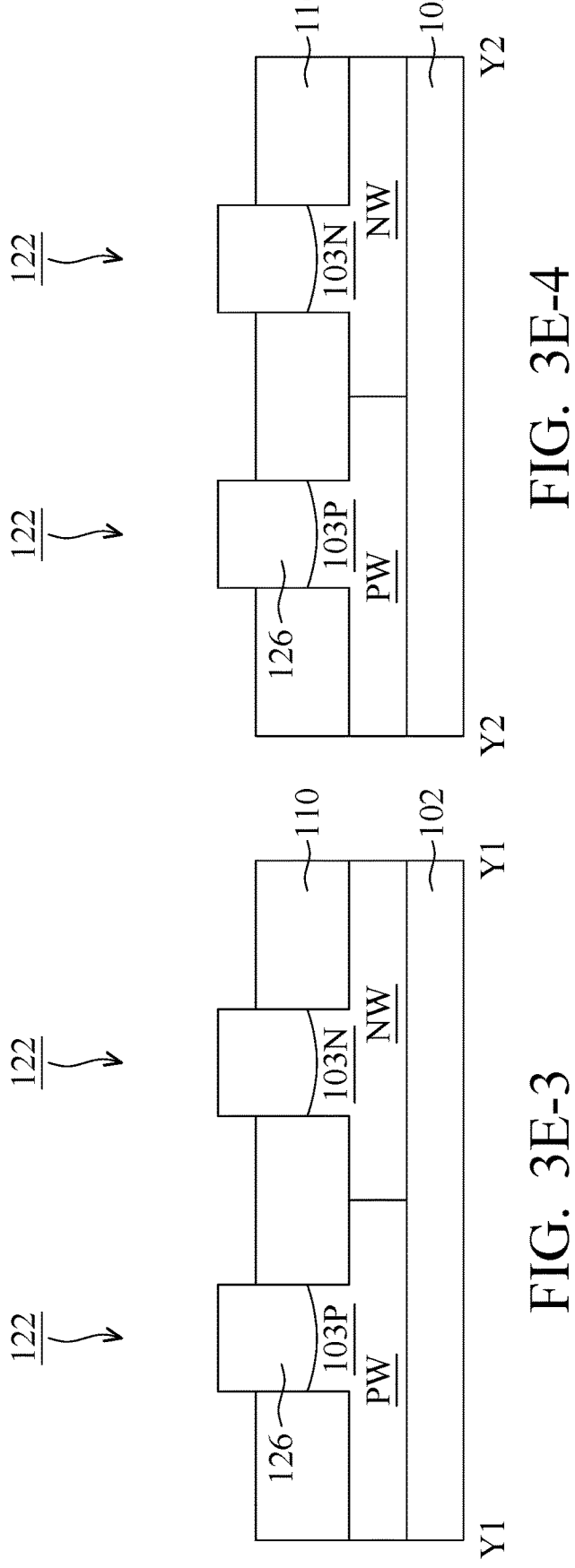
Figures 2, 3F:
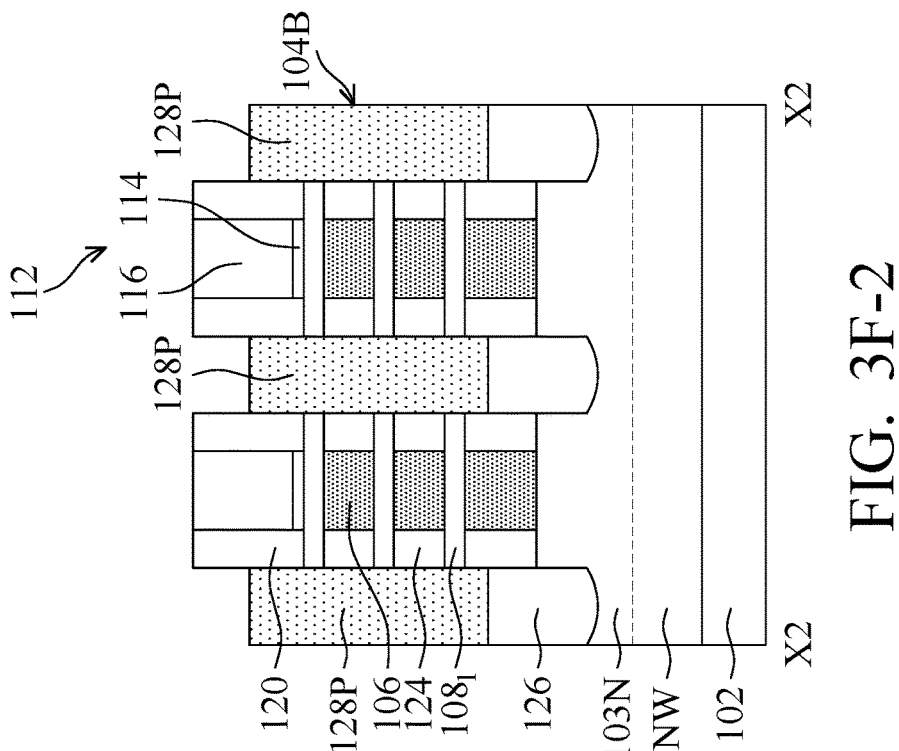
Figures 1, 3F:
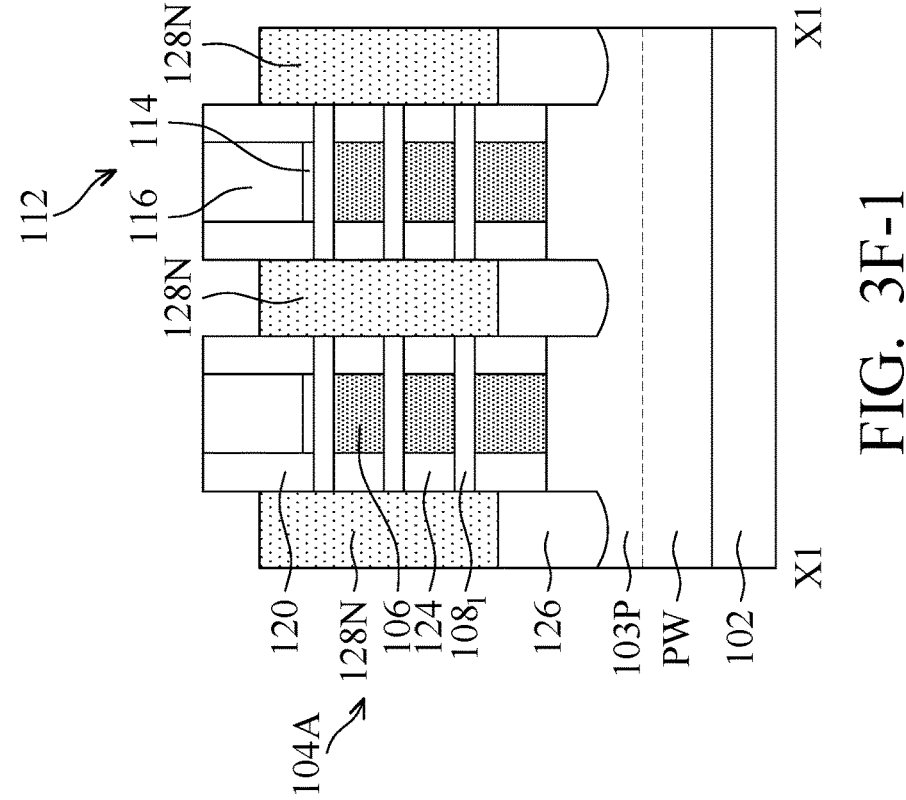
Figures 3, 3F, 4:
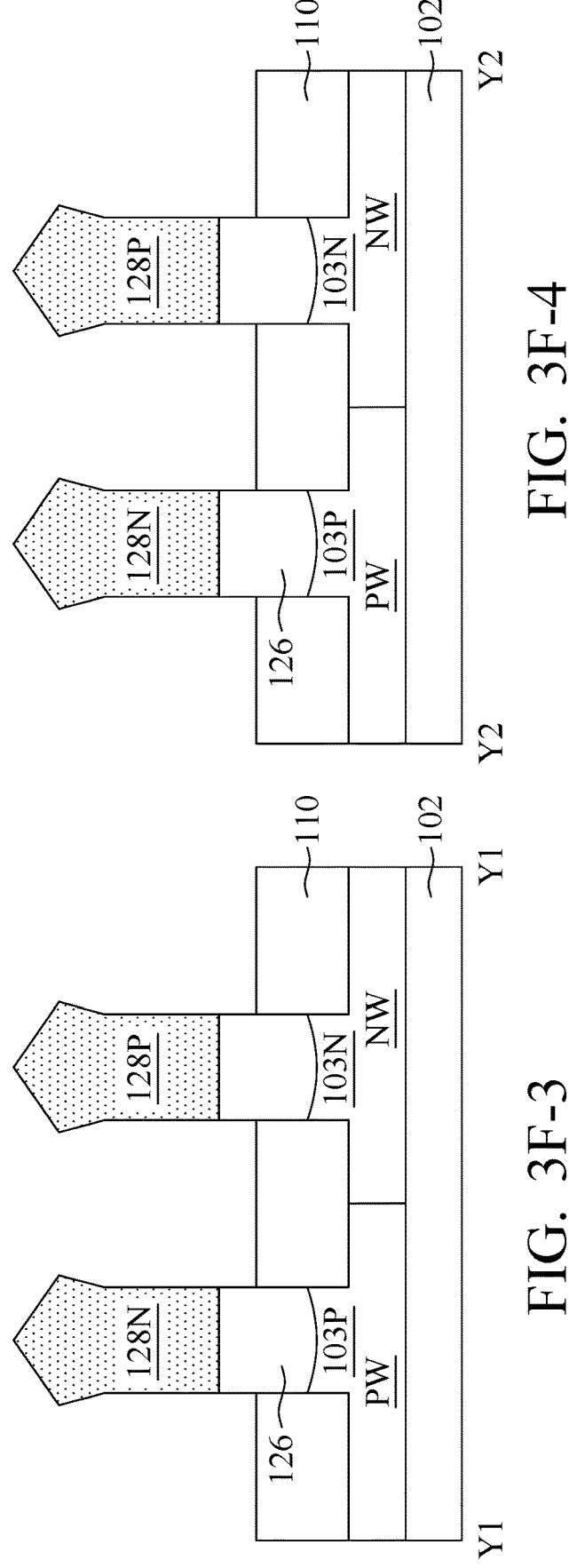
Figures 2, 3G:
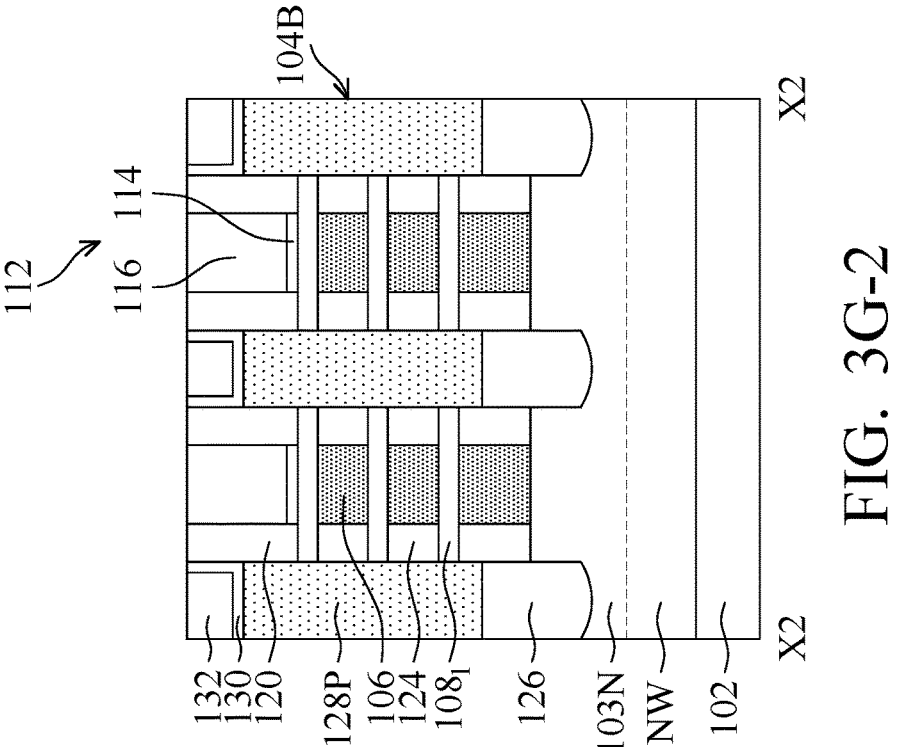
Figures 1, 3G:
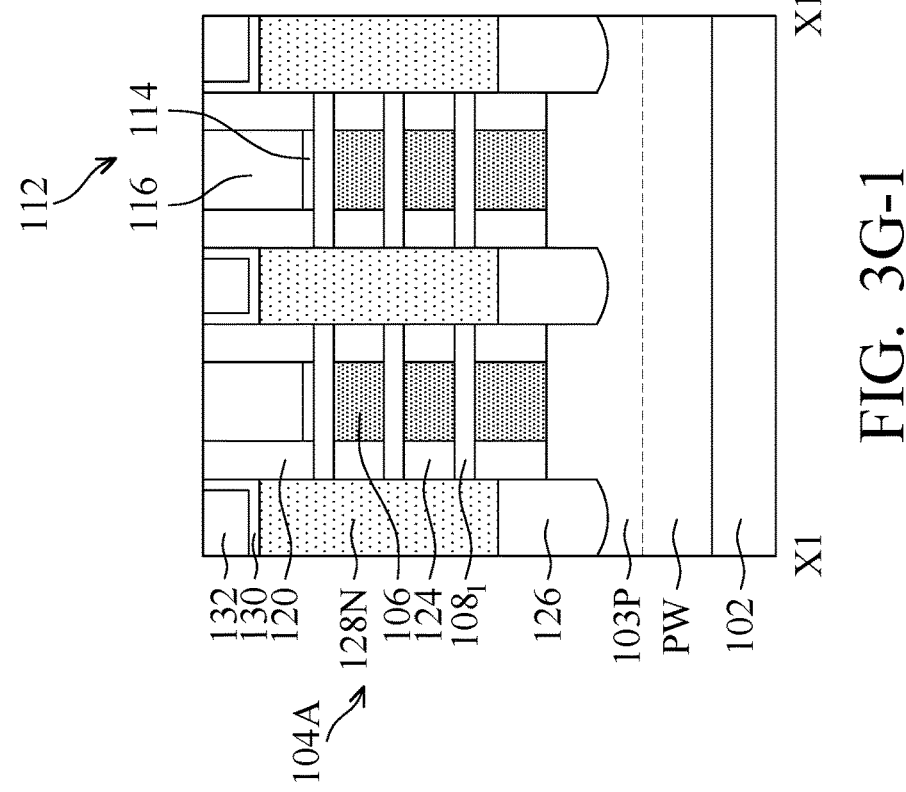
Figures 3, 3G, 4:
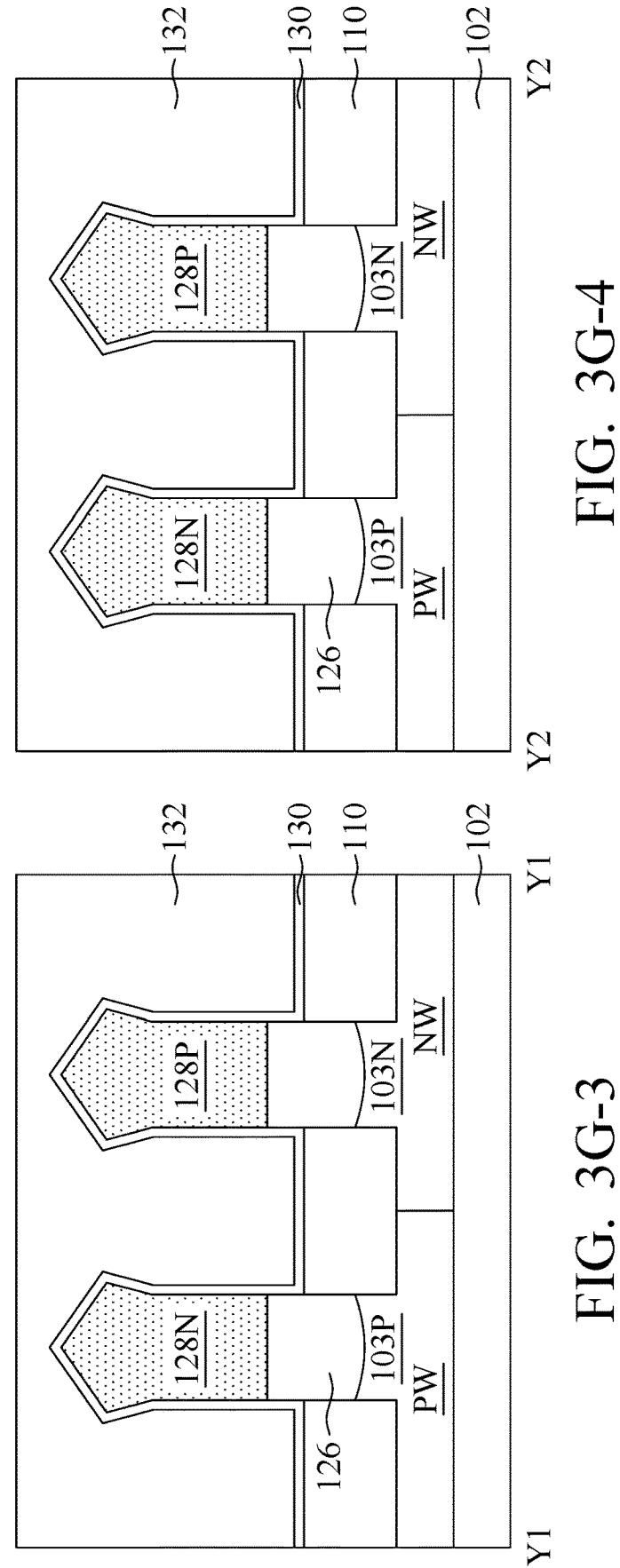

An etching process is performed to laterally recess, from the source/drain recesses 122, the first semiconductor layers 106 of the active regions 104A and 104B, thereby forming notches, and then inner spacer layers 124 are formed in the notches, as shown in FIGS. 3C-1 and 3C-2, in accordance with some embodiments. In some embodiments, the etching process is an isotropic etching such as dry chemical etching, remote plasma etching, wet chemical etching, another suitable technique, or a combination thereof. The inner spacer layers 124 are formed to abut the recessed side surfaces of the first semiconductor layers 106, in accordance with some embodiments. In some embodiments, the inner spacer layers 124 are located between adjacent second semiconductor layers 108 and between the lowermost second semiconductor layer 108 and the lower fin element 103N (or 103P). In some embodiments, the inner spacer layers 124 extend directly below the gate spacer layers 120, in accordance with some embodiments.

The inner spacer layers 124 may avoid the source/drain features and the gate stack from being in direct contact and are configured to reduce the parasitic capacitance between the gate electrode layer and the source/drain features (i.e., Cgd and Cgs), in accordance with some embodiments. In some embodiments, the inner spacer layers 124 are made of dielectric material, such as silicon oxide ($SiO_2$), silicon nitride (SiN), silicon carbide (SiC), silicon oxynitride (SiON), silicon carbon nitride (SiCN), silicon oxycarbonitride (SiOCN), and/or oxygen-doped silicon carbonitride (Si(O)CN). In some embodiments, the inner spacer layers 124 are made of low-k dielectric materials. For example, the dielectric constant (k) value of the inner spacer layers 124 may be lower than a k-value of silicon oxide (SiO), such as lower than 4.2, equal to or lower than about 3.9, such as in a range from about 3.5 to about 3.9. In alternative embodiments, the inner spacer layers 124 may further include an air gap within the dielectric material.

In some embodiments, the dielectric constant value of the inner spacer layers 124 is less than that of the gate spacer layers 112. In some embodiments, the inner spacer layers 124 having a relatively low dielectric constant value may further decrease the capacitance between subsequently formed gate stacks and the source/drain features, and the gate spacer layers 112 having a relatively high dielectric constant value may improve the breakdown voltage between subsequently formed contact plugs and final gate stacks. In some embodiments, the dielectric constant value of the inner spacer layers 124 is greater than that of the gate spacer layers 112. In some embodiments, the inner spacer layers 124 having a relatively high dielectric constant value may increase the etching resistance in a subsequent etching process for removing the first semiconductor layers 106, and the gate spacer layers 112 having a relatively low dielectric constant value may further reduce the capacitance between subsequently formed gate stacks and the contact plugs. The dielectric constant values of the inner spacer layers 124 and the gate spacer layers 112 may be adjusted based on the performance demand of the resulting semiconductor device.

In some embodiments, the inner spacer layers 124 are formed by depositing a dielectric material for the inner spacer layers 124 over the semiconductor structure 100 to overfill the notches, and then etching back the dielectric material to remove the dielectric material outside the notches. In some embodiments, the etching back process includes an anisotropic etching process such as dry plasma etching, an isotropic etching process such as dry chemical etching, remote plasma etching or wet chemical etching, or a combination thereof. In some embodiments, the deposition process includes ALD, CVD (such as PECVD, LPCVD or HARP), another suitable technique, or a combination thereof. Portions of the dielectric material left in the notches serve as the inner spacer layers 124, in accordance with some embodiments. In some embodiments, the inner spacer layers 124 have thickness in the X direction, which is in a range from about 3 nm to about 12 nm. In some embodiments, the gate spacer layer 120 is about 0.5 nm to about 3 nm thicker than the inner spacer layer 124 in the X direction. In some embodiments, the lowermost inner spacer layers 124 are thicker than other inner spacer layers 124 in the Z direction.

FIGS. 3D-1 to 3D-4 illustrate a semiconductor structure 100 after the formation of a dielectric material 126', in accordance with some embodiments.

A dielectric material 126' is deposited over the semiconductor structure 100 to partially fill the source/drain recesses 122, as shown in FIGS. 3D-1 to 3D-4, in accordance with some embodiments. In some embodiments, the dielectric material 126' is formed by a deposition process in a bottom-up gap-fill manner, so that the bottoms of the remainders of the source/drain recesses 122 are located higher than the top surfaces of the lower fin elements 103N and 103P, e.g., higher than the top surfaces of the lowermost first semiconductor layers 1061. In some embodiments, the deposition process includes ALD, CVD (such as HDP-CVD, PECVD, or LPCVD), another suitable technique, or a combination thereof. In some embodiments, the dielectric material 126' is silicon oxide ($SiO_2$), silicon nitride (SiN), silicon carbide (SiC), silicon oxynitride (SiON), silicon carbon nitride (SiCN), silicon oxycarbonitride (SiOCN), and/or oxygen-doped silicon carbonitride (Si(O)CN).

FIGS. 3E-1 to 3E-4 illustrate a semiconductor structure 100 after an etching back process, in accordance with some embodiments.

An etching back process is performed on the dielectric material 126' until the second semiconductor layers 108, the inner spacer layers 124, the gate spacer layers 120 and the isolation structures 110 are exposed, as shown in FIGS. 3D-1 to 3D-4, in accordance with some embodiments. The etching back process may be an anisotropic etching process such as dry plasma etching, an isotropic etching process such as dry chemical etching, remote plasma etching or wet chemical etching, or a combination thereof. Portions of the dielectric material 126' left in the source/drain recesses 122 form dielectric isolation features 126, in accordance with some embodiments.

The dielectric isolation features 126 are formed in the source/drain recesses 122 on the lower fin elements 103N and 103P, in accordance with some embodiments. The dielectric isolation features 126 protrude from the top surfaces of the isolation structure 110 and the lower fin elements 103N and 103P, in accordance with some embodiments. The dielectric isolation features 126 are used to separate the subsequently formed source/drain features from the underlying lower fin element 103N (or 103P), in accordance with some embodiments. The dielectric isolation features 126 are formed in and on the source/drain regions of the lower fin elements 103N (or 104P), and thus may block the leakage path of the bottom planar transistor formed from the lower fin elements. Therefore, the performance of the resulting semiconductor device may be enhanced, e.g., lower off-state current (Isoff), lower source/drain junction leakage, lower gate leakage, etc.

The top surfaces of the dielectric isolation features 126 are located between the bottom surface of the lowermost second semiconductor layers 1081 and the top surface of the lower fin elements 103N and 103P, in accordance with some embodiments. In some embodiments, the dielectric isolation features 126 have a thickness T3 in a range from about 8 nm to about 80 nm. If the dielectric isolation features 126 is too thick, the dielectric isolation features 126 may cover the sidewalls of the lowermost second semiconductor layer 1081, and thus negatively affect the channel current. If the dielectric isolation features 126 are too thin, the leakage path of the bottom planar transistor may be insufficiently blocked.

The thickness T1 (FIG. 3A-1) of the lowermost first semiconductor layers 1061 is greater than the thickness T2 (FIG. 3A-1) of other first semiconductor layers 106, which may facilitate precise control of the deposition and etching back processes for forming the dielectric isolation features 126, such that the dielectric isolation features 126 may have desired thickness T3 (or the desired position of the top surfaces). If the ratio (T1/T2) is too low, it may be difficult to precisely control the thickness of the dielectric isolation feature 126. If the ratio (T1/T2) is too high, the aspect ratio of the trench between the active regions 104 may be too high, which may increase the difficulty of manufacturing the semiconductor structure 100.

FIGS. 3F-1 to 3F-4 illustrate a semiconductor structure 100 after the formation of source/drain features 128 (including 128N and 128P), in accordance with some embodiments.

Source/drain features 128N and 128P are formed over the dielectric isolation features 126 in the source/drain recesses 122 using one or more epitaxial growth processes, as shown in FIGS. 3F-1 to 3F-4, in accordance with some embodiments. The epitaxial growth process may be MBE, MOCVD, or VPE, another suitable technique, or a combination thereof. The source/drain features 128 are formed on opposite sides of the dummy gate structures 112, in accordance with some embodiments. In some embodiments, the epitaxial semiconductor material selectively grows on the semiconductor surfaces provided from the exposed second semiconductor layers 108. In some embodiments, the source/drain features 128N and 128P are in direct contact with the dielectric isolation features 126. In alternative embodiments, the source/drain features 128N and 128P are spaced apart from the dielectric isolation features 126 by air gaps.

The source/drain features 128N are formed over the p-type well PW, and the source/drain features 128P are formed over the n-type well NW, in accordance with some embodiments. In some embodiments, the source/drain features 128N have a different electrically conductive type than the source/drain features 128P. In some embodiments, the source/drain features 128N and the source/drain features 128P may be formed separately. For example, a patterned mask layer (such as photoresist layer and/or hard mask layer) may be formed to cover the semiconductor structure 100 over the n-type well NW, and then the source/drain features 128N are grown. Afterward, the patterned mask layer may be removed. Similarly, a patterned mask layer (such as photoresist layer and/or hard mask layer) is formed to cover the semiconductor structure 100 over the p-type well PW, and then the source/drain features 128P are grown. Afterward, the patterned mask layer may be removed.

In some embodiments, the source/drain features 128N and 128P are in-situ doped during the epitaxial processes. In some embodiments, the source/drain features 128N are doped with the n-type dopant during the epitaxial growth process. For example, the n-type dopant may be phosphorous (P) or arsenic (As). For example, the n-type source/drain features 128N may be the epitaxially grown silicon phosphorous (SiP), silicon carbon (SiC), silicon phosphorous carbon (SiPC), silicon phosphorous arsenic (SiPAs), silicon arsenic (SiAs), silicon (Si) or a combination thereof doped with phosphorous and/or arsenic. In some embodiments, the concentrations of the dopant (e.g., P) in the source/drain features 128N are in a range from about $2 \times 10^{19}$ cm$^{-3}$ to about $3 \times 10^{21}$ cm$^{-3}$.

In some embodiments, the source/drain features 128P are doped with the p-type dopant during the epitaxial growth process. For example, the p-type dopant may be boron (B) or BF$_2$. For example, the p-type source/drain features 128P may be the epitaxially grown silicon germanium (SiGe), silicon germanium carbon (SiGeC), germanium (Ge), silicon (Si) or a combination thereof doped with boron (B). In some embodiments, the concentrations of the dopant (e.g., B) in the source/drain features 128P are in a range from about $1 \times 10^{19}$ cm$^{-3}$ to about $6 \times 10^{20}$ cm$^{-3}$.

In some embodiments, the lattice constant of the source/drain features 128 is different from the lattice constant of the second semiconductor layers 108, so that the channel regions of the resulting semiconductor devices can be strained or stressed by the source/drain features 128 to improve carrier mobility of the resulting semiconductor device and enhance the device performance (e.g., on-state current). In some embodiments, the n-type source/drain features 128P and the p-type source/drain features 128P are made of different epitaxial materials. For example, the n-type source/drain features 128N are made of SiP, and the p-type source/drain features 128P are made of SiGe.

FIGS. 3G-1 to 3G-4 illustrate a semiconductor structure 100 after the formation of contact etching stop layer (CESL) 130 and a first interlayer dielectric layer 132, in accordance with some embodiments.

A contact etching stop layer 130 is formed over the semiconductor structure 100 to cover the source/drain features 128N and 128P, as shown in FIGS. 3G-1 to 3G-4, in accordance with some embodiments. The contact etching stop layer 130 is further formed along, and covers, the sidewalls of the gate spacer layer 120, the sidewalls of the dielectric isolation features 126, and the upper surface of the isolation structure 110, in accordance with some embodiments. In some embodiments, the contact etching stop layer 130 is made of dielectric material, such as silicon nitride (SiN), silicon oxide (SiO$_2$), silicon oxynitride (SiOC), silicon carbide (SiC), oxygen-doped silicon carbide (SiC:O), oxygen-doped silicon carbonitride (Si(O)CN), or a combination thereof. In some embodiments, a dielectric material for the contact etching stop layer 130 is globally and conformally deposited over the semiconductor structure 100 using CVD (such as LPCVD, PECVD, HDP-CVD, or HARP), ALD, another suitable method, or a combination thereof.

Afterward, a first interlayer dielectric layer 132 is formed over the contact etching stop layer 130, as shown in FIGS. 3G-1 to 3G-4, in accordance with some embodiments. The first interlayer dielectric layer 132 overfills the space between dummy gate structures 112, in accordance with some embodiments. In some embodiments, the first interlayer dielectric layer 132 is made of dielectric material, such as un-doped silicate glass (USG), doped silicon oxide such as borophosphosilicate glass (BPSG), fluoride-doped silicate glass (FSG), phosphosilicate glass (PSG), borosilicate glass (BSG), and/or another suitable dielectric material. In some embodiments, the first interlayer dielectric layer 132 and the contact etching stop layer 130 are made of different materials and have a great difference in etching selectivity. In some embodiments, the dielectric material for the first interlayer dielectric layer 132 is deposited using such as CVD (such as HDP-CVD, PECVD, HARP or FCVD), another suitable technique, or a combination thereof. The dielectric materials for the contact etching stop layer 130 and the first interlayer dielectric layer 132 above the upper surface of the dummy gate electrode layer 116 are removed using such as CMP, in accordance with some embodiments.

FIGS. 3H-1 to 3H-5 illustrate a semiconductor structure 100 after the formation of gate trenches 134 and gaps 136, in accordance with some embodiments.

The dummy gate structures 112 are removed using etching process to form gate trenches 134 between the gate spacer layers 120, as shown in FIGS. 3H-1, 3H-2 and 3H-5, in accordance with some embodiments. In some embodiments, the gate trenches 134 expose the channel regions of the active regions 104A and 104B. In some embodiments, the gate trenches 134 further expose the sidewalls of the gate spacer layers 120 facing the channel region. In some embodiments, the etching process includes one or more etching processes. For example, when the dummy gate electrode layer 116 is made of polysilicon, a wet etchant such as a tetramethylammonium hydroxide (TMAH) solution may be used to selectively remove the dummy gate electrode layer 116. For example, the dummy gate dielectric layer 114 may be thereafter removed using a plasma dry etching, a dry chemical etching, and/or a wet etching.

Afterward, an etching process is performed to remove the first semiconductor layers 106 of the active regions 104A and 104B to form gaps 136, as shown in FIGS. 3H-1, 3H-2 and 3H-5, in accordance with some embodiments. The inner spacer layers 124 may be used as an etching stop layer in the etching process, which may protect the source/drain features 128N and 128P from being damaged. In some embodiments, the etching process includes a selective wet etching process, such as APM (e.g., ammonia hydroxide-hydrogen peroxide-water mixture) etching process. In some embodiments, the wet etching process uses etchants such as ammonium hydroxide (NH$_4$OH), TMAH, ethylenediamine pyrocatechol (EDP), and/or potassium hydroxide (KOH) solutions. The gaps 136 are formed between adjacent second semiconductor layers 108 and between the lowermost second semiconductor layer 1081 and the lower fin element 103P (or 103N), in accordance with some embodiments. In some embodiments, the gaps 136 also expose the sidewalls of the inner spacer layers 124 facing the channel region.

In some embodiments, the lowermost gaps 136 are greater than other gaps 136 in the Z direction. In some embodiments, the ratio (D1/D2) of the dimension D1 of the lowermost gap 1361 to the dimension D2 of other gaps 136 is in a range from about 1.1 to about 4, e.g., in a range from about 1.1 to about 1.5.

Figures 1, 2, 3H:
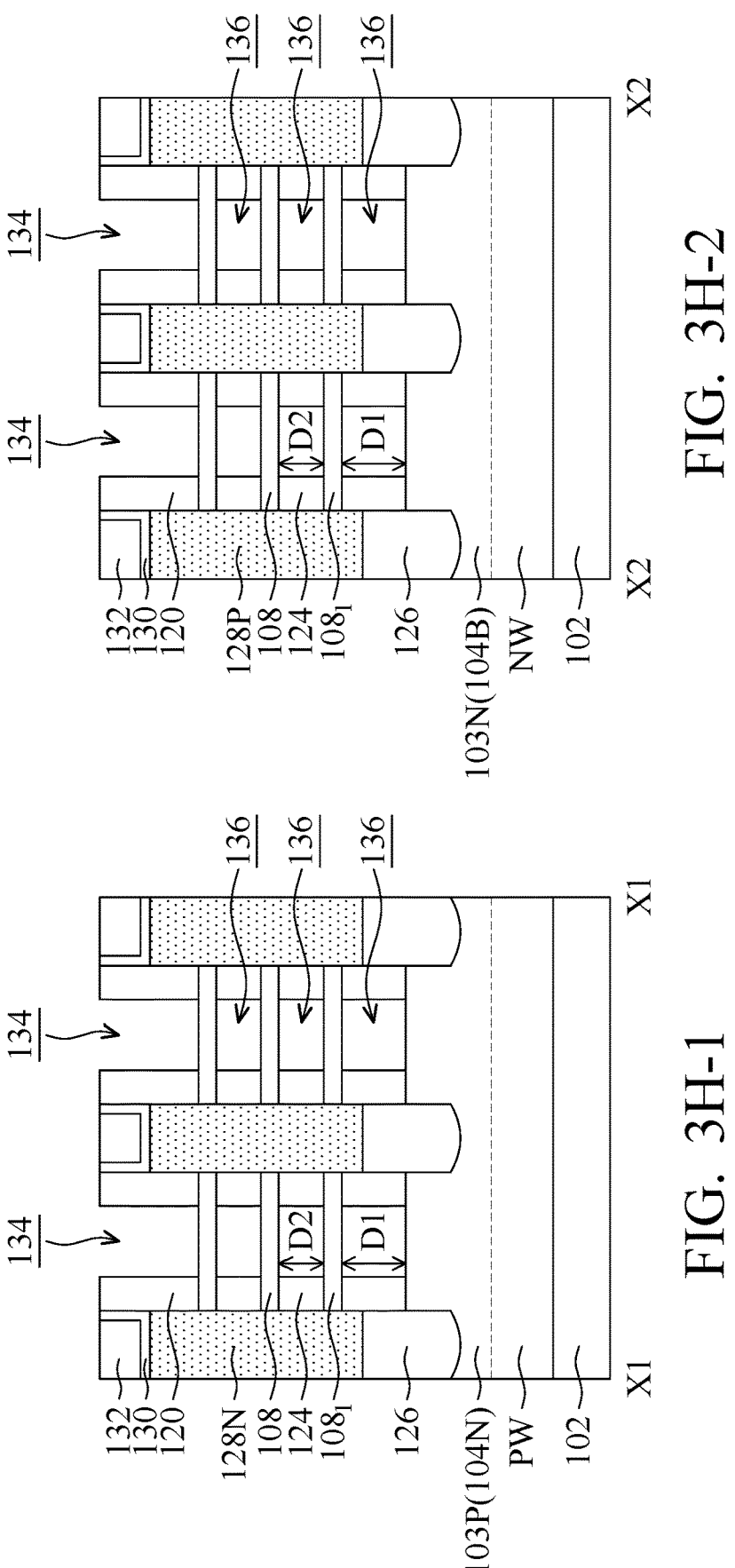
Figures 3, 3H, 4:
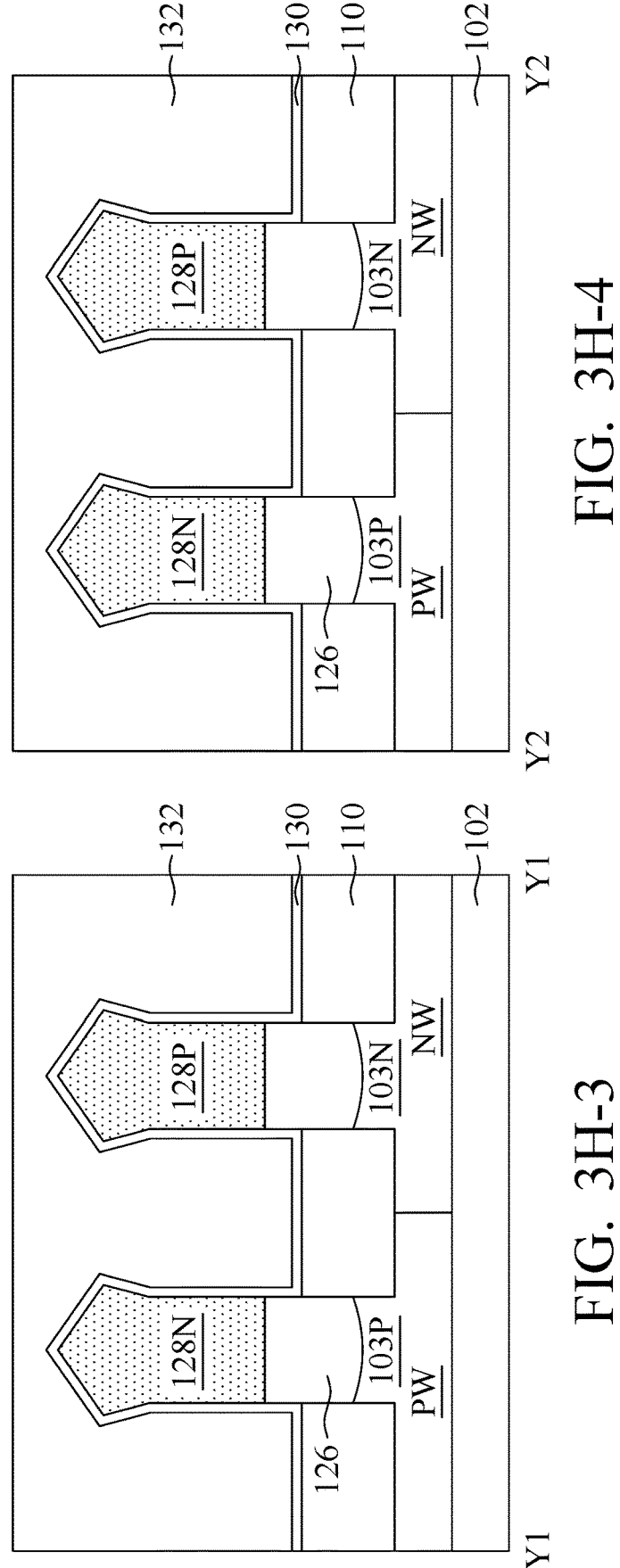
Figures 3, 3H, 4, 5:
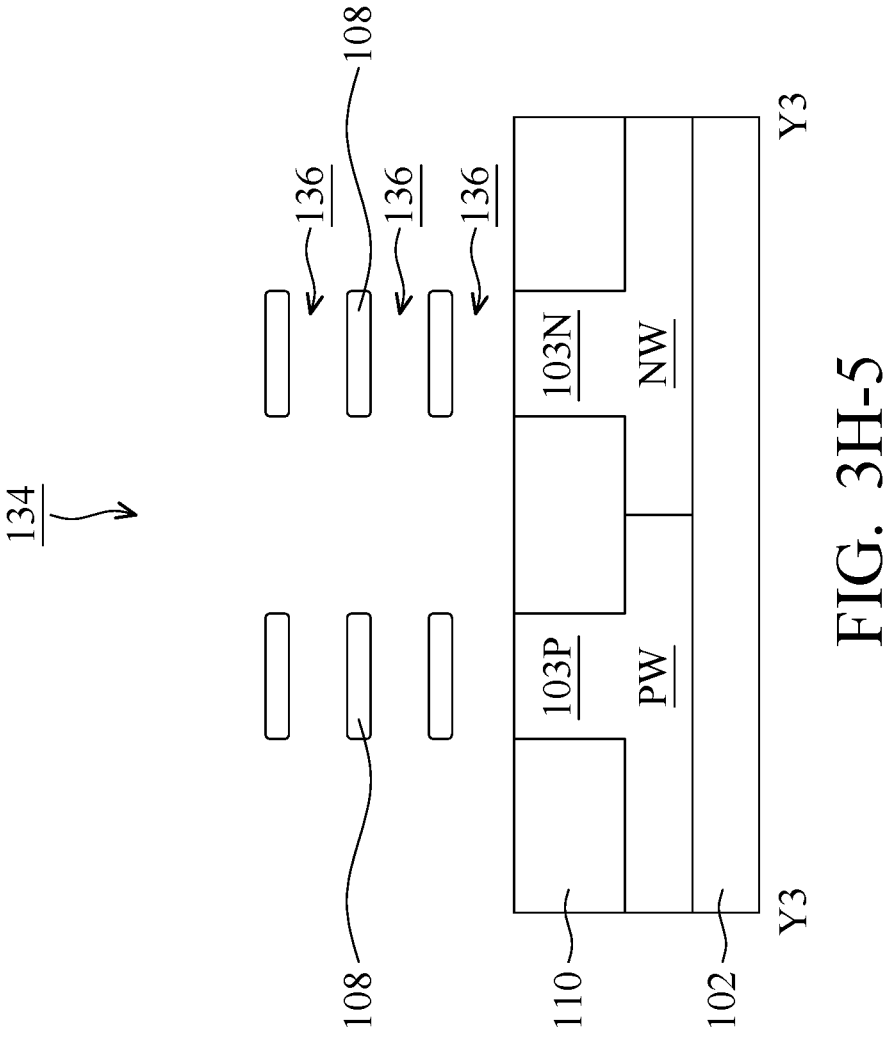
Figures 1, 2, 3I:
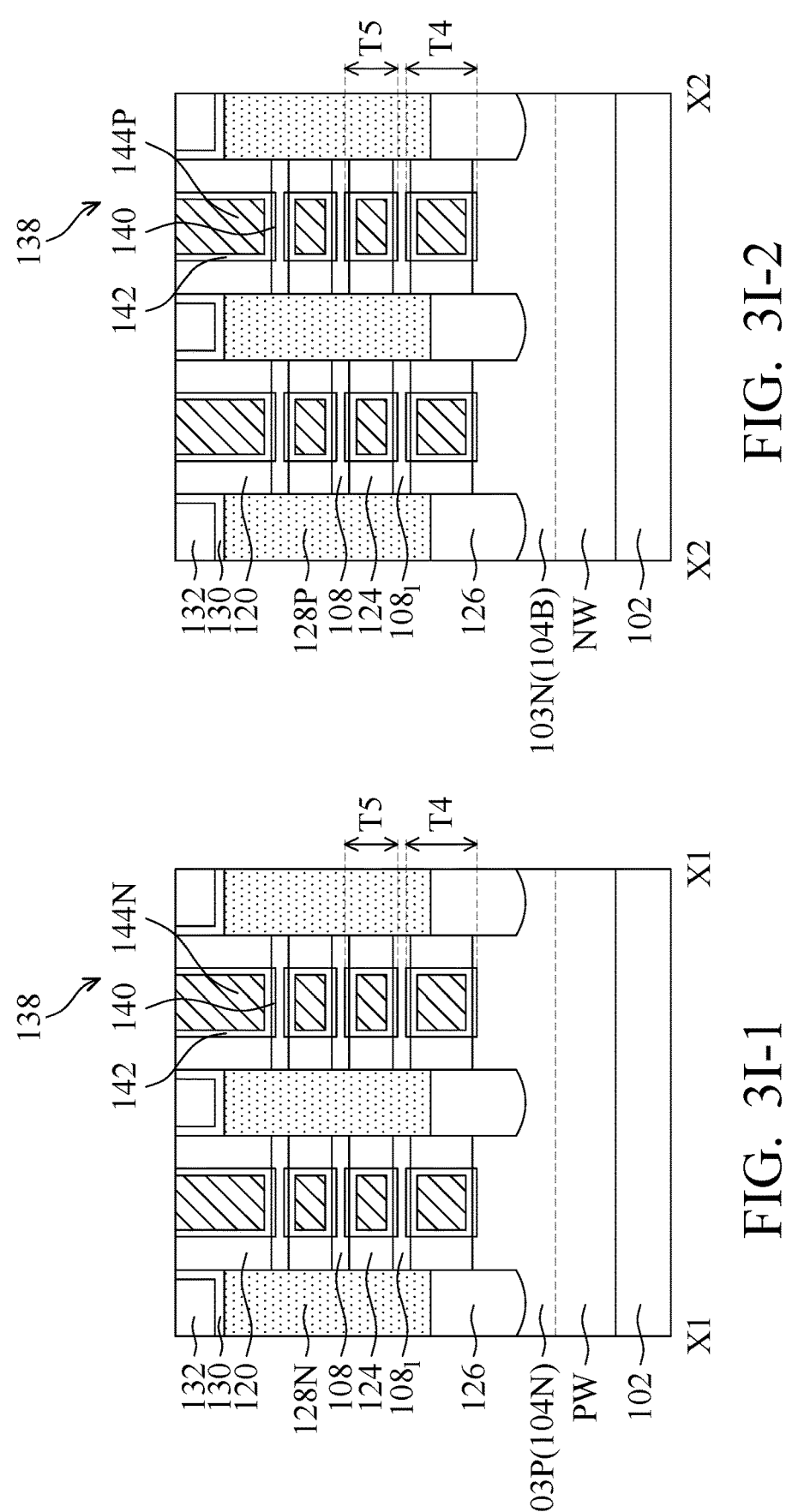
Figures 3, 3I, 4:
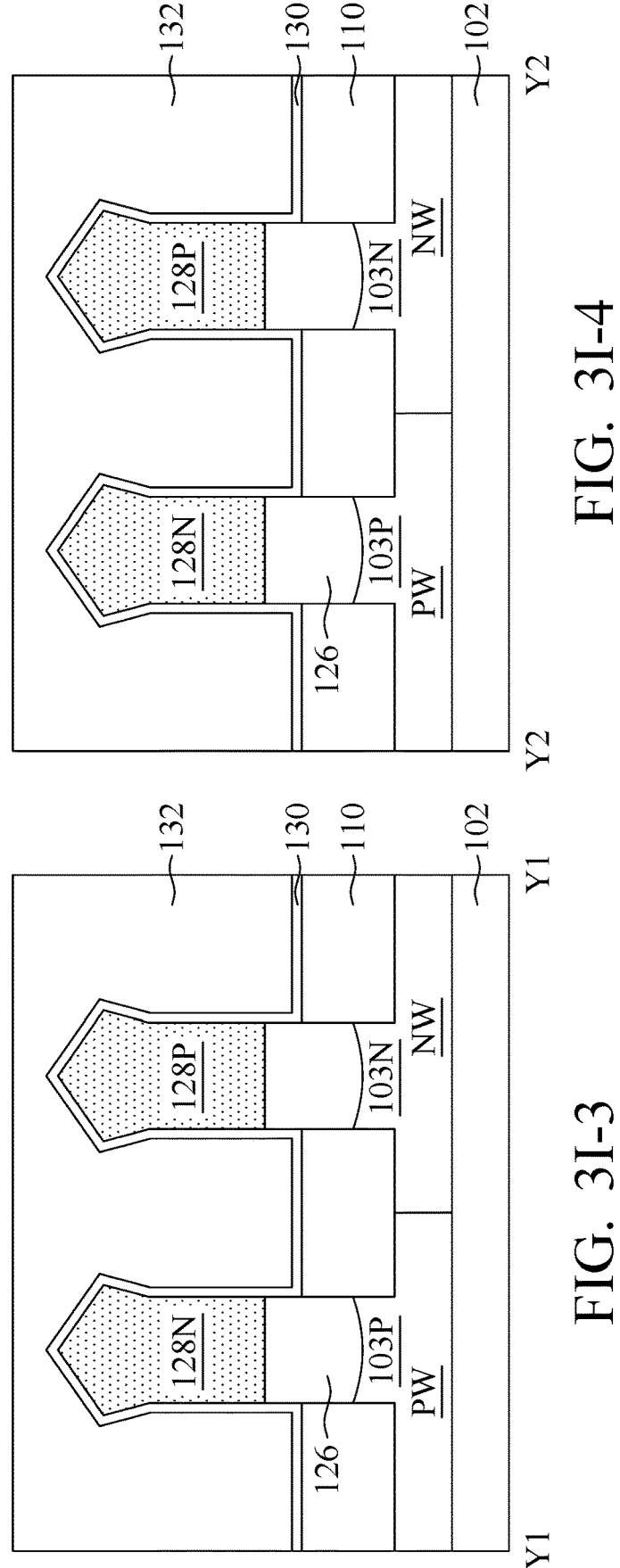
Figures 3, 3I, 4, 5:
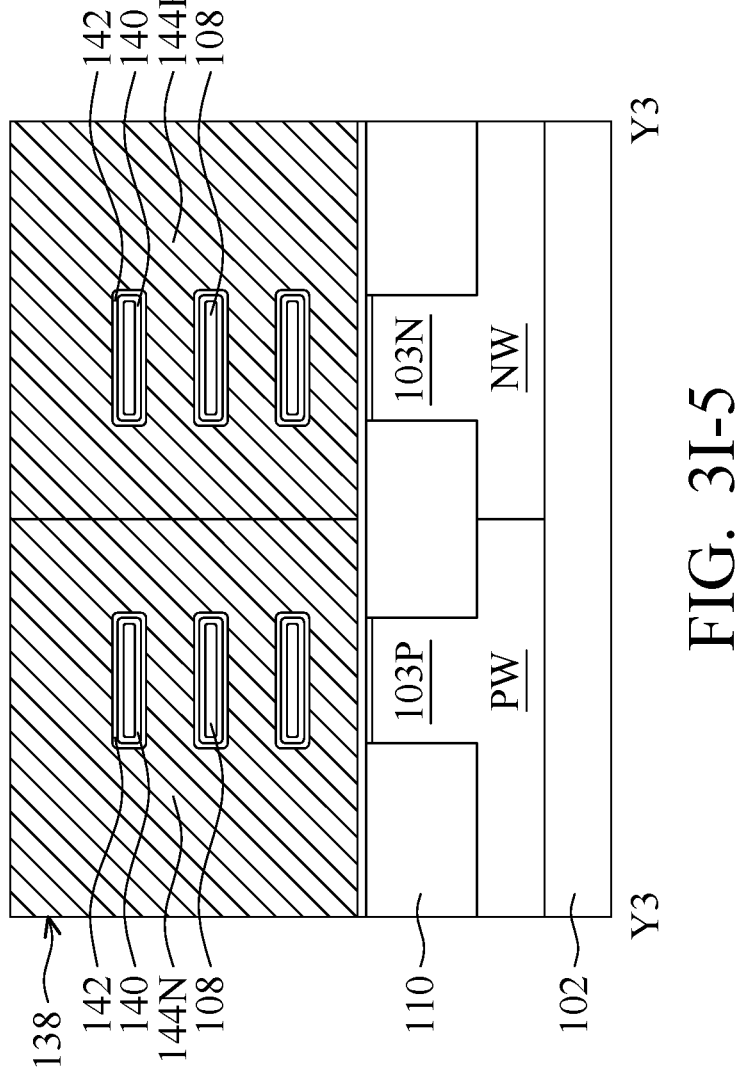
Figures 2, 3J:
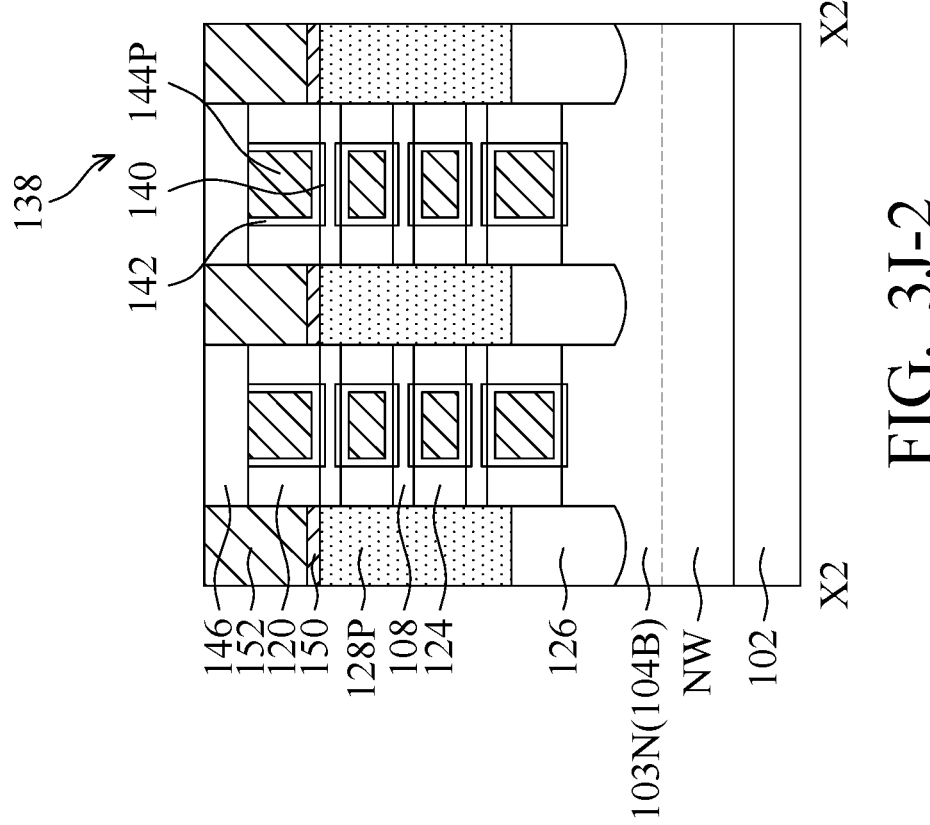
Figures 1, 3J:
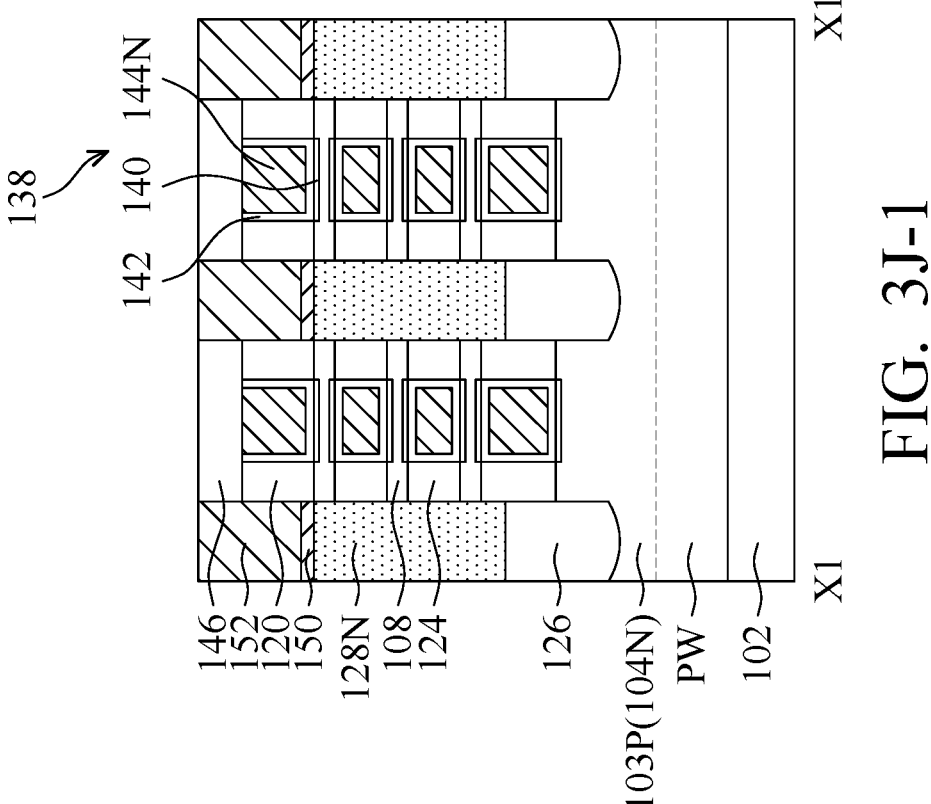
Figures 3, 3J, 4:
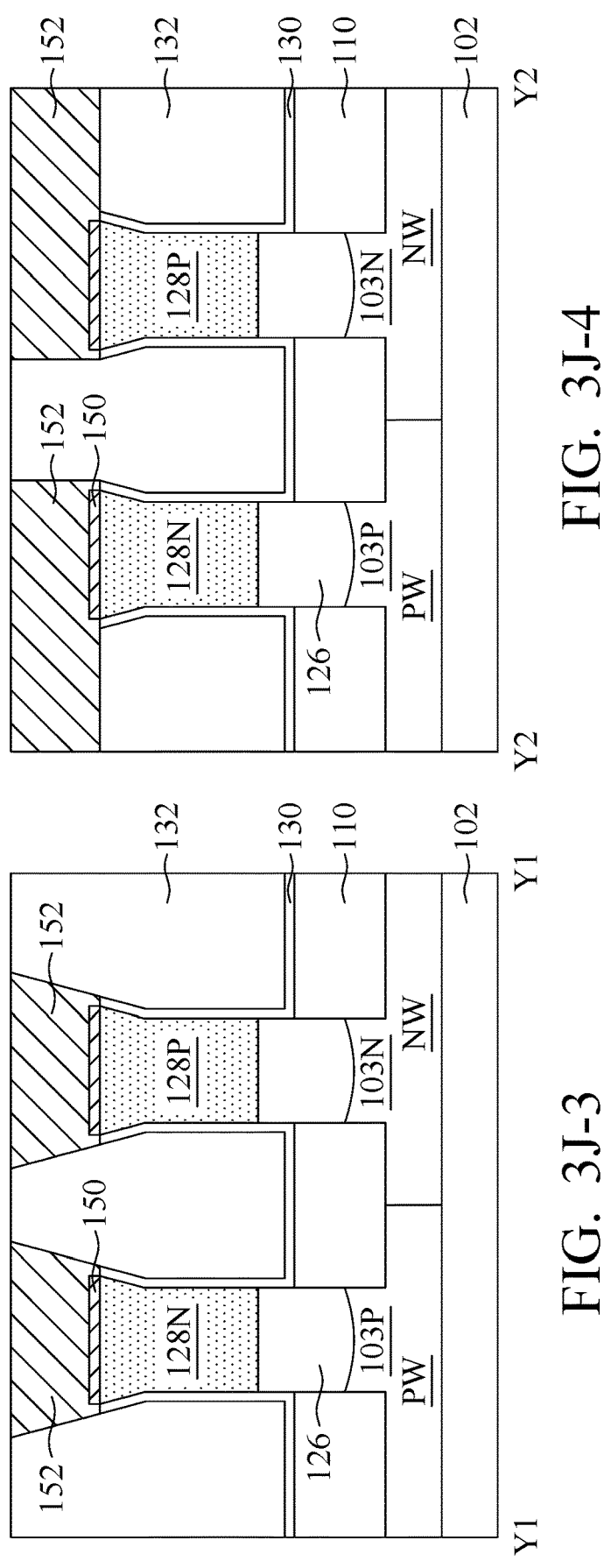
Figures 3, 3J, 4, 5:
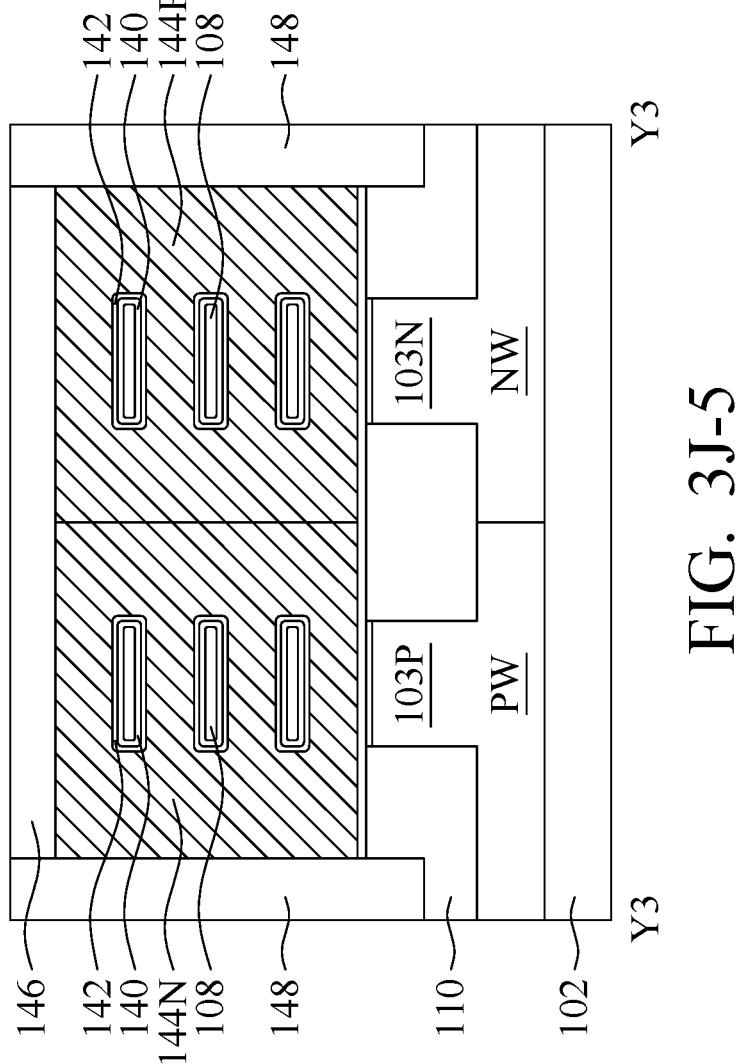

After the one or more etching processes, the four main surfaces of the second semiconductor layers 108 are exposed, in accordance with some embodiments. The exposed second semiconductor layers 108 of each of the active regions 104 form two sets of nanostructures 108, as shown in FIGS. 3H-1 and 3H-2, in accordance with some embodiments. Each set includes three nanostructures 108 vertically stacked and spaced apart from one other, in accordance with some embodiments. As the term is used herein, "nanostructures" refers to the semiconductor layers with cylindrical shape, bar shaped and/or sheet shape. The nanostructures 108 function as channels of the resulting semiconductor devices (e.g., nanostructure transistors such as GAA transistors), in accordance with some embodiments.

FIGS. 3I-1 to 3I-5 illustrate a semiconductor structure 100 after the formation of final gate stacks 138, in accordance with some embodiments.

Final gate stacks 138 are formed in the gate trenches 134 and gaps 136, thereby wrapping around the nanostructures 108, as shown in FIGS. 3I-1, 3I-2 and 3I-3, in accordance with some embodiments. In some embodiments, the final gate stacks 138 extend in the Y direction. That is, the final gate stacks 138 have longitudinal axes parallel to the Y direction, in accordance with some embodiments. The final gate stacks 138 engage the channel region so that current can flow between the source/drain regions during operation. In some embodiments, each of the final gate stacks 138 includes an interfacial layer 140, a gate dielectric layer 142 and a work function metal material 144 (including 144N and 144P), as shown in FIGS. 3I-1, 3I-2 and 3I-5, in accordance with some embodiments.

The interfacial layer 140 is formed on the exposed surfaces of the nanostructures 108 and the exposed upper surfaces of the lower fin elements 103P and 103N, in accordance with some embodiments. The interfacial layer 140 wraps around the nanostructures 108, in accordance with some embodiments. In some embodiments, the interfacial layer 140 is made of a chemically formed silicon oxide. In some embodiments, the interfacial layer 140 is nitrogen-doped silicon oxide. In some embodiments, the interfacial layer 140 is formed using one or more cleaning processes such as including ozone (O$_3$), ammonia hydroxide-hydrogen peroxide-water mixture, and/or hydrochloric acid-hydrogen peroxide-water mixture. Semiconductor material from the nanostructures 108 and the lower fin elements 103P and 103N is oxidized to form the interfacial layer 140, in accordance with some embodiments.

The gate dielectric layer 142 is formed conformally along the interfacial layer 140 to wrap around the nanostructures 108, in accordance with some embodiments. The gate dielectric layer 142 is further formed along the upper surface of the isolation structure 110, in accordance with some embodiments. The gate dielectric layer 142 is also conformally formed along the sidewalls of the gate spacer layers 120 facing the channel region, in accordance with some embodiments. The gate dielectric layer 142 is also conformally formed along the sidewalls of the inner spacer layers 124 facing the channel region, in accordance with some embodiments.

The gate dielectric layer 142 may be high-k dielectric layer. In some embodiments, the high-k dielectric layer is dielectric material with high dielectric constant (k value), for example, greater than 9, such as greater than 13. In some embodiments, the high-k dielectric layer includes hafnium oxide ($HfO_2$), $TiO_2$, HfZrO, $Ta_2O_3$, $HfSiO_4$, $ZrO_2$, $ZrSiO_2$, LaO, $Al_2O_3$, ZrO, TiO, $Ta_2O_5$, $Y_2O_3$, $SrTiO_3$ (STO), $BaTiO_3$ (BTO), BaZrO, HfZrO, HfLaO, HfSiO, LaSiO, AlSiO, HfTaO, HfTiO, (Ba, Sr)$TiO_3$ (BST), $Si_3N_4$, oxynitrides (SiON), a combination thereof, or another suitable material. The high-k dielectric layer may be deposited using ALD, PVD, CVD, and/or another suitable technique. In some embodiments, the gate dielectric layer 142 has a thickness in a range from about 0.5 nm to about 3 nm.

The work function metal material 144 (including 144N and 144P) is formed to fill remainders of the gate trenches 134 and gaps 136, in accordance with some embodiments. The work function metal material 144N is formed over the p-type well PW, and the work function metal material 144P is formed over the n-type well NW, in accordance with some embodiments. In some embodiments, the work function metal materials 144N and 144P may be used as metal gate electrode layers of the final gate stacks 138. In some embodiments, the work function metal materials 144N and 144P have selected work functions to enhance the device performance (e.g., threshold voltage) for n-channel FETs or p-channel FETs.

In some embodiments, the work function metal materials 144N and 144P are more than one conductive material, such as a metal, metal alloy, conductive metal oxide and/or metal nitride, another suitable conductive material, or a combination thereof. For example, the work function metal material 144 is TiN, TaN, TiAl, TiAlN, TaAl, TaAlN, TaAlC, TaCN, WNC, Co, Pt, W, Ti, Ag, Al, TaC, TaSiN, Mn, Zr, Ru, Mo, WN, Cu, W, Re, Ir, Ni, another suitable conductive material, or multilayers thereof. The work function metal materials 144N includes a different combination of materials than the work function metal materials 144P, in accordance with some embodiments. The work function metal material 144 may be formed using ALD, PVD, CVD, e-beam evaporation, or another suitable technique.

The work function metal materials 144N and 144P may be formed separately for n-channel nanostructure transistors and p-channel nanostructure transistors, which may use different work function materials. For example, a patterned mask layer (such as a photoresist layer and/or a hard mask layer) is formed to cover regions of the substrate 102 over the p-type well PW, and the conductive materials for the work function metal material 144P are deposited, in accordance with some embodiments. Afterward, the patterned mask layer may be removed. Similarly, a patterned mask layer (such as photoresist layer and/or hard mask layer) is formed to cover regions of the substrate 102 over the n-type well NW, and the conductive materials for the work function metal material 144N are deposited, in accordance with some embodiments. Afterward, the patterned mask layer may be removed. In alternative embodiments, the conductive material for the work function metal materials 144N is the same as the conductive material for the work function metal materials 144P.

A planarization process such as CMP may be performed on the semiconductor structure 100 to remove the materials of the gate dielectric layer 142 and the work function metal material 144 formed above the upper surface of the first interlayer dielectric layer 132, in accordance with some embodiments. The final gate stacks 138 wrapping around the nanostructures 108 combine with the neighboring source/drain features 128N and 128P to form nanostructure transistors. In some embodiments, the neighboring transistors share a common source/drain feature 128.

The portions of the final gate stack 138 which are formed between the inner spacer layers 124 are referred to as inner gate stack, in accordance with some embodiments. In some embodiments, the ratio (T4/T5) of the thickness T4 of the lowermost inner gate stack to the thickness T5 of other inner gate stack is in a range from about 1.1 to about 4, e.g., in a range from about 1.1 to about 1.5.

The source/drain features 128N and 128P are formed with a small thickness (or volume) due to the formation of the dielectric isolation features 124, which may reduce the parasitic capacitance between the gate electrode layer and the source/drain features (i.e., Cgd and Cgs), in accordance with some embodiments. In addition, the source/drain features 128N and 128P are separate from the lower fin element 103N (or 103P) by the dielectric isolation features 124, which may reduce the parasitic capacitance between the source/drain features 124 and the well 50N (or 50P), in accordance with some embodiments. Therefore, the overall parasitic capacitance in the cell region C may be reduced, thereby enhancing the performance (e.g., speed) of the resulting semiconductor devices.

FIGS. 3J-1 to 3J-5 illustrate a semiconductor structure 100 after the formation of dielectric cap layers 146, gate isolation layers 148, silicide layers 150, contact plugs 152, and a second interlayer dielectric layer 154, in accordance with some embodiments.

An etching process is performed to recess the final gate stacks 138 and the gate spacer layers 120 thereby forming recesses, and then dielectric cap layers 146 are formed in the recesses, as shown in FIGS. 3J-1, 3I-2 and 3I-5, in accordance with some embodiments. The etching process may be an anisotropic etching process such as dry plasma etching, an isotropic etching process such as dry chemical etching, remote plasma etching or wet chemical etching, and/or a combination thereof. In some embodiments, the dielectric cap layers 146 are made of dielectric material such as silicon nitride (SiN), silicon oxynitride (SiON), silicon carbon nitride (SiCN), silicon oxycarbonitride (SiOCN), oxygen-doped silicon carbonitride (Si(O)CN), silicon oxide ($SiO_2$), nitride-based dielectric, metal oxide dielectric such as $HfO_2$, $Ta_2O_5$), $TiO_2$, $ZrO_2$, $Al_2O_3$, $Y_2O_3$, or a combination thereof.

In some embodiments, a dielectric material for the dielectric cap layers 146 is deposited using such as ALD, CVD (such as LPCVD, PECVD, HDP-CVD, or HARP), another suitable technique, and/or a combination thereof. Afterward, a planarization process is performed on the dielectric material for the dielectric cap layers 146 until the first interlayer dielectric layer 132 is exposed, in accordance with some embodiments. The planarization may be CMP, etching back process, or a combination thereof. In some embodiments, the thickness of the dielectric cap layers 146 is in a range from about 2 nm to about 60 nm.

Gate cutting structures 148 are formed in and/or through the dielectric capping layers 146, the final gate stacks 138 and the gate spacer layers 120 and extend into the isolation structure 110, as shown in FIG. 3J-5, in accordance with some embodiments. The final gate stacks 138 are cut through by the gate cutting structures 148 into several segments, in accordance with some embodiments. The formation of the gate cutting structures 148 includes patterning the dielectric capping layers 146, the final gate stacks 138 and the gate spacer layers 120 to form gate-cut openings (where the gate cutting structures 148 are to be formed) using photolithography and etching processes until the isolation structure 110 is exposed. The etch processes may include dry etching such as reactive ion etch (RIE), neutral beam etch (NBE), inductive coupled plasma (ICP) etch, capacitively coupled plasma (CCP) etch, another suitable method, or a combination thereof. The gate-cut openings may extend into until the isolation structure 110, in accordance with some embodiments.

The formation of the gate cutting structures 148 further includes depositing a dielectric material for the gate cutting structures 148 to overfill the gate-cut opening, in accordance with some embodiments. The gate cutting structures 148 are made of dielectric material such as silicon nitride (SiN), silicon oxynitride (SiON), silicon carbon nitride (SiCN), silicon oxycarbonitride (SiOCN), oxygen-doped silicon carbonitride (Si(O)CN), silicon oxide (SiO$_2$), or a combination thereof. In some embodiments, the gate cutting structures 148 include dielectric material with dielectric constant value greater than 9, such as LaO, AlO, AlON, ZrO, HfO, ZnO, ZIN, ZrAlO, TiO, TaO, YO, and/or TaCN. In some embodiments, the deposition process is ALD, CVD (such as LPCVD, PECVD, HDP-CVD, or HARP), another suitable technique, or a combination thereof. Afterward, a planarization process is then performed on the dielectric material for the gate cutting structures 148 until the dielectric capping layer 146 and the first interlayer dielectric layer 132 are exposed, in accordance with some embodiments. The planarization may be CMP, etching back process, or a combination thereof.

Contact plugs 152 are formed in and/or through the first interlayer dielectric layer 132 and the contact etching stop layer 130 and land on the source/drain features 128N and 128P, as shown in FIGS. 3J-1 to 3J-4, in accordance with some embodiments. The contact plugs 152 are electrically connected to the source/drain features 128N and 128P, in accordance with some embodiments. In some embodiments, the formation of the contact plugs 152 includes patterning the first interlayer dielectric layer 132 and the contact etching stop layer 130 to form contact openings (where the contact plugs 152 are to be formed) using photolithography and etching processes until the source/drain features 128 are exposed. In some embodiments, the dielectric capping layers 146 may be used as a portion of the etching mask to protect underlying final gate stacks 138, and a patterned mask layer (e.g., a patterned photoresist layer and/or a patterned hard mask layer) is formed over the first interlayer dielectric layer 132. The etching process may include dry etching such as RIE, NBE, ICP etch, CCP etch, another suitable method, or a combination thereof. In some embodiments, the source/drain features 128 are recessed in the etching process. In some embodiments, the portions of the contact etching stop layer 130 formed along the gate spacer layers 120 are entirely removed, thereby exposing the sidewalls of the gate spacer layers 120.

Silicide layers 150 are formed on the exposed surfaces of the source/drain features 128N and 128P. In some embodiments, the silicide layers 150 are made of WSi, NiSi, TiSi and/or CoSi. In some embodiments, the formation of the silicide layers 150 includes depositing a metal material followed by one or more annealing processes. The semiconductive material (e.g., Si) from the source/drain features

128N and 128P reacts with the metal material to form the silicide layers 150, in accordance with some embodiments.

Afterward, one or more conductive materials for the contact plugs 152 are deposited to overfill the contact openings, in accordance with some embodiments. In some embodiments, one or more conductive materials are deposited using CVD, PVD, e-beam evaporation, ALD, electroplating (ECP), electroless deposition (ELD), another suitable method, or a combination thereof to overfill the contact openings. The one or more conductive materials over the upper surface of the first interlayer dielectric layer 132 are planarized using, for example, CMP. After the planarization process, the upper surfaces of the contact plugs 152, the upper surface of the first interlayer dielectric layer 132 and the upper surfaces of the dielectric capping layers 146 are substantially coplanar, in accordance with some embodiments. In some embodiments, the contact plugs 152 are in contact with the sidewalls of the gate spacer layers 120.

The contact plugs 152 may have a multilayer structure including, for example, liner layers, glue layers, barrier layers, seed layers, metal bulk layers, another suitable layer, or a combination thereof. For example, a barrier layer (not shown) may optionally be deposited along the sidewalls and the bottom surfaces of the contact openings. The barrier layer is used to prevent the metal from the subsequently formed metal material from diffusing into the dielectric material (e.g., the first interlayer dielectric layer 132, and the contact etching stop layer 130). The barrier layer may be made of tantalum (Ta), tantalum nitride (TaN), titanium (Ti), titanium nitride (TiN), cobalt tungsten (CoW), another suitable material, or a combination thereof. If the subsequently formed metal material does not easily diffuse into the dielectric material, the barrier layer may be omitted.

A glue layer (not shown) may optionally be deposited along the sidewalls and the bottom surfaces of the contact openings, and on the barrier layer (if formed). The glue layer is used to improve adhesion between the subsequently formed metal material and the dielectric material (e.g., the first interlayer dielectric layer 132 and the contact etching stop layer 130). The glue layer may be made of tantalum nitride (TaN), titanium (Ti), titanium nitride (TiN), another suitable material, or a combination thereof. A metal bulk layer is then deposited on the glue layer (if formed) to fill the remainder of the contact openings. In some embodiments, the metal bulk layer is formed using a selective deposition technique such as cyclic CVD process or ELD process, and it is not necessary to form a glue layer in the contact openings before depositing the metal bulk material. In some embodiments, the metal bulk layer is made of one or more conductive materials with low resistance and good gap-fill ability, for example, cobalt (Co), nickel (Ni), tungsten (W), titanium (Ti), tantalum (Ta), copper (Cu), rhodium (Rh), iridium (Ir), platinum (Pt), aluminum (Al), ruthenium (Ru), molybdenum (Mo), another suitable metal material, or a combination thereof.

FIGS. 3K-1 to 3K-5 illustrate a semiconductor structure 100 after the formation of vias 156 and 158 and a first metal layer (M1), in accordance with some embodiments.

A second interlayer dielectric layer 154 is formed over the semiconductor structure 100, as shown in FIGS. 3K-1 to 3K-5, in accordance with some embodiments. In some embodiments, the second interlayer dielectric layer 154 is made of dielectric material, such as USG, BPSG, FSG, PSG, BSG, and/or another suitable dielectric material. In some embodiments, the second interlayer dielectric layer 154 is deposited using such as CVD (such as HDP-CVD, PECVD, HARP or FCVD), another suitable technique, or a combination thereof.

Vias 156 are formed in and/or through the second interlayer dielectric layer 154 and the dielectric capping layer 146 and land on the work function metal materials 144 of the final gate stacks 138, and vias 158 are formed in and/or through the second interlayer dielectric layer 154 and land on the contact plugs 152, as shown in FIGS. 3K-1 to 3K-5, in accordance with some embodiments. The vias 156 are electrically connected to the work function metal materials 144 of the final gate stacks 138 and may be also referred to as gate vias (VG), in accordance with some embodiments. The vias 158 are electrically connected to source/drain terminals of the nanostructure transistors through the contact plugs 152 and may be also referred to as source/drain vias (VS or VD), in accordance with some embodiments.

In some embodiments, the formation of the vias 156 and via 158 includes patterning the second interlayer dielectric layer 154 and the dielectric capping layer 146 to form via openings (where the vias 156 and via 158 are to be formed) using photolithography and etching processes. In some embodiments, the final gate stacks 138 are exposed from the via openings for vias 156, and the contact plugs 152 are exposed from the via openings for vias 158. The etch processes may include dry etching such as RIE, NBE, ICP etch, CCP etch, another suitable method, or a combination thereof. In some embodiments, the patterning processes for the vias 156 and via 158 may be formed separately. Afterward, one or more conductive materials are deposited using CVD, PVD, e-beam evaporation, ALD, ECP, ELD, another suitable method, or a combination thereof to overfill the via openings, in accordance with some embodiments. The one or more conductive materials over the upper surface of the second interlayer dielectric layer 154 are planarized using, for example, CMP. After the planarization process, the upper surfaces of the vias 156, the upper surfaces of the vias 158, and the upper surface of the second interlayer dielectric layer 154 are substantially coplanar, in accordance with some embodiments.

The vias 156 and via 158 may have a multilayer structure. For example, a barrier layer (not shown) may optionally be deposited along the sidewalls and the bottom surfaces of the via openings. The barrier layer may be made of tantalum (Ta), tantalum nitride (TaN), titanium (Ti), titanium nitride (TiN), cobalt tungsten (CoW), another suitable material, or a combination thereof. A glue layer (not shown) may optionally be deposited along the sidewalls and the bottom surfaces of the via openings, and on the barrier layer (if formed). The glue layer may be made of tantalum nitride (TaN), titanium (Ti), titanium nitride (TiN), another suitable material, or a combination thereof. A metal bulk layer is then deposited on the glue layer (if formed) to fill the remainder of the via openings. In some embodiments, the metal bulk layers are made of one or more conductive materials, such as cobalt (Co), nickel (Ni), tungsten (W), titanium (Ti), tantalum (Ta), copper (Cu), aluminum (Al), ruthenium (Ru), molybdenum (Mo), another suitable metal material, or a combination thereof.

An intermetal dielectric (IMD) layer 164 is formed over the vias 156 and 158 and the second interlayer dielectric layer 154, as shown in FIGS. 3K-1 to 3K-5, in accordance with some embodiments. In some embodiments, the intermetal dielectric layer 164 is made of one or more dielectric materials, such as silicon oxide (SiO), silicon nitride (SiN), silicon oxynitride (SiON), silicon carbide (SiC), aluminum oxide ($Al_2O_3$), dielectric material(s) with low dielectric constant (low-k) such as SiCOH, SiOCN, and/or SiOC, or a combination thereof. In some embodiments, the intermetal dielectric layer 164 is made of an extreme low-k (ELK) dielectric material with a dielectric constant (k) less than about 3.0, or even less than about 2.5. In some embodiments, ELK dielectric materials include carbon doped silicon oxide, amorphous fluorinated carbon, parylene, bis-benzocyclobutenes (BCB), polytetrafluoroethylene (PTFE) (Teflon), or silicon oxycarbide polymers (SiOC). In some embodiments, ELK dielectric materials include a porous version of an existing dielectric material, such as hydrogen silsesquioxane (HSQ), porous methyl silsesquioxane (MSQ), porous polyarylether (PAE), porous SiLK, or porous silicon oxide ($SiO_2$). In some embodiments, the intermetal dielectric layer 164 is formed using CVD (such as LPCVD, HARP, and FCVD), ALD, spin-on coating, another suitable method, or a combination thereof. A post-curing process (e.g., UV curing) may be performed on the as-deposited ELK dielectric material for the intermetal dielectric layer 164 to form a porous structure.

A first metal layer (M1) is formed in and/or through the intermetal dielectric layer 164, in accordance with some embodiments. The first metal layer (M1) includes power supply lines 162A and signal lines 162B, as shown in FIGS. 3K-1 to 3K-5, in accordance with some embodiments. The lines 162A and 162B extend in the X direction. That is, the lines 162A and 162B have longitudinal axes parallel to the X direction, in accordance with some embodiments. The power supply lines 162A include a Vdd power rail providing positive voltage and a Vss power rail which may be an electrical ground, in accordance with some embodiments. The Vss power rail is electrically connected to the source terminals of the n-channel transistors through the vias 158 and the contact plugs 152, in accordance with some embodiments. The Vdd power rail is electrically connected to the source terminals of the p-channel transistors through the vias 158 and the contact plugs 152, in accordance with some embodiments.

In some embodiments, the formation of the first metal layer (M1) includes patterning the intermetal dielectric layer 164 using photolithography and etching processes to form trenches (where the first metal layer (M1) is to be formed) through the intermetal dielectric layer 164 and exposing the vias 156 and 158. The etch processes may include dry etching such as RIE, NBE, ICP etch, CCP etch, another suitable method, or a combination thereof. One or more conductive materials for the first metal layer (M1) are then deposited using CVD, PVD, e-beam evaporation, ALD, ECP, ELD, another suitable method to overfill the trenches. Afterward, a planarization process such as CMP and/or an etching back process is performed to remove an excess portion of the conductive materials from the upper surface of the intermetal dielectric layer 164. After the planarization process, the upper surfaces of the first metal layer (M1) and the intermetal dielectric layer 164 are substantially coplanar, in accordance with some embodiments.

The first metal layer M1 may have a multilayer structure. For example, a barrier layer (not shown) may optionally be deposited along the sidewalls and the bottom surfaces of the trenches. The barrier layer may be made of tantalum (Ta), tantalum nitride (TaN), titanium (Ti), titanium nitride (TiN), cobalt tungsten (CoW), another suitable material, or a combination thereof. A glue layer (not shown) may optionally be deposited along the sidewalls and the bottom surfaces of the trenches, and on the barrier layer (if formed). The glue layer may be made of tantalum nitride (TaN), titanium (Ti), titanium nitride (TiN), another suitable material, or a combination thereof. A metal bulk layer is then deposited on the glue layer (if formed) to fill the remainder of the trenches. In some embodiments, the metal bulk layers are made of one or more conductive materials, such as copper (Cu), cobalt (Co), ruthenium (Ru), molybdenum (Mo), chromium (Cr), tungsten (W), manganese (Mn), rhodium (Rh), iridium (Ir), nickel (Ni), palladium (Pd), platinum (Pt), silver (Ag), golden (Au), aluminum (Al), another suitable metal material, or a combination thereof. Additional components (such as second and third layers (M2 and M3)) may be formed over the semiconductor structure 100 to electrically couple the circuits in different cell regions to produce an integrated circuit.

FIGS. 4-1, 4-2, 4-3 and 4-4 are a modification of the semiconductor structure 100 of FIGS. 3K-1, 3K-2, 3K-3 and 3K-4, in accordance with some embodiments of the disclosure. FIG. 4-1 corresponds to cross-section X1-X1 shown in FIG. 2. FIG. 4-2 corresponds to cross-section X2-X2 shown in FIG. 2. FIG. 4-3 corresponds to cross-section Y1-Y1 shown in FIG. 2. FIG. 4-4 corresponds to cross-section Y2-Y2 shown in FIG. 2. FIGS. 4-1 to 4-4 illustrate a semiconductor 200 which is similar to the semiconductor structure 100 of FIGS. 3K-1 to 3K-5 except an air gap 164 between the source/drain feature 128 and the dielectric isolation features 126.

Due to the characteristics of the epitaxial growth, the source/drain features 128N and 128P may hardly grow on the dielectric surface provided from the dielectric isolation features 126, in accordance with some embodiments. The source/drain recesses 122 are separated from the dielectric isolation features 126 by air gaps 164, as shown in FIGS. 4-1, 4-2, 4-3 and 4-4, in accordance with some embodiments. The presence of the air gaps 164 may further reduce the parasitic capacitance between the gate electrode layer and the source/drain features and the parasitic capacitance between the source/drain features and the well, in accordance with some embodiments. Therefore, the performance (e.g., speed) of the resulting semiconductor devices may be further enhanced.

FIGS. 5-1, 5-2, 5-3 and 5-4 are a modification of the semiconductor structure 100 of FIGS. 3K-1, 3K-2, 3K-3 and 3K-4, in accordance with some embodiments of the disclosure. FIG. 5-1 corresponds to cross-section X1-X1 shown in FIG. 2. FIG. 5-2 corresponds to cross-section X2-X2 shown in FIG. 2. FIG. 5-3 corresponds to cross-section Y1-Y1 shown in FIG. 2. FIG. 5-4 corresponds to cross-section Y2-Y2 shown in FIG. 2. FIGS. 5-1 to 5-4 illustrate a semiconductor 300 which is similar to the semiconductor structure 100 of FIGS. 3K-1 to 3K-5 except a semiconductor isolation feature 166 between the dielectric isolation features 126 and the lower fin element 103N (or 103P).

After the inner spacer layers 124 are formed, semiconductor isolation features 166 are formed in the source/drain recesses 122 on the lower fin elements 103N and 103P using an epitaxial growth process, as shown in FIGS. 5-1 to 5-4, in accordance with some embodiments. The epitaxial growth process may be MBE, MOCVD, or VPE, another suitable technique, or a combination thereof. In some embodiments, the semiconductor isolation feature 166 are made of undoped epitaxial material such as intrinsic silicon, intrinsic silicon germanium and/or another suitable semiconductor material. For example, an impurity (or an n-type dopant and/or a p-type dopant) in the semiconductor isolation feature 166 has a concentration of less than about $10^{14}$ cm$^{-3}$.

Afterward, the dielectric isolation features 126 are formed in the source/drain recesses 122 on the semiconductor isolation feature 166, in accordance with some embodiments. In some embodiments, the semiconductor isolation feature 166 are made of non-doped silicon, and the dielectric isolation features 126 are made silicon oxide. In some embodiments, forming the semiconductor isolation feature 166 may reduce the difficulty of the deposition and etching back processes for forming the dielectric isolation features 126. Therefore, the thickness T3 (or the position of the top surfaces) of the dielectric isolation features 126 may be precisely controlled. In some embodiments, the semiconductor isolation features 126 have a thickness in a range from about 5 nm to about 50 nm. In some embodiments, the dielectric isolation features 126 have a thickness T3 in a range from about 3 nm to about 30 nm.

Figures 1, 2, 6:
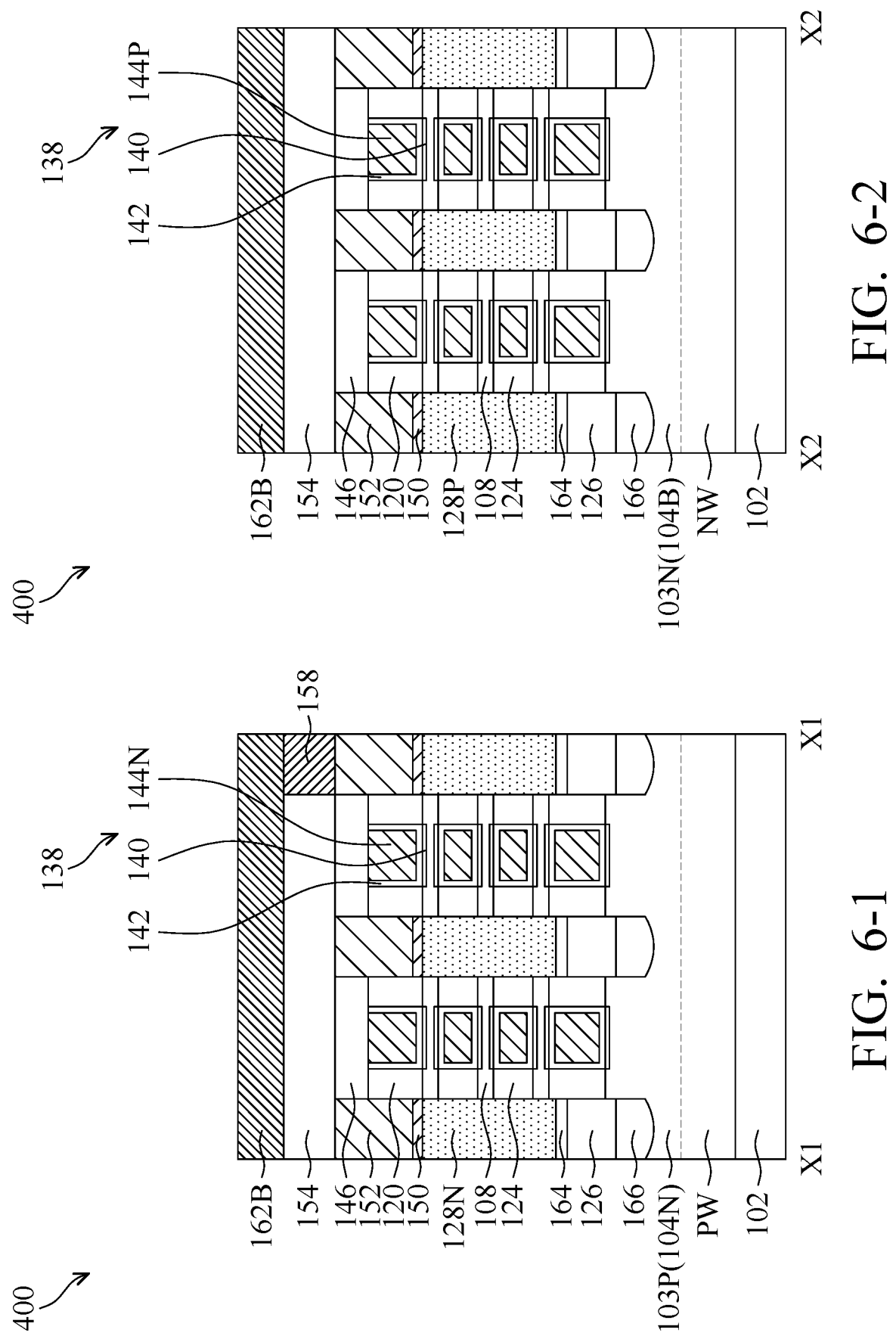

FIGS. 6-1, 6-2, 6-3 and 6-4 are a modification of the semiconductor structure 100 of FIGS. 3K-1, 3K-2, 3K-3 and 3K-4, in accordance with some embodiments of the disclosure. FIG. 6-1 corresponds to cross-section X1-X1 shown in FIG. 2. FIG. 6-2 corresponds to cross-section X2-X2 shown in FIG. 2. FIG. 6-3 corresponds to cross-section Y1-Y1 shown in FIG. 2. FIG. 6-4 corresponds to cross-section Y2-Y2 shown in FIG. 2. FIGS. 6-1 to 6-4 illustrate a semiconductor 400 which is similar to the semiconductor structure 100 of FIGS. 3K-1 to 3K-5 except that an air gap 164 is formed between the source/drain feature 128 and the dielectric isolation features 126 and a semiconductor isolation feature 166 is formed between the dielectric isolation features 126 and the lower fin element 103N (or 103P).

Figures 2, 7A:
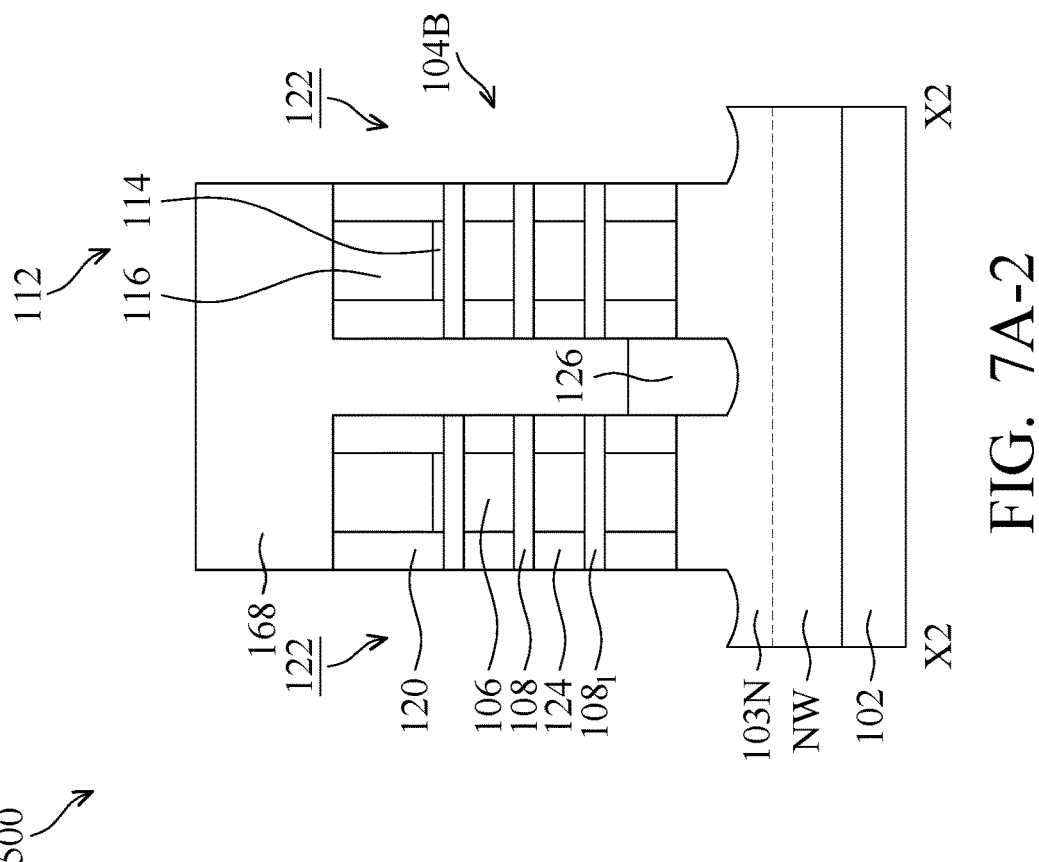
Figures 1, 7A:
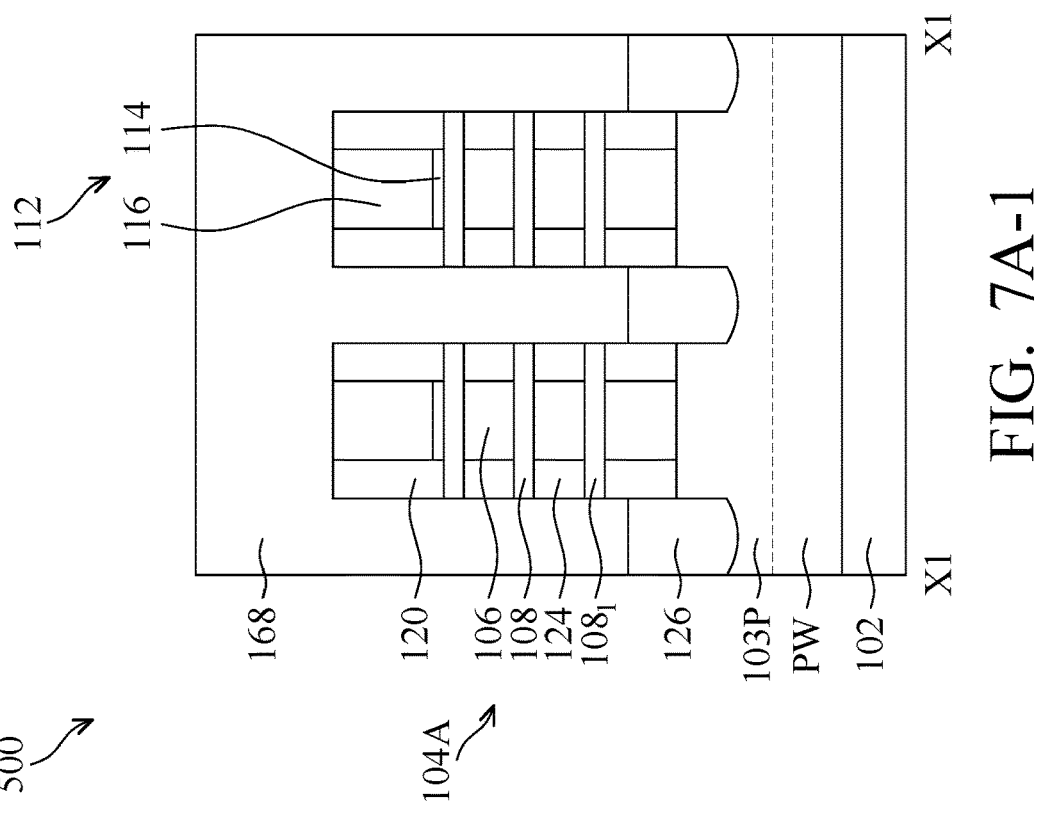
Figures 3, 4, 7A:
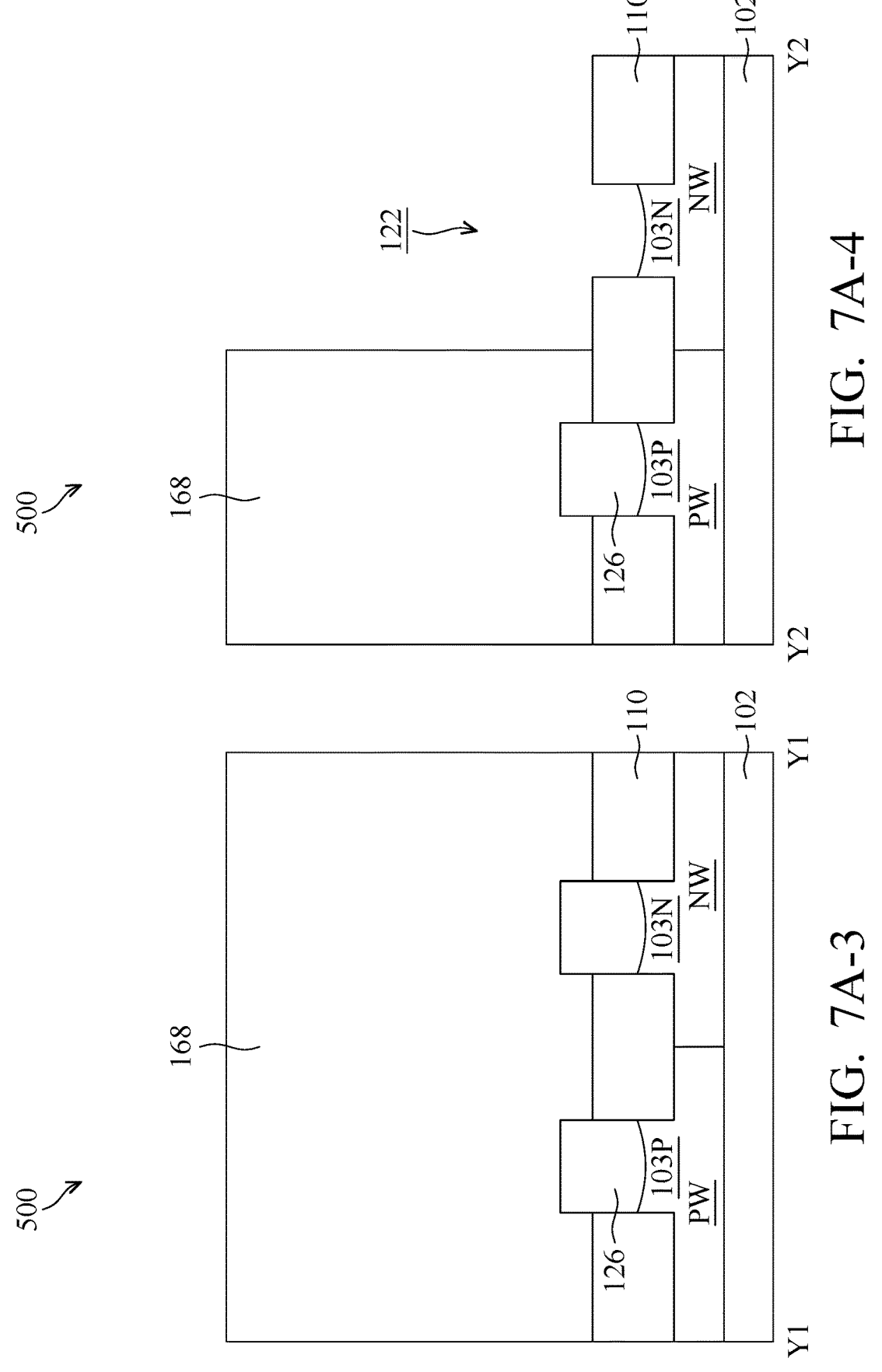
Figures 1, 2, 7B:
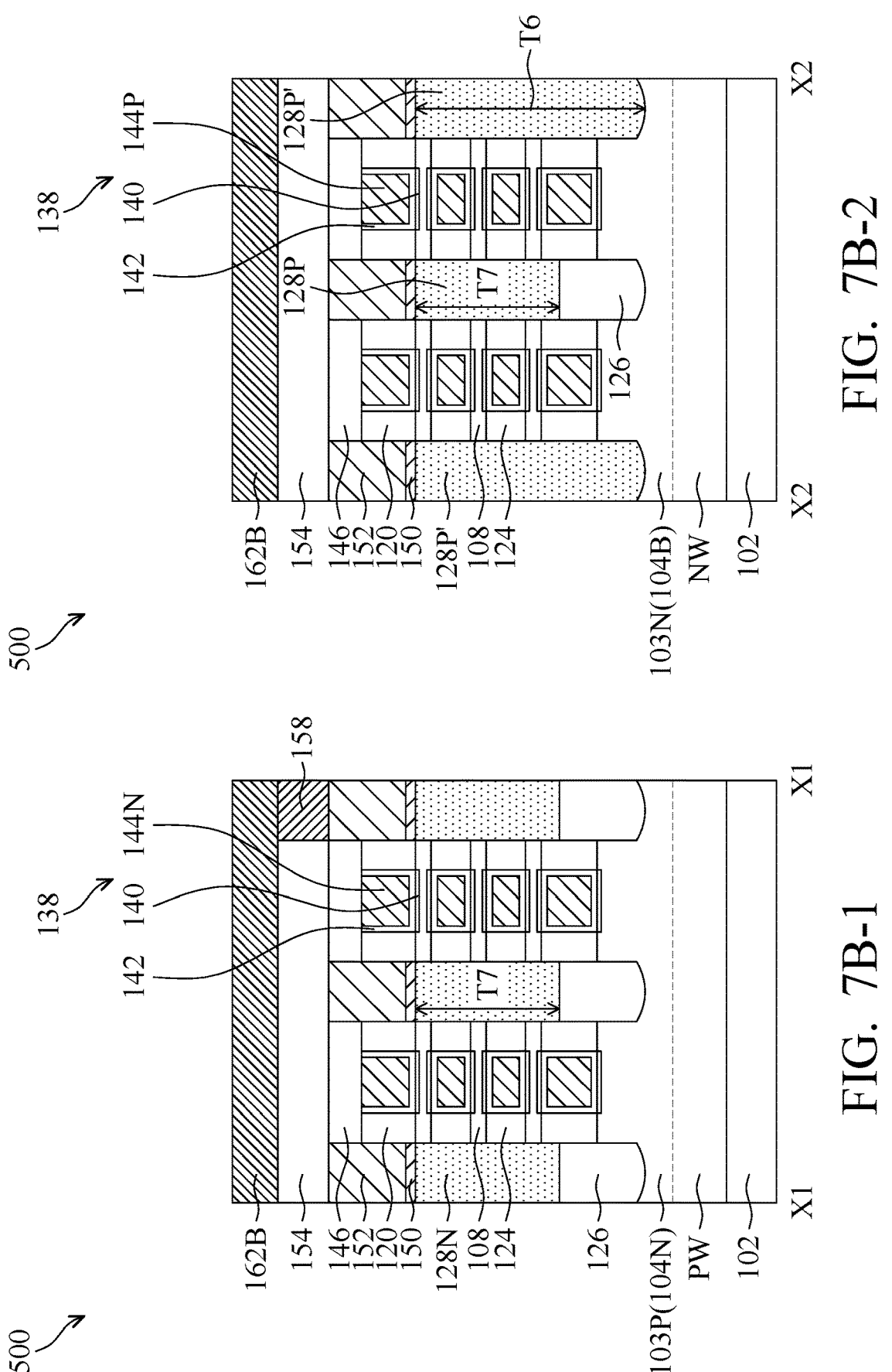

FIGS. 7A-1 through 7B-4 are cross-sectional views illustrating the formation of a semiconductor structure 500 at various intermediate stages, in accordance with some embodiments of the disclosure. FIGS. 7A-1 and 7B-1 correspond to cross-section X1-X1 shown in FIG. 2. FIGS. 7A-2 and 7B-2 correspond to cross-section X2-X2 shown in FIG. 2. FIGS. 7A-3 and 7B-3 correspond to cross-section Y1-Y1 shown in FIG. 2. FIGS. 7A-4 and 7B-4 correspond to cross-section Y2-Y2 shown in FIG. 2. The embodiments of FIGS. 7A-1 through 7B-4 are similar to the embodiments of FIGS. 3A-1 through 3K-5 except that source/drain features 128P' used as the source terminals of the p-channel transistors extend into the lower fin element 103N.

Continuing from FIGS. 3E-1 to 3E-5, a patterning process is performed to remove the dielectric isolation features 126 from the source/drain regions of the lower fin element 103N where the epitaxial material for the source terminals of the p-channel transistors is predetermined to be grown, as shown in FIGS. 7A-1 to 7A-5, in accordance with some embodiments. The patterning process includes forming a patterned mask layer 168 (e.g., a patterned photoresist layer and/or a patterned hard mask layer) and etching the dielectric isolation features 126 exposed from the patterned mask layer 168 until the lower fin element 103N is exposed, in accordance with some embodiments. Afterward, the patterned mask layer 168 is removed using an etching process, an ashing process or another suitable technique, or a combination thereof.

The steps described above in FIGS. 3F-1 through 3K-5 are performed, thereby forming the source/drain features 128N and 128P, the final gate stacks 138, the dielectric cap layers 146, the gate isolation layers 148, the contact plugs 152, the vias 156 and 158, and the first metal layer (M1), as shown in FIGS. 7B-1 to 7B-4, in accordance with some embodiments. The source/drain features used as the source terminals of the p-channel transistors are denoted as 128P', in accordance with some embodiments. The Vdd power rail of the power supply lines 162A is electrically connected to the source/drain features 128P', in accordance with some embodiments. The source/drain features 128P' extend into and are in direct contact with the lower fin element 103N, which may not substantially increase the overall parasitic capacitance of the cell region C because the source terminals and the well region may be electrically connected to the same or similar voltages, in accordance with some embodiments.

The source/drain features 128P' have a greater thickness (in the Z direction) and a greater volume than the source/drain features 128P, in accordance with some embodiments. In some embodiments, the ratio (T6/T7) of the thickness T6 of the source/drain features 128P' to the thickness T7 of the source/drain features 128P is in a range from about 1.1 to about 1.5. As a result, the channel regions of the p-channel transistors can be further strained or stressed by the source/drain features 128P', and thus the performance of the resulting semiconductor device may be further enhanced.

Figures 1, 2, 8:
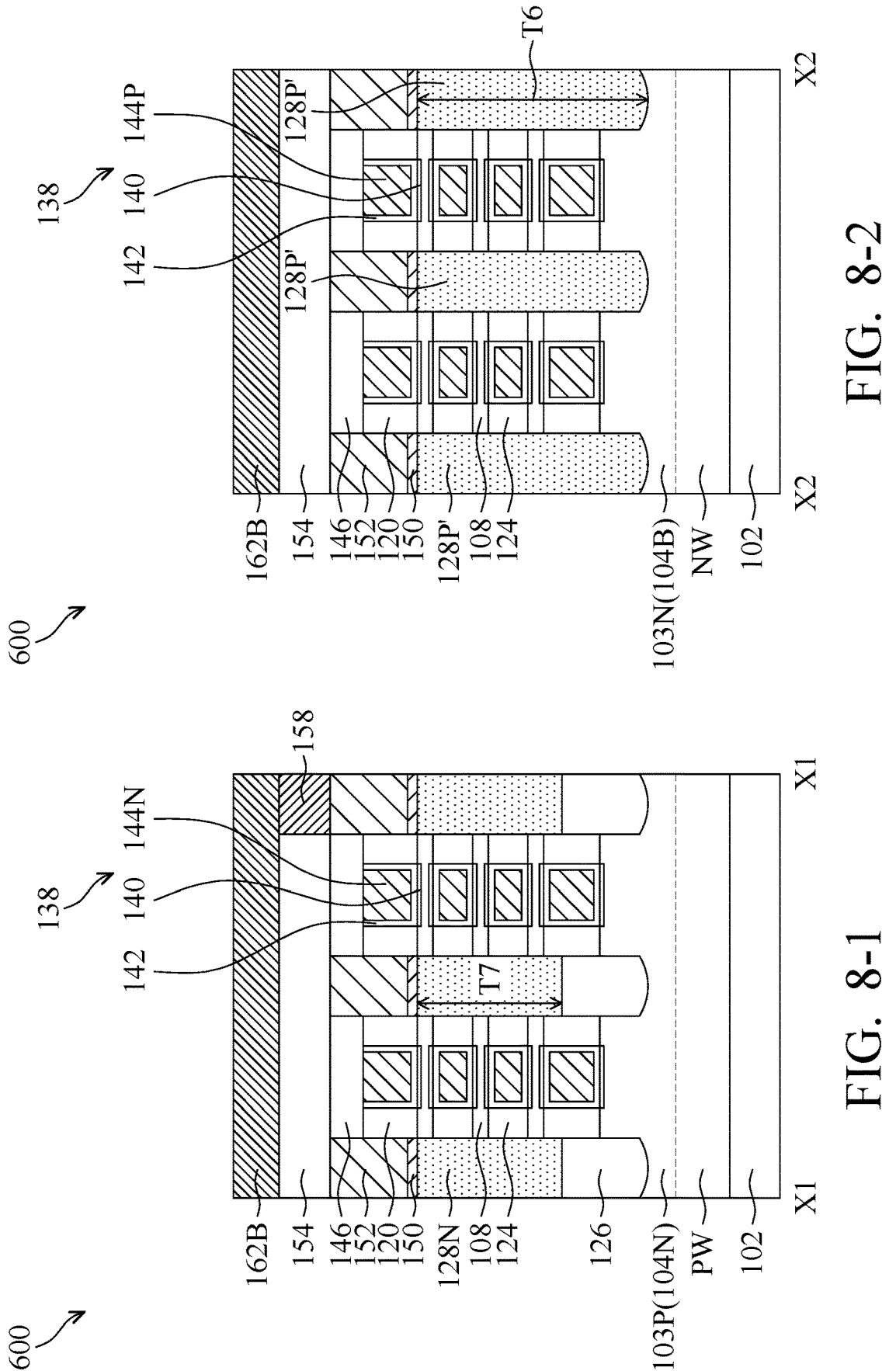

FIGS. 8-1, 8-2, 8-3 and 8-4 are a modification of the semiconductor structure 100 of FIGS. 3K-1, 3K-2, 3K-3 and 3K-4, in accordance with some embodiments of the disclosure. FIG. 8-1 corresponds to cross-section X1-X1 shown in FIG. 2. FIG. 8-2 corresponds to cross-section X2-X2 shown in FIG. 2. FIG. 8-3 corresponds to cross-section Y1-Y1 shown in FIG. 2. FIG. 8-4 corresponds to cross-section Y2-Y2 shown in FIG. 2. FIGS. 8-1 to 8-4 illustrate a semiconductor structure 600 which is similar to the semiconductor structure 100 of FIGS. 3K-1 to 3K-5 except that source/drain features 128P' used as the source and drain terminals of the p-channel transistors extend into the lower fin element 103N.

A patterning process is performed to remove the dielectric isolation features 126 from the n-type well NW, as shown in FIGS. 8-1 to 8-4, in accordance with some embodiments. The patterning process may be similar to the patterning process described above in FIGS. 7A-1 to 7A-4, in accordance with some embodiments. For the p-type semiconductor devices, on-state current is more of a concern than speed, in accordance with some embodiments. The source/drain features used as the drain terminal and the source terminals of the p-channel transistors are denoted as 128P', in accordance with some embodiments. The source/drain features 128P' extend into and are in direct contact with the lower fin element 103N, in accordance with some embodiments.

Figures 1, 2, 9:
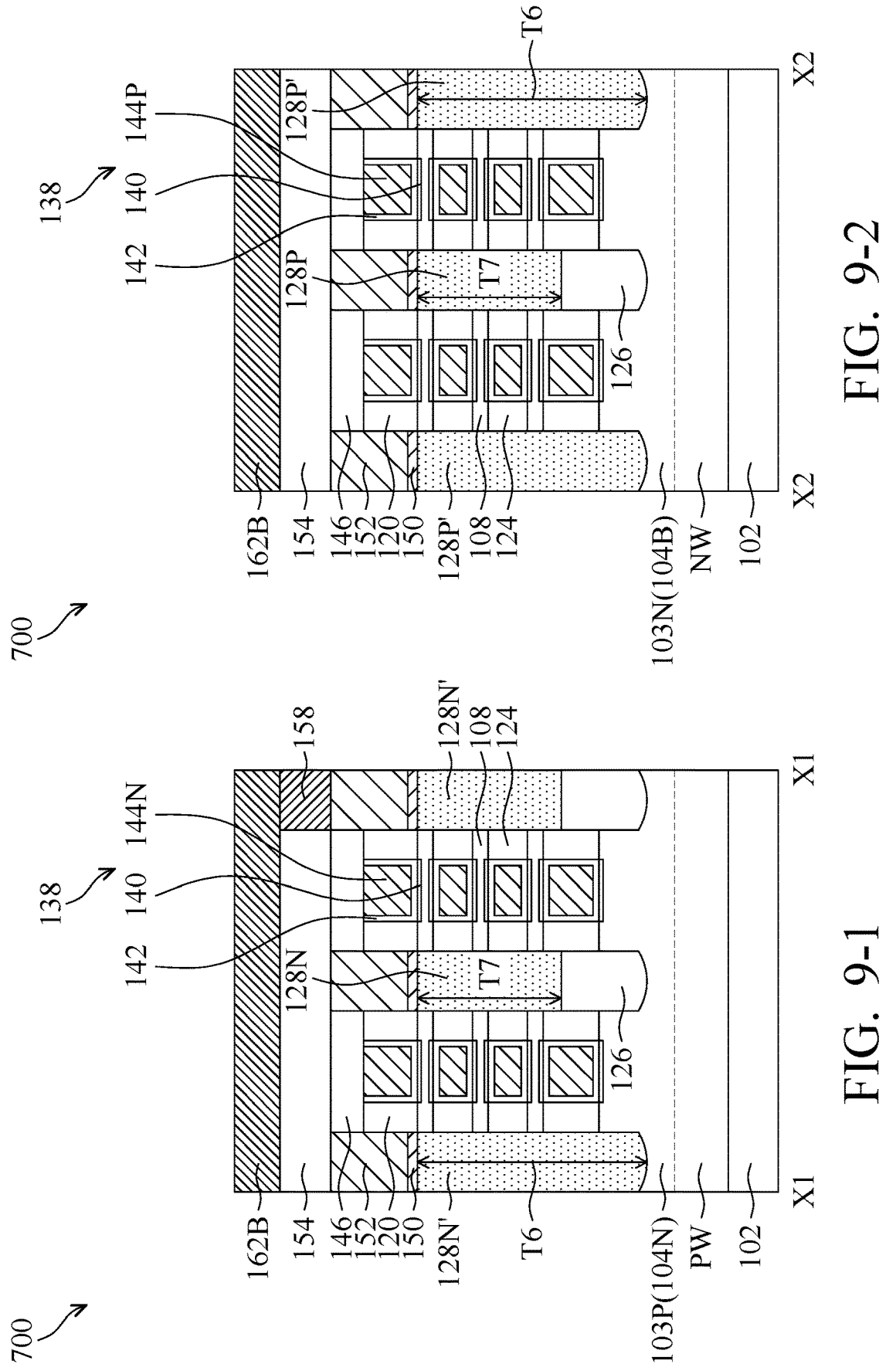

FIGS. 9-1, 9-2, 9-3 and 9-4 are a modification of the semiconductor structure 100 of FIGS. 3K-1, 3K-2, 3K-3 and 3K-4, in accordance with some embodiments of the disclosure. FIG. 9-1 corresponds to cross-section X1-X1 shown in FIG. 2. FIG. 9-2 corresponds to cross-section X2-X2 shown in FIG. 2. FIG. 9-3 corresponds to cross-section Y1-Y1 shown in FIG. 2. FIG. 9-4 corresponds to cross-section Y2-Y2 shown in FIG. 2. FIGS. 9-1 to 9-4 illustrate a semiconductor structure 700 which is similar to the semiconductor structure 100 of FIGS. 3K-1 to 3K-5 except that source/drain feature 128N' used as the source terminal of the n-channel transistors extends into the lower fin element 103P and source/drain features 128P' used as the source terminals of the p-channel transistors extend into the lower fin element 103N.

A patterning process is performed to remove the dielectric isolation features 126 from the source/drain regions of the lower fin elements 103N and 103P where the epitaxial material for the source terminal of the n-channel transistors and the epitaxial material for the source terminals of the p-channel transistors are predetermined to be grown, as shown in FIGS. 9-1 to 9-4, in accordance with some embodiments. The patterning process may be similar to the patterning process described above in FIGS. 7A-1 to 7A-4, in accordance with some embodiments.

The source/drain feature used as the source terminal of the n-channel transistors is denoted as 128N', and the source/drain features used as the source terminals of the p-channel transistors are denoted as 128P', in accordance with some embodiments. The Vdd and Vss power rail of the power supply lines 162A is electrically connected to the source/drain features 128P' and 128N', respectively, in accordance with some embodiments. The source/drain feature 128N' extends into and is in direct contact with the lower fin element 103P, and the source/drain features 128P' extend into and are in direct contact with the lower fin element 103N, in accordance with some embodiments. The overall parasitic capacitance of the cell region C may not substantially increase, because the source terminals and the well region may be electrically connected to the same or similar voltages, in accordance with some embodiments.

The source/drain features 128N' and 128P' has a greater thickness (in the Z direction) and a greater volume than the source/drain features 128N and 128P, in accordance with some embodiments. In some embodiments, the ratio (T6/T7) of the thickness T6 of the source/drain features 128N' and 128P' to the thickness T7 of the source/drain features 128N and 128P is in a range from about 1.1 to about 1.5. As a result, the channel regions of the n-channel transistors and the p-channel transistors can be further strained or stressed by the source/drain features 128N' and 128P', and thus the performance of the resulting semiconductor device may be further enhanced.

Figures 1, 2, 3K:
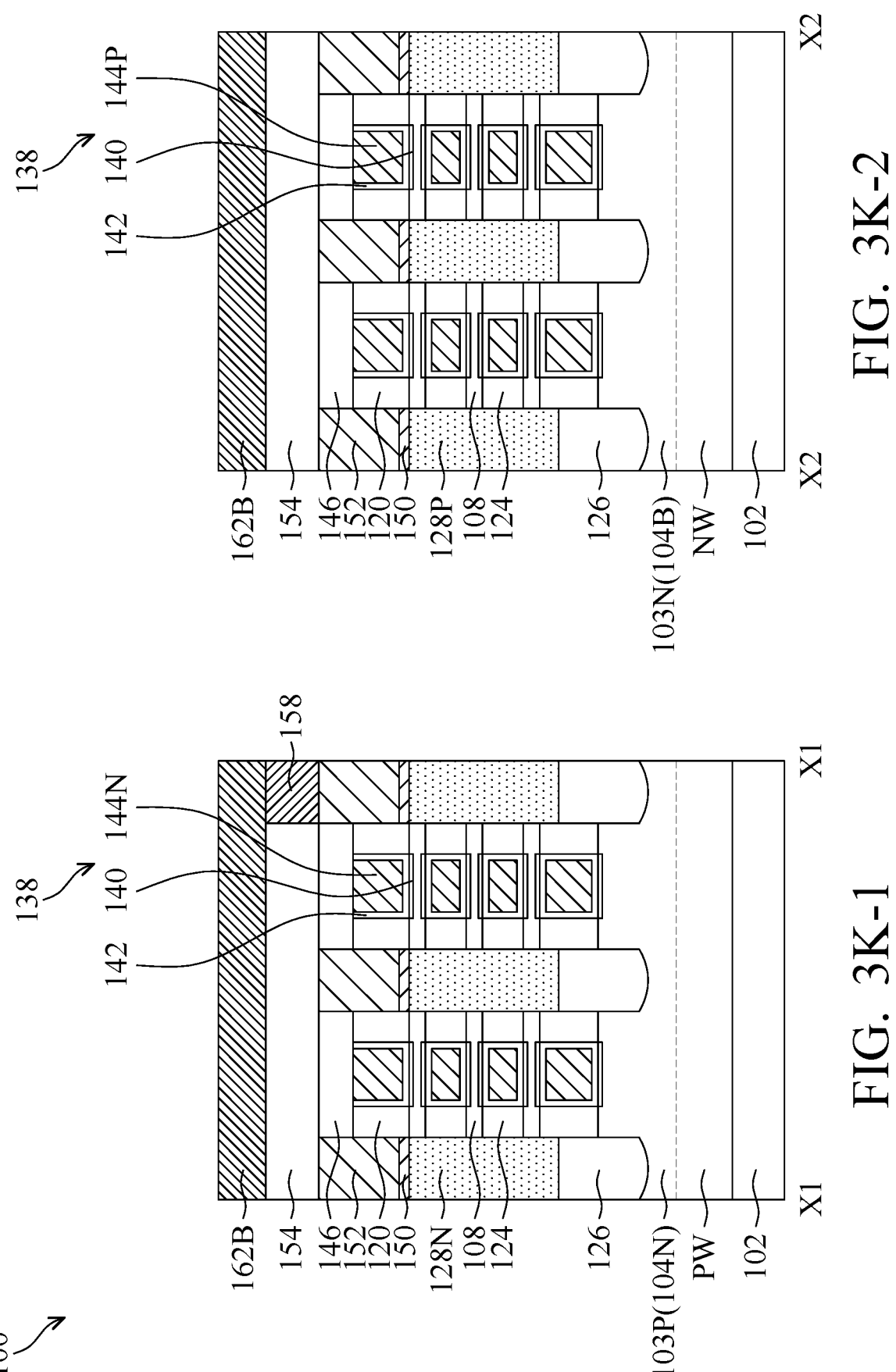
Figures 3, 3K, 4, 5:
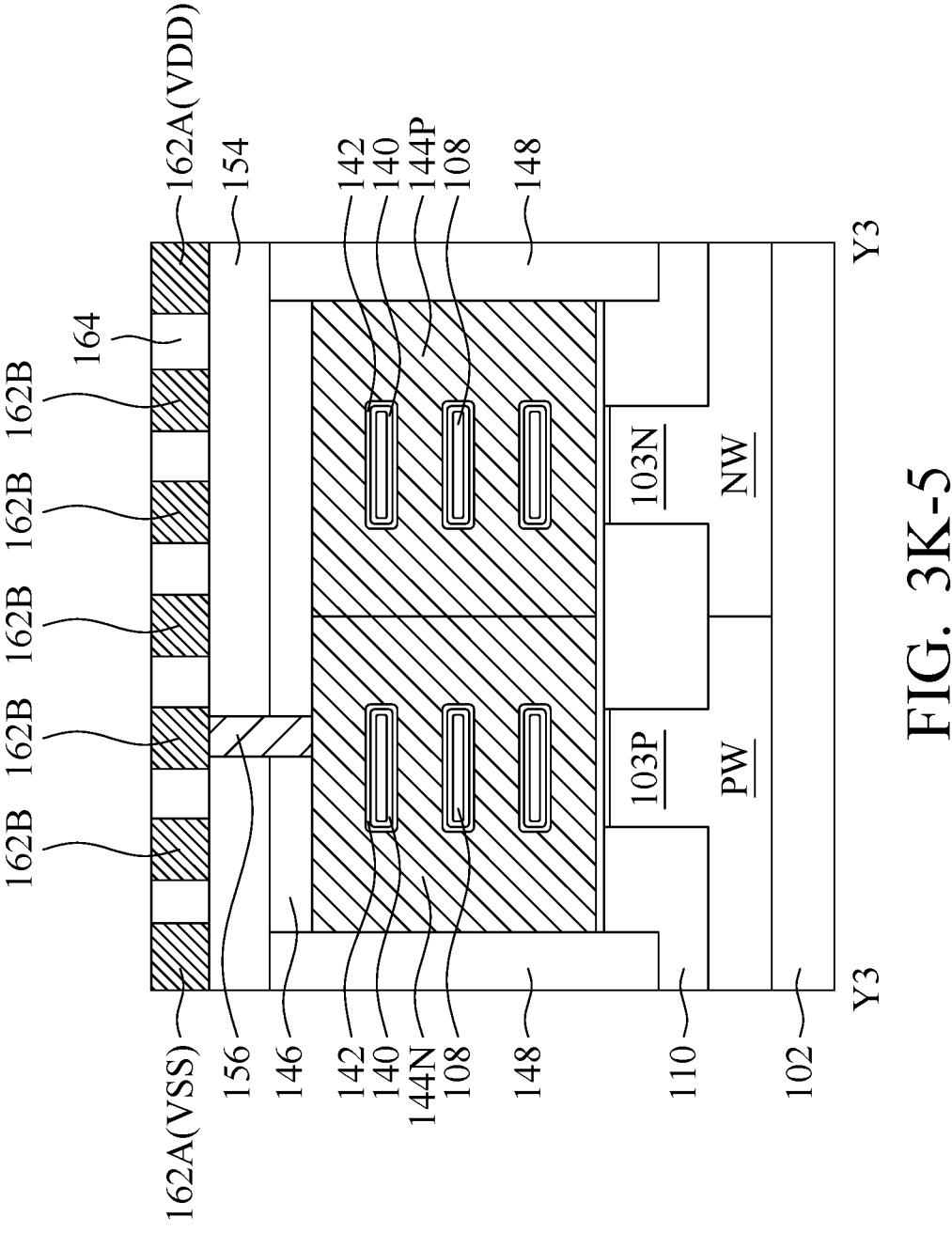
Figures 1, 2, 4:
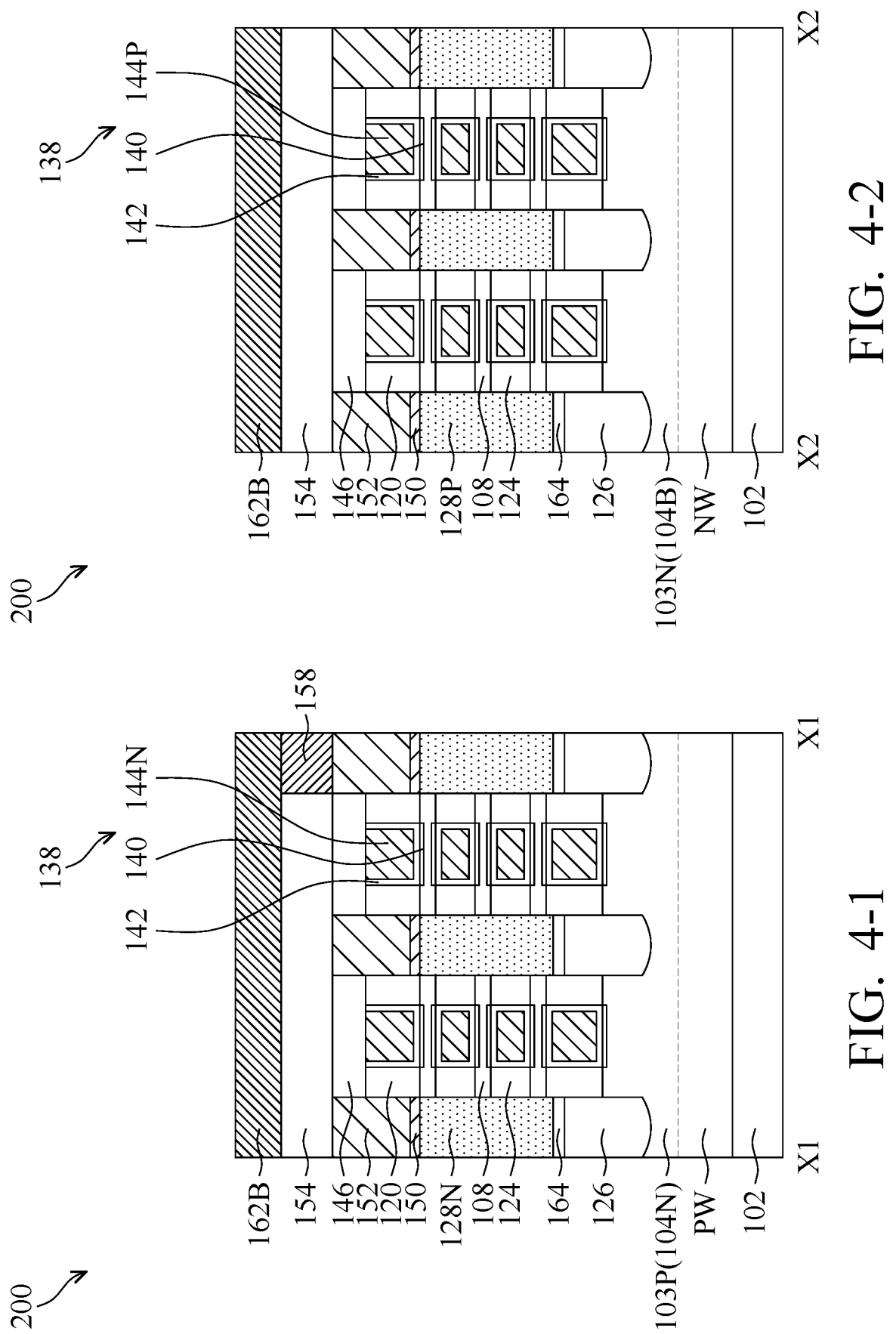
Figures 1, 2, 5:
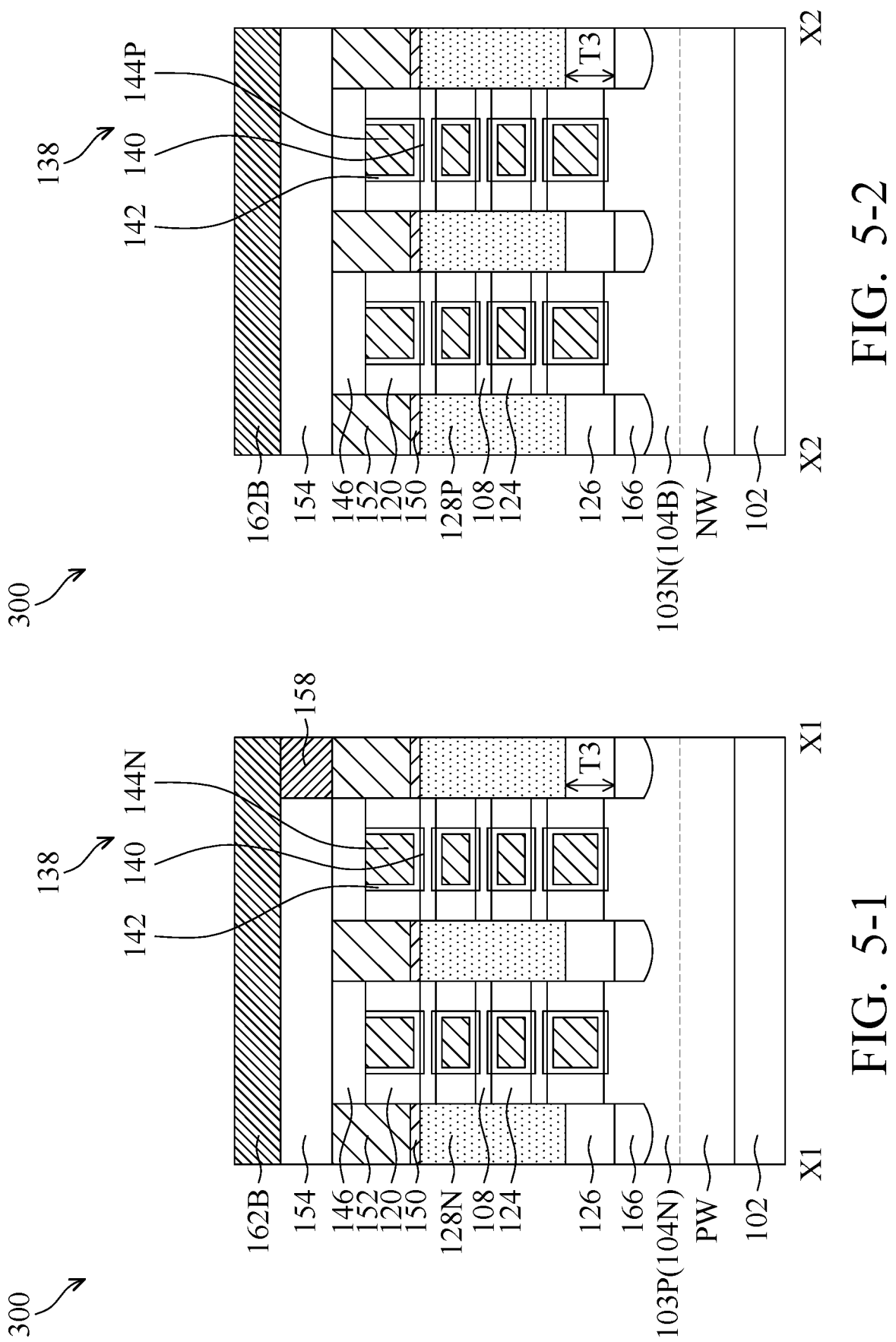
Figures 1, 2, 10:
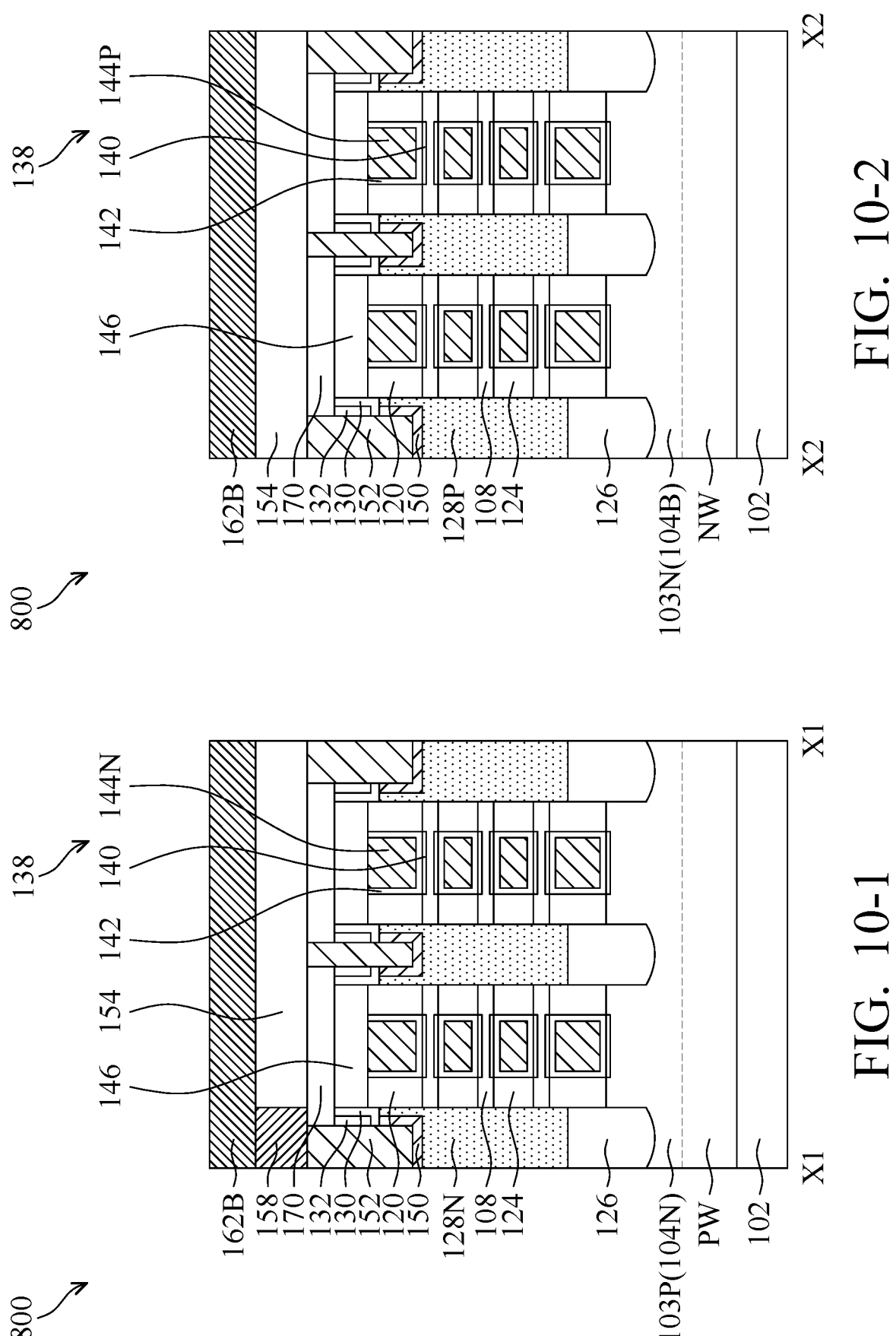

FIGS. 10-1 and 10-2 are a modification of the semiconductor structure 100 of FIGS. 3K-1 and 3K-2, in accordance with some embodiments of the disclosure. FIG. 10-1 corresponds to cross-section X1-X1 shown in FIG. 2 FIGS. 10-1 and 10-4 illustrate a semiconductor structure 800 which is similar to the semiconductor structure 100 of FIGS. 3K-1 to 3K-5 except for the formation of the contact plugs 152.

After the gate cutting structures 148 are formed, a third interlayer dielectric layer 170 is formed over the first interlayer dielectric layer 132 and the dielectric capping layer 146, as shown in FIGS. 10-1 and 10-2, in accordance with some embodiments. In some embodiments, the third interlayer dielectric layer 170 is made of dielectric material, such as USG, BPSG, FSG, PSG, BSG, and/or another suitable dielectric material. In some embodiments, the third interlayer dielectric layer 170 is deposited using such as CVD (such as HDP-CVD, PECVD, HARP or FCVD), another suitable technique, or a combination thereof. Afterward, the contact plugs 152 are formed in and/or through the third interlayer dielectric layer 170, the first interlayer dielectric layer 132 and the contact etching stop layer 130 and land on the source/drain features 128N and 128P, as shown in FIGS. 10-1 and 10-2, in accordance with some embodiments.

As described above, the aspect of the present disclosure is directed to a semiconductor structure including nanostructure transistors. The semiconductor structure includes a dielectric isolation feature 126 vertically sandwiched between the source/drain feature 128 and the lower fin element 103N (or 103P). The dielectric isolation feature 126 may block the leakage path of the bottom planar transistor formed from the lower fin element, which may enhance the performance of the resulting semiconductor device, e.g., lower off-state current (Isoff), lower source/drain junction leakage, lower gate leakage, etc.

In addition, the lowermost first semiconductor layers 1061 is thicker than other first semiconductor layers 106, which may facilitate precise control of the deposition and etching back processes for forming the dielectric isolation features 126. As a result, the dielectric isolation features 126 may have desired thickness and the source/drain feature 128 is formed with a small thickness, which may reduce the overall parasitic capacitance in the cell region, thereby further enhancing the performance (e.g., speed) of the resulting semiconductor devices.

Embodiments of a semiconductor structure and the method for forming the same may be provided. The method for forming a semiconductor structure may include etching an active region to form a first source/drain recess, forming a dielectric isolation feature in the first source/drain recess, and forming a first source/drain feature over the dielectric isolation feature in the first source/drain recess. The dielectric isolation feature may be formed in and on the source/drain regions of the lower fin elements, and thus may block the leakage path of the bottom planar transistor formed from the lower fin element. Therefore, the performance of the resulting semiconductor device may be enhanced, e.g., lower off-state current (Isoff), lower source/drain junction leakage, lower gate leakage, etc.

In some embodiments, a method for forming a semiconductor structure is provided. The method includes forming an active region over a substrate. The active region includes a fin element and a plurality of first semiconductor layers and a plurality of second semiconductor layers which are alternately stacked over the fin element. The plurality of first semiconductor layers includes a lowermost first semiconductor layer, and the lowermost first semiconductor layer is thicker than other first semiconductor layers. The method further includes etching the active region to form a first source/drain recess, forming a dielectric isolation feature in the first source/drain recess, forming a first source/drain feature over the dielectric isolation feature in the first source/drain recess, removing the plurality of first semiconductor layers, and forming a gate stack surrounding the plurality of second semiconductor layers.

In some embodiments, a method for forming a semiconductor structure is provided. The method includes alternately stacking a plurality of sacrificial layers and a plurality of channel layers over a first well. A lowermost sacrificial layer is thicker than other sacrificial layers. The method further includes patterning the plurality of sacrificial layers, the plurality of channel layers and the first well to form a first active region, and forming a first source/drain feature in the first active region. A bottom surface of the first source/drain feature is located between a top surface and a bottom surface of the lowermost sacrificial layer. The method further includes removing the plurality of sacrificial layers, and forming a first gate stack around the plurality of channel layers.

In some embodiments, a semiconductor structure is provided. The semiconductor structure includes a first fin element extending in a first direction, a first stack of nanostructures vertically stacked over the first fin element, a first source/drain feature adjoining a first side of the first stack of nanostructures and over the first fin element, a dielectric isolation feature vertically sandwiched between the first source/drain feature and the first fin element, and a first gate stack wrapping around the first stack of nanostructures. A first portion of the first gate stack between the first fin element and a lowermost nanostructure is thicker than a second portion of the first gate stack between adjacent two of the nanostructures The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for forming a semiconductor structure, comprising:
   forming an active region over a substrate, wherein the active region includes a fin element and a plurality of first semiconductor layers and a plurality of second semiconductor layers which are alternately stacked over the fin element, wherein the plurality of first semiconductor layers includes a lowermost first semiconductor layer, and the lowermost first semiconductor layer is thicker than other first semiconductor layers;
   etching the active region to form a first source/drain recess;
   forming a dielectric isolation feature in the first source/drain recess;
   forming a first source/drain feature over the dielectric isolation feature in the first source/drain recess;
   removing the plurality of first semiconductor layers; and
   forming a gate stack surrounding the plurality of second semiconductor layers.

2. The method for forming the semiconductor structure as claimed in claim 1, wherein the plurality of second semiconductor layers includes a lowermost second semiconductor layer, and a top surface of the dielectric isolation feature is located at a position between a bottom surface of the lowermost second semiconductor layer and a top surface of the fin element.

3. The method for forming the semiconductor structure as claimed in claim 1, wherein the dielectric isolation feature is in direct contact with the fin element.

4. The method for forming the semiconductor structure as claimed in claim 1, wherein the dielectric isolation feature is spaced apart from the first source/drain feature by an air gap.

5. The method for forming the semiconductor structure as claimed in claim 1, further comprising:
   etching the active region to form a second source/drain recess; and
   forming a second source/drain feature in the second source/drain recess, wherein the second source/drain feature is thicker than the first source/drain feature.

6. The method for forming the semiconductor structure as claimed in claim 5, further comprising:
   depositing a dielectric material to partially fill the first source/drain recess and the second source/drain recess; and
   selectively removing a first portion of the dielectric material in the second source/drain recess, wherein a second portion of the dielectric material in the first source/drain recess forms the dielectric isolation feature.

7. The method for forming the semiconductor structure as claimed in claim 6, further comprising:
   forming a metal layer over the gate stack, wherein the metal layer includes a power supply line electrically connected to the second source/drain feature and a signal line electrically connected to the first source/drain feature.

8. The method for forming the semiconductor structure as claimed in claim 1, further comprising:

laterally recessing the plurality of first semiconductor layers to form notches; and forming a plurality of inner spacer layers in the notches, wherein the plurality of inner spacer layers includes a lowermost inner spacer layer, and the lowermost inner spacer layer is thicker than other inner spacer layers.

9. The method for forming the semiconductor structure as claimed in claim 1, further comprising:

forming a semiconductor isolation feature in the first source/drain recess, wherein the dielectric isolation feature is formed over the semiconductor isolation feature.

10. A method for forming a semiconductor structure, comprising:

alternately stacking a plurality of sacrificial layers and a plurality of channel layers over a first well, wherein a lowermost sacrificial layer is thicker than other sacrificial layers;

patterning the plurality of sacrificial layers, the plurality of channel layers and the first well to form a first active region;

forming a first source/drain feature in the first active region, wherein a bottom surface of the first source/drain feature is located between a top surface and a bottom surface of the lowermost sacrificial layer;

removing the plurality of sacrificial layers; and forming a first gate stack around the plurality of channel layers.

11. The method for forming the semiconductor structure as claimed in claim 10, further comprising:

etching the first active region to form a recess extending in the first well; and forming a dielectric isolation feature in the recess, wherein the first source/drain feature is formed over the dielectric isolation feature in the recess.

12. The method for forming the semiconductor structure as claimed in claim 11, further comprising:

forming a contact etching stop layer along and in direct contact with the dielectric isolation feature and the first source/drain feature; and forming an interlayer dielectric layer over the contact etching stop layer.

13. The method for forming the semiconductor structure as claimed in claim 10, further comprising:

forming a second source/drain feature in the first active region, wherein a bottom surface of the second source/drain feature is lower than the bottom surface of the lowermost sacrificial layer.

14. The method for forming the semiconductor structure as claimed in claim 13, further comprising:

forming a first contact plug on the first source/drain feature and a second contact plug on the second source/drain feature;

forming a first via on the first contact plug and a second via on the second contact plug, wherein in a plan view, the first via is located outside an area of the first active region, and the second via is located within the first active region; and forming a first metal line on the first via and a second metal line on the second via.

15. The method for forming the semiconductor structure as claimed in claim 10, wherein the plurality of sacrificial layers and the plurality of channel layers are alternately stacked over a second well, the first well is doped with a p-type dopant, and the second well is doped with an n-type dopant, and the method further comprises:

patterning the plurality of sacrificial layers, the plurality of channel layers and the second well to form a second active region; and forming a second source/drain feature in the second active region, wherein a bottom surface of the second source/drain feature is lower than the bottom surface of the first source/drain feature.

16. A semiconductor structure, comprising:

a first fin element extending in a first direction;

a first stack of nanostructures vertically stacked over the first fin element;

a first source/drain feature adjoining a first side of the first stack of nanostructures and over the first fin element;

a second source/drain feature adjoining a second side of the first stack of nanostructures and extending into the first fin element;

a dielectric isolation feature vertically sandwiched between the first source/drain feature and the first fin element; and a first gate stack wrapping around the first stack of nanostructures, wherein a first portion of the first gate stack between the first fin element and a lowermost nanostructure is thicker than a second portion of the first gate stack between adjacent two of the nanostructures.

17. The semiconductor structure as claimed in claim 16, further comprising:

an air gap vertically sandwiched between the first source/drain feature and the dielectric isolation feature.

18. The semiconductor structure as claimed in claim 16, further comprising:

a metal layer over the first gate stack, wherein the metal layer includes a power supply line electrically connected to the second source/drain feature and a signal line electrically connected to the first source/drain feature.

19. The semiconductor structure as claimed in claim 16, further comprising:

an isolation structure surrounding the first fin element, wherein the dielectric isolation feature protrudes from a top surface of the isolation structure.

20. The semiconductor structure as claimed in claim 16, further comprising a plurality of inner spacer layers between the first source/drain feature and the second source/drain feature, wherein the plurality of inner spacer layers includes a lowermost inner spacer layer, and the lowermost inner spacer layer is thicker than other inner spacer layers.

* * * * *